United States Patent [19]
Adachi et al.

[11] Patent Number: 5,974,068
[45] Date of Patent: *Oct. 26, 1999

[54] SEMICONDUCTOR LASER AND A METHOD FOR PRODUCING THE SAME

[75] Inventors: Hideto Adachi; Isao Kidoguchi, both of Mino; Kiyoshi Ohnaka, Moriguchi; Satoshi Kamiyama, Sanda, all of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/822,409

[22] Filed: Mar. 21, 1997

Related U.S. Application Data

[62] Division of application No. 08/586,249, Jan. 16, 1996, abandoned, which is a division of application No. 08/278,395, Jul. 21, 1994, Pat. No. 5,523,256.

[30] Foreign Application Priority Data

| Jul. 21, 1993 | [JP] | Japan | 5-180174 |
| Oct. 7, 1993 | [JP] | Japan | 5-251566 |
| Oct. 7, 1993 | [JP] | Japan | 5-251567 |
| Dec. 28, 1993 | [JP] | Japan | 5-336373 |

[51] Int. Cl.$^6$ ............................................. H01S 3/19
[52] U.S. Cl. ................................. 372/46; 372/45
[58] Field of Search .................................. 372/46, 45

[56] References Cited

U.S. PATENT DOCUMENTS

| 4,949,349 | 8/1990 | Ohba et al. | 372/46 |
| 5,018,158 | 5/1991 | Okada et al. | 372/46 |
| 5,029,175 | 7/1991 | Ohnaka et al. | 372/46 |
| 5,054,031 | 10/1991 | Hosoba et al. | 372/45 |
| 5,065,402 | 11/1991 | Kawano | 372/46 |
| 5,161,167 | 11/1992 | Murakami et al. | 372/46 |
| 5,182,228 | 1/1993 | Sekii et al. | 437/129 |
| 5,185,755 | 2/1993 | Mori et al. | 372/45 |
| 5,218,614 | 6/1993 | Mihashi | 372/46 |
| 5,268,328 | 12/1993 | Mori et al. | 437/129 |
| 5,272,109 | 12/1993 | Motoda | 372/46 |
| 5,282,218 | 1/1994 | Okajima et al. | 372/46 |
| 5,288,659 | 2/1994 | Koch et al. | 437/129 |
| 5,289,487 | 2/1994 | Shimada | 372/46 |
| 5,325,385 | 6/1994 | Kasukawa et al. | 372/45 |
| 5,383,214 | 1/1995 | Kidoguchi et al. | 372/46 |
| 5,426,658 | 6/1995 | Kaneno et al. | 372/46 |

FOREIGN PATENT DOCUMENTS

| 0119781 | 7/1984 | Japan | 437/129 |
| 62-39084 | 2/1987 | Japan . | |
| 62-259490 | 11/1987 | Japan . | |
| 0081887 | 4/1988 | Japan | 437/129 |
| 0092075 | 4/1988 | Japan | 437/129 |
| 4-106992 | 4/1992 | Japan . | |
| 4-115588 | 4/1992 | Japan | 372/46 |
| 4-206986 | 7/1992 | Japan . | |
| 5-167174 | 7/1993 | Japan . | |

OTHER PUBLICATIONS

Hecht, "Understanding Lasers An Entry Level Guide" IEEE Press, pp. 266–269, 1994.

Thompson, Physics of Semiconductor Laser Devices, John Wiley & Sons, p. 11, 1980. (No Month Available).

Agrawal et al., Semiconductor Lasers Second Edition, Van Nostrand Reinhold, pp. 450–455, 1993. (No Month Available).

*Primary Examiner*—Rodney Bovernick
*Assistant Examiner*—Yisun Song
*Attorney, Agent, or Firm*—Ratner & Prestia

[57] ABSTRACT

A semiconductor laser according to the present invention includes: a semiconductor substrate; a multilayer structure provided on the semiconductor substrate, the multilayer structure including an active layer, a pair of cladding layers interposing the active layer, and current confining portion for injecting a current into a stripe-shaped predetermined region of the active layer, wherein the current confining portion includes a first current confining layer formed in regions excluding a region corresponding to the predetermined region of the active layer, the first current confining layer having an energy band gap larger than an energy band gap of the active layer and having a refractive index smaller than a refractive index of the active layer.

7 Claims, 48 Drawing Sheets

SEMICONDUCTOR LASER AND A METHOD FOR PRODUCING THE SAME

This application is a division of application Ser. No. 08/586,249, filed Jan. 16, 1996, now abandoned which is a division of application Ser. No. 08/278,395 filed Jul. 21, 1994 (now U.S. Pat. No. 5,523,256 issued Jun. 4, 1996).

BACKGROUND OF THE INVENTION

1. Field of the Invention

The present invention relates to a semiconductor laser having excellent noise characteristics and a stable single lateral mode, and a method for producing the same.

2. Description of the Related Art

Semiconductor lasers which oscillate laser light in visible regions have applications to such devices as laser beam printers and light sources for optical information processing devices such as optical disk apparatuses, and therefore tend to have increased importance these days. Materials of an $(Al_xGa_{1-x})_{0.5}In_{0.5}P$ type, in particular, are attracting much attention because they can easily be lattice-matched to GaAs, which is an excellent material for substrates, and can oscillate laser light having a wavelength in the range of 0.56 $\mu$m to 0.69 $\mu$m by varying the Al mole fraction x.

Hereinafter, a conventional semiconductor laser having a doublehetero structure, which oscillates laser light of wavelengths pertaining to red regions, will be described with reference to FIG. 1.

As shown in FIG. 1, this semiconductor laser includes an n-GaAs substrate 1, an n-GaAs buffer layer 2, an n-$(Al_{0.6}Ga_{0.4})_{0.5}In_{0.5}P$ cladding layer 3, a $Ga_{0.5}In_{0.5}P$ active layer 4, a p-$(Al_{0.6}Ga_{0.4})_{0.5}In_{0.5}P$ cladding layer 5, a p-$Ga_{0.5}In_{0.5}P$ layer 6, an n-GaAs current confining layer 8, and a p-GaAs contact layer 9 formed in this order. A p-side electrode 10 and an n-side electrode 11 are formed, respectively, upon the p-GaAs contact layer 9 and upon the bottom face of the substrate 1.

The above-mentioned semiconductor laser can be fabricated by a crystal growing method such as a metal organic vapor phase epitaxy (MOVPE) method. By the use of such a crystal growing method, the n-GaAs buffer layer 2, the n-$(Al_{0.6}Ga_{0.4})_{0.5}In_{0.5}P$ cladding layer 3, the $Ga_{0.5}In_{0.5}P$ active layer 4, the p-$(Al_{0.6}Ga_{0.4})_{0.5}In_{0.5}P$ cladding layer 5, and the p-$Ga_{0.5}In_{0.5}P$ layer 6 are grown upon the n-GaAs substrate 1 in this order. Next, by photolithography and etching, the p-$Ga_{0.5}In_{0.5}P$ layer 6 and a portion of the p-$(Al_{0.6}Ga_{0.4})_{0.5}In_{0.5}P$ cladding layer 5 are etched so as to form a stripe-shaped ridge having a trapezoidal cross-section in the p-$(Al_{0.6}Ga_{0.4})_{0.5}In_{0.5}P$ cladding layer 5. Then, by an MOVPE method or the like, the n-GaAs current confining layer 8 is selectively grown on the outside of the stripe, and the p-GaAs contact layer 9 is further grown.

In accordance with a semiconductor laser of the above-mentioned configuration, a current can be confined into a relatively narrow stripe-shaped region of the $Ga_{0.5}In_{0.5}P$ active layer 4 by the n-GaAs current confining layer 8. Moreover, during the etching of a portion of the p-$(Al_{0.6}Ga_{0.4})_{0.5}In_{0.5}P$ cladding layer 5 into the stripe-shaped ridge having a trapezoidal cross section, the effective refraction indices inside and outside the stripe-shaped ridge can be ensured to have a difference which satisfies requirements of a single lateral mode by optimizing the height and width of the trapezoid. As a result, light can be effectively contained in a predetermined region of the $Ga_{0.5}In_{0.5}P$ active layer 4, the predetermined region being under the stripe-shaped ridge of the p-$(Al_{0.6}Ga_{0.4})_{0.5}In_{0.5}P$ cladding layer 5. A typical width of the stripe-shaped ridge is about 5 $\mu$m.

However, according to -the above-mentioned configuration, the longitudinal mode tends to be stabilized as a single mode. As a result, noise is likely to occur when the semiconductor laser is applied to an optical disk or the like. The noise is categorized into a returned light-induced noise, a mode-hopping noise, and the like, as described below:

The returned light-induced noise is defined to be noise that occurs when laser light emitted from a semiconductor laser is reflected by a lens, an optical disk, or the like so as to be fed back into a cavity of the semiconductor laser. Laser Light emitted from a semiconductor laser oscillating in a single longitudinal mode has a high degree of coherency. Therefore, depending on the positions of reflecting surfaces such as a lens and an optical disk and/or intensity of the reflected laser light, the optical output power of the semiconductor laser may fluctuate, and the spectrum of the optical output of the semiconductor laser may fluctuate (i.e. mode hopping), whereby noise is generated.

The mode-hopping noise is most likely to occur when the thermal circumstances of the semiconductor laser change. Specifically, the mode-hopping noise may occur when a given order of longitudinal mode shifts to a next order (i.e. when a mode hopping occurs) due to change in the thermal circumstances, resulting in repetition of randomly alternating oscillations of different orders of longitudinal modes and/or fluctuation of optical output power due to different optical output powers of the longitudinal modes.

The returned light-induced noise and the mode-hopping noise equally constitute a problem in practice, e.g. when applied to an optical disk, because it may degrade the quality of the reproduced sound and image information carried on the optical disk.

In view of the above problems, a configuration for improving the noise characteristics is proposed in Japanese Laid-Open Patent Publication No. 62-39084. This semiconductor laser includes, as is shown in FIGS. 2A to 2C, an n-GaAs substrate 201, an internal current confining layer 203, a buffer layer 204, an n-cladding layer 205, an active layer 206, a p-cladding layer 207, a p-GaAs layer 208, a p-side electrode 209, and an n-side electrode 210. This semiconductor laser is composed essentially of AlGaAs.

As shown in FIG. 2C, in region B (including line B–B' in FIG. 2A) in the vicinity of an end face of a cavity, the semiconductor laser has a bent waveguide configuration. On the other hand, as shown in FIG. 2B, the stripe width is made large in region A (including line A–A' in FIG. 2B) in a central portion of the cavity. The internal current confining layer 203 ensures that an injected current is led to a predetermined region of the active layer 206. The dimensions of the semiconductor laser are as follows: the cavity length is about 300 $\mu$m; the length of region B is about 30 $\mu$m; the width of region B is about 2.5 $\mu$m; the length of region A is about 240 $\mu$m; and the width of region A is about 8 $\mu$m.

In the above-described semiconductor laser, a multitude of longitudinal modes are realized in region A, so that the noise characteristics of the semiconductor laser are improved.

However, in cases where an internal current confining layer is provided on the n-GaAs substrate side of the active layer, as in the configuration shown in FIGS. 2A to 2C, the electron mobility is so large that an injected current may spread in an excessively large area along a direction parallel to a direction in which each layer of the semiconductor laser extends (hereinafter, this direction will be referred to as the "horizontal direction"). This makes it difficult to inject the current into the predetermined region of the active layer 206. As a result, the lateral mode may become unstable, and the driving current for the semiconductor laser may increase.

On the contrary, if the current confining layer 203 is provided on the p-cladding layer 207 side of the active layer 206, the heterojunction for holes between the p-cladding layer 207 and the p-GaAs layer 208 (which is provided so that the p-electrode 209 can be provided thereon) is so large that holes injected from the p-side electrode 209 may spread in an excessively large area in region A. As a result, the driving current for the semiconductor laser may increase, and the distribution of the injected holes may fluctuate as with the changes in the thermal circumstances. These problems are particularly eminent in cases where an AlGaInP type material is used for the configuration shown in FIG. 17, since the heterojunction in the valence band thereof is larger than that of an AlGaAs type material. For example, in the case of a red-light semiconductor laser capable of oscillating in the 670 nm band, the injected holes spread about 50 $\mu$m along the horizontal direction, so that the driving current increases, indicative of poor practicality. Moreover, because of the presence of region A, where the stripe width is made large so as to have little control over the lateral mode, stable lateral-mode optical output power cannot be realized at a high level.

SUMMARY OF THE INVENTION

A semiconductor laser according to the present invention includes: a semiconductor substrate; a multilayer structure provided on the semiconductor substrate, the multilayer structure including an active layer, a pair of cladding layers interposing the active layer, and current confining means for injecting a current into a stripe-shaped predetermined region of the active layer, wherein the current confining means includes a first current confining layer formed in regions excluding a region corresponding to the predetermined region of the active layer, the first current confining layer having an energy band gap larger than an energy band gap of the active layer and having a refractive index smaller than a refractive index of the active layer.

In one embodiment of the invention, one of the pair of cladding layers that is disposed above the active layer includes a stripe-shaped ridge extending along a cavity length direction of the semiconductor laser, the first current confining layer being formed so as to overlap regions excluding the stripe-shaped ridge of the cladding layer including the stripe-shaped ridge.

In another embodiment of the invention, the current confining means further includes a second current confining layer provided above the first current confining layer, the second current confining layer having an energy band gap smaller than an energy band gap of the active layer.

In still another embodiment of the invention, the semiconductor substrate includes GaAs; the active layer comprises GaInP; the pair of cladding layers comprise AlGaInP; the first current confining layer comprises at least one of AlGaAs and AlGaInP; and the second current confining layer comprises GaAs.

In still another embodiment of the invention, the active layer has a multiple quantum well structure or a strained quantum well structure.

A method for producing a semiconductor laser according to the present invention includes a step of forming a multilayer structure on a semiconductor substrate, the step including the steps of: forming a first cladding layer; forming an active layer on the first cladding layer; forming a film to become a second cladding layer on the active layer; forming the second cladding layer by selectively etching a portion of the film so as to form a stripe-shaped ridge extending along a cavity length direction of the semiconductor laser in the film; forming a first semiconductor layer on portions of the second cladding layer excluding the stripe-shaped ridge, the first semiconductor layer having an energy band gap larger than an energy band gap of the active layer and having a refractive index smaller than a refractive index of the active layer; and forming a second semiconductor layer on the first semiconductor layer, the second semiconductor layer having an energy band gap smaller than an energy band gap of the active layer.

Alternatively, a method for producing a semiconductor laser according to the present invention includes a step of forming a multilayer structure on a semiconductor substrate, the step including the steps of: forming a first cladding layer; forming an active layer on the first cladding layer; forming a second cladding layer on the active layer; forming a first semiconductor layer on the second cladding layer, the first semiconductor layer having an energy band gap larger than an energy band gap of the active layer and having a refractive index smaller than a refractive index of the active layer; forming a second semiconductor layer on the first semiconductor layer, the second semiconductor layer having an energy band gap smaller than an energy band gap of the active layer; removing by recess etching into a stripe-shape a portion of the first semiconductor layer and a portion of the second semiconductor layer; and forming a third cladding layer.

Alternatively, a semiconductor laser according to the present invention includes: a semiconductor substrate; a multilayer structure provided on the semiconductor substrate, the multilayer structure including an active layer, a pair of cladding layers interposing the active layer, and a current confining layer for injecting a current into a stripe-shaped predetermined region of the active layer, wherein at least one of the cladding layers includes a stripe-shaped ridge extending along a cavity length direction of the semiconductor laser, and wherein the stripe-shaped ridge including a first portion located in the vicinity of at least one of end faces of a cavity and a second portion located in portions excluding the vicinity of the at least one end face of the cavity, the first portion having a width sufficient to achieve single lateral mode oscillation, and the second portion having a width larger than the width of the first portion.

In one embodiment of the invention, the width of the first portion of the stripe-shaped ridge is in the range of 1 $\mu$m to 7 $\mu$m; the width of the second portion of the stripe-shaped ridge is 7 $\mu$m or more; a ratio l/L is 0.3 or less, wherein l is a length of the second portion of the stripe-shaped ridge and L is a cavity length; and carriers are injected into a predetermined region of the active layer that corresponds to the stripe-shaped ridge.

In another embodiment of the invention, the width of the stripe-shaped ridge varies in a linear or curving manner between the first portion and the second portion.

Alternatively, a semiconductor laser according to the present invention includes: a semiconductor substrate; a multilayer structure provided on the semiconductor substrate, the multilayer structure including an active layer, a pair of cladding layers interposing the active layer, and a current confining layer for injecting a current into a stripe-shaped predetermined region of the active layer, wherein at least one of the cladding layers includes a stripe-shaped ridge extending along a cavity length direction of the semiconductor laser, and wherein a difference between an effective refractive index taken inside the stripe-shaped ridge and an effective refractive index taken outside the stripe-shaped ridge is larger in the vicinity of at least one of end faces of a cavity than in a portion excluding the end faces of the cavity.

In one embodiment of the invention, a difference between an effective refractive index taken outside the stripe-shaped ridge is larger in the vicinity of the at least one of end faces of the cavity than in the portion excluding the end faces of the cavity.

In another embodiment of the invention, at least one of the pair of cladding layers includes a stripe-shaped ridge having a convex shape extending along the cavity length direction of the semiconductor laser, the multilayer structure including the current confining layer above a portion of the cladding layer excluding the stripe-shaped ridge, and a thickness of the portion of the cladding layer located below the further current confining layer is reduced in the vicinity of at least one of the end faces of the cavity.

In still another embodiment of the invention, a ratio l/L is 0.3 or less, l being a length of a portion of the stripe-shaped ridge in which the difference between the effective refractive index taken inside the stripe-shaped ridge and the effective refractive index taken outside the stripe-shaped ridge is smaller than other portions of the stripe-shaped ridge, and L being a cavity length.

In still another embodiment of the invention, the width of the stripe-shaped ridge is uniform in all regions of the cavity.

Alternatively, a method for producing a semiconductor laser according to the present invention includes a step of forming a multilayer structure on a semiconductor substrate, the step including the steps of: forming a first cladding layer; forming an active layer on the first cladding layer; forming a film to become a second cladding layer on the active layer; growing on the film a first insulating film for selectively etching the film; forming a stripe-shaped ridge extending along a cavity length of the semiconductor laser by etching a portion of the second layer while using the insulating film as a mask; growing a second insulating film; etching a portion of the second cladding layer by using the first insulating film and the second insulating film as masks; forming a current confining layer for injecting a current into a stripe-shaped predetermined region of the active layer, the current confining layer being formed on portions of the second cladding layer excluding the stripe-shaped ridge; and removing the first insulating film.

Alternatively, a semiconductor laser according to the present invention includes: a semiconductor substrate; a multilayer structure provided on the semiconductor substrate, the multilayer structure including an active layer, a pair of cladding layers interposing the active layer, and a current confining layer for injecting a current into a stripe-shaped predetermined region of the active layer, wherein one of the pair of cladding layers that is disposed above the active layer includes a stripe-shaped ridge extending along a cavity length direction of the semiconductor laser, the current confining layer being formed so as to overlap regions of the cladding layer including the stripe-shaped ridge excluding the stripe-shaped ridge of the cladding layer including the stripe-shaped ridge, and wherein a groove having a lowest portion thereof on a level higher than a level of an upper face of the active layer is formed on each of opposite sides of the stripe-shaped ridge.

In one embodiment of the invention, the cladding layer that is disposed above the active layer includes: a first cladding layer formed on the active layer; a second cladding layer formed above the first cladding layer; and an etching stopper layer interposed between the first cladding layer and the second cladding layer.

In another embodiment of the invention, a contact layer is provided above the multilayer structure.

In still another embodiment of the invention, the semiconductor laser further includes an insulating film having a stripe-shaped ridge opening located above the stripe-shaped ridge.

In still another embodiment of the invention, a distance between the grooves is in the range of 30 $\mu$m to 200 $\mu$m.

In still another embodiment of the invention, the lowest portion of each groove reaches an upper face of the cladding layer that is disposed above the active layer.

In still another embodiment of the invention, the lowest portion of each groove reaches an upper face of the etching stopper layer.

Alternatively, a method for producing a semiconductor laser according to the present invention includes a step of forming a multilayer structure on a semiconductor substrate, the step including the steps of: forming a first cladding layer; forming an active layer on the first cladding layer; forming a film to become a second cladding layer on the active layer; forming the second cladding layer by selectively etching a portion of the film so as to form a stripe-shaped ridge extending along a cavity length direction of the semiconductor laser in the film; forming a current confining layer above portions of the second cladding layer excluding the stripe-shaped ridge; forming a contact layer so as to overlap the stripe-shaped ridge and the current confining layer; and forming a groove in a predetermined portion on each of opposite sides of the stripe-shaped ridge by etching the predetermined portions, the grooves not reaching the active layer.

In one embodiment of the invention, the step of forming the film to become the second cladding layer includes the steps of: growing a lower layer of the film; growing an etching stopper layer which is not substantially etched by the etching performed in the step of forming the grooves on the lower layer of the film; and growing an upper layer of the film on the etching stopper layer.

An etching method according to the present invention includes the steps of: epitaxially growing a multilayer structure on a semiconductor substrate, the multilayer structure including a first semiconductor layer and a second semiconductor layer in contact with an upper face of the first semiconductor layer; forming a mask on the multilayer structure; a first etching step for selectively etching a portion of the second semiconductor layer by using a first etching solution of a diffusion-controlled type; and a second etching step for etching the second semiconductor layer until reaching the upper face of the first semiconductor layer by using a second etching solution for preferentially etching the second semiconductor layer rather than the first semiconductor layer.

In one embodiment of the invention, the semiconductor substrate is a misoriented substrate having a misorientation with respect to a (100) oriented surface.

In another embodiment of the invention, at least one of the first etching step and the second etching step includes a step of creating a flow of the first etching solution or the second etching solution along a direction parallel to a surface of the semiconductor substrate.

In still another embodiment of the invention, at least one of the first etching step and the second etching step includes a step of creating a portion shaded by the mask by obliquely radiating light on the semiconductor substrate.

Alternatively, a method for producing a semiconductor laser according to the present invention includes the steps of: epitaxially growing a cladding layer having a first conductivity type, an active layer, a first cladding layer having a second conductivity type, an etching stopper layer, and a second cladding layer having the second conductivity type on a semiconductor substrate in this order; forming a mask above the second cladding layer having the second conductivity type; a first etching step for selectively etching a portion of the second cladding layer having the second conductivity type by using a first etching solution of a diffusion-controlled type; and a second etching step for etching the second cladding layer having the second conductivity type until reaching an upper face of the etching stopper layer by using a second etching solution for preferentially etching the second cladding layer having the second conductivity type rather than the etching stopper layer.

In one embodiment of the invention, the semiconductor substrate is a misoriented substrate including a (100) oriented surface having a misorientation toward a [011] direction.

In another embodiment of the invention, the method further includes the steps of: forming a first stripe-shaped mask on the second cladding layer having the second conductivity type, the first stripe-shaped mask extending along a direction perpendicular to the [011] direction; forming a second mask above the first mask, the second mask overlapping one of two longitudinal sides of the first mask facing the [011] direction or a [0-1-1] direction, wherein the first etching step is a step for selectively etching the portion of the second cladding layer having the second conductivity type by using the first mask and the second mask, and wherein the second etching step is a step for etching the second cladding layer having the second conductivity type until reaching the upper face of the etching stopper layer by using the first mask after removing the second mask.

In still another embodiment of the invention, the method further includes the steps of: growing a multiple quantum well layer as the etching stopper layer; and determining when to terminate the etching steps based on change in an interference color of the etching stopper layer.

Thus, the invention described herein makes possible an advantage of providing a semiconductor laser having excellent noise characteristics and a stable single lateral mode, and a method for producing the same.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying drawings.

EXAMPLE 1

Figure 3:
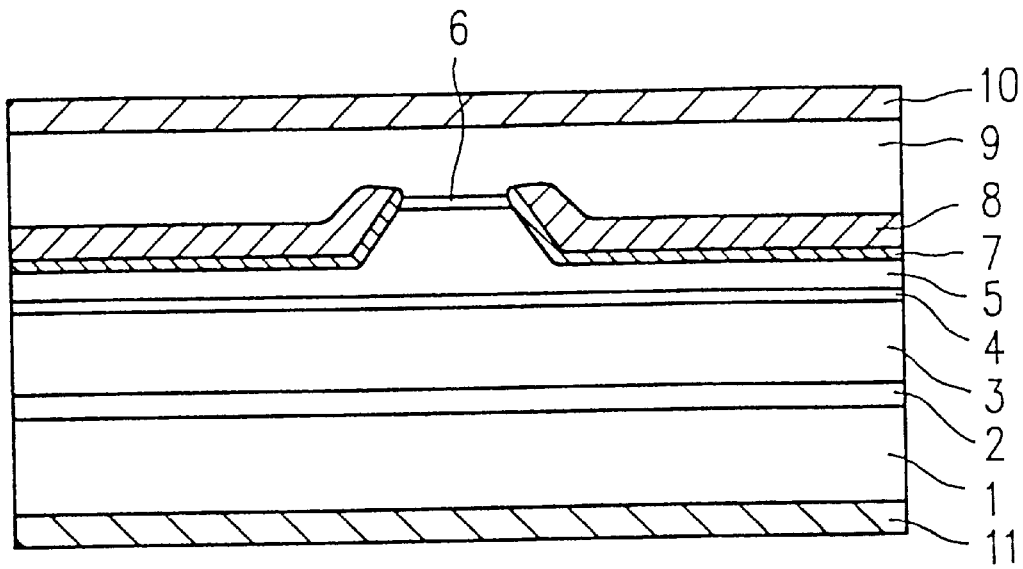
FIG. 3 is a cross-sectional view showing a lateral mode-controlled type red-light semiconductor laser according to an example of the present invention.

FIG. 3 shows a cross section of a semiconductor laser according to the present invention. This semiconductor laser is a lateral mode-controlled type red-light semiconductor laser.

As shown in FIG. 3, the semiconductor laser according to the present example has a doublehetero structure in which a $Ga_{0.5}In_{0.5}P$ active layer 4 (thickness: 600 Å) is interposed between an n-$(Al_{0.6}Ga_{0.4})_{0.5}In_{0.5}P$ cladding layer 3 and a p-$(Al_{0.6}Ga_{0.4})_{0.5}In_{0.5}P$ cladding layer 5. These layers 3 to 5 are grown on an n-GaAs buffer layer 2, which in turn is grown on an n-GaAs substrate 1. Upon the p-$(Al_{0.6}Ga_{0.4})_{0.5}In_{0.5}P$ cladding layer 5, a p-$Ga_{0.5}In_{0.5}P$ layer 6 (thickness: 0.1 μm) is formed. The p-$Ga_{0.5}In_{0.5}P$ layer 6 and a portion of the p-$(Al_{0.6}Ga_{0.4})_{0.5}In_{0.5}P$ cladding layer 5 are formed into a stripe-shaped ridge having a trapezoidal cross section. The p-$(Al_{0.6}Ga_{0.4})_{0.5}In_{0.5}P$ cladding layer 5 has a thickness of 1 μm at the stripe-shaped ridge, and a thickness of 0.25 μm at portions excluding the stripe-shaped ridge. Upon the portions of the p-$(Al_{0.6}Ga_{0.4})_{0.5}In_{0.5}P$ cladding layer 5 excluding the stripe-shaped ridge, an n-$Al_{0.5}Ga_{0.5}As$ first current confining layer 7 (thickness: 0.1 μm) and an n-GaAs second current confining layer 8 (thickness: 0.5 μm) are formed. Furthermore, upon the p-$Ga_{0.5}In_{0.5}P$ layer 6 and the n-GaAs second current confining layer 8, a p-GaAs contact layer 9 is formed. A p-side electrode 10 is formed on the p-GaAs contact layer 9. An n-side electrode 11 is formed on the bottom face of the n-GaAs substrate 1.

The n-$Al_{0.5}Ga_{0.5}As$ first current confining layer 7 and the n-GaAs second current confining layer 8 function to control the lateral mode of the semiconductor laser as well as control a current to be injected into a predetermined region of the active layer 4. The energy band gap of the n-$Al_{0.5}Ga_{0.5}As$ first current confining layer 7 is about 2 eV, which is a larger value than that of the active layer 4. The refractive index of the n-$Al_{0.5}Ga_{0.5}As$ first current confining layer 7 is 3.38, which is a smaller value than that of the active layer 4. On the other hand, the energy band gap of the n-GaAs second current confining layer 8 is smaller than that of the active layer 4, so that a portion of light generated by the recombination of carriers is absorbed by the n-GaAs second current confining layer 8. By prescribing the width of the stripe-shaped ridge to be about 5 μm, a large amount of lateral mode light of higher orders than the first order can be absorbed in the above-mentioned portions of the p-$(Al_{0.6}Ga_{0.4})_{0.5}In_{0.5}P$ cladding layer 5 excluding the stripe-shaped ridge, so as to increase the propagation loss. Thus, oscillation in a single lateral mode can be realized.

According to the present invention, the current confining layers 7 and 8 are provided on the p-$(Al_{0.6}Ga_{0.4})_{0.5}In_{0.5}P$ cladding layer 5 side of the active layer 4. If the current confining layers 7 and 8 were provided on the n-$(Al_{0.6}Ga_{0.4})_{0.5}In_{0.5}P$ cladding layer 3 side of the active layer 4, electrons, which are the majority carriers in the n-$(Al_{0.6}Ga_{0.4})_{0.5}In_{0.5}P$ cladding layer 3, have such a high mobility that those electrons which have passed through the current confining layers 7 and 8 would easily spread along the horizontal direction. Thus, the advantage of current confinement would be reduced, resulting in problems such as an increased driving current and a reduced lateral mode stability.

The width of the stripe-shaped ridge is prescribed to be such a value that the fundamental lateral mode and lateral modes of higher orders have a large difference in gain. Thus, the semiconductor laser is made capable of oscillating in a single lateral mode. The thickness of portions of the p-$(Al_{0.6}Ga_{0.4})_{0.5}In_{0.5}P$ cladding layer 5 excluding the stripe-shaped ridge (i.e. the portions located below the n-$Al_{0.5}Ga_{0.5}As$ first current confining layer 7) is uniformly 0.25 nm along a direction in which the cavity extends (hereinafter referred to as "cavity length direction"). If this thickness is excessively large, a large number of carriers may leak outside the stripe-shaped ridge. As a result, the driving current increases, which results in a decrease in reliability, or higher modes become more likely to oscillate, which makes the lateral mode unstable.

Although the stripe-shaped ridge has a trapezoidal cross section in the present example, it may alternatively have a rectangular cross section.

Figure 1:
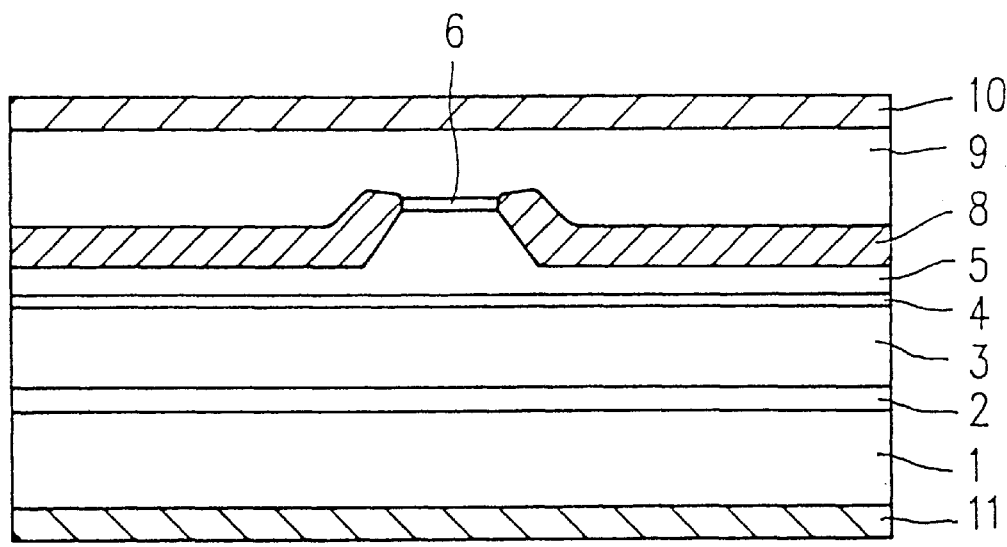
FIG. 1 is a cross-sectional view showing a conventional red-light semiconductor laser.
Figure 2A:
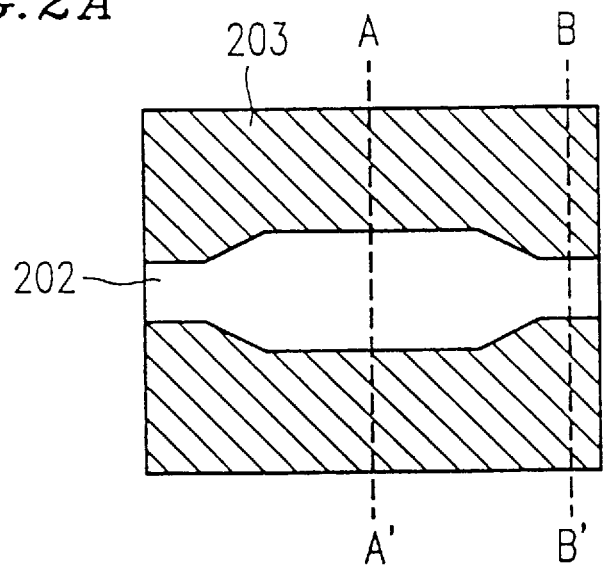
FIG. 2A is a plan view showing a conventional semiconductor laser.
Figure 2B:
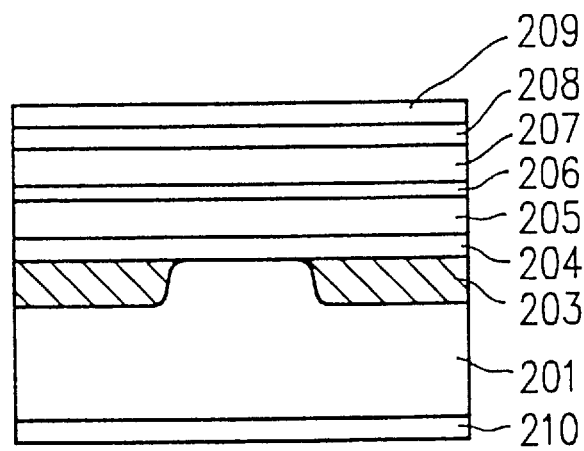
FIG. 2B is a view showing an A–A' cross section of a conventional semiconductor laser shown in FIG. 2A.
Figure 2C:
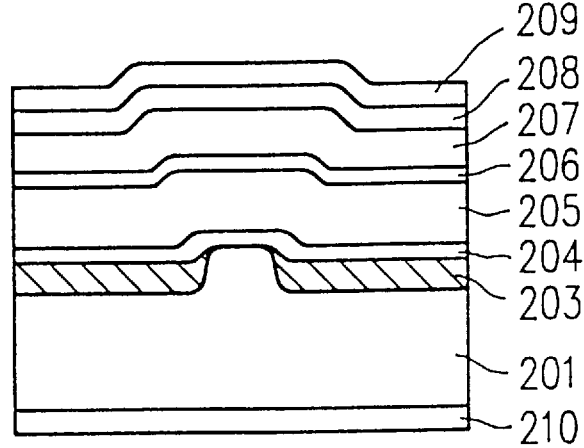
FIG. 2C is a view showing a B–B' cross section of a conventional semiconductor laser shown in FIG. 2A.
Figure 4:
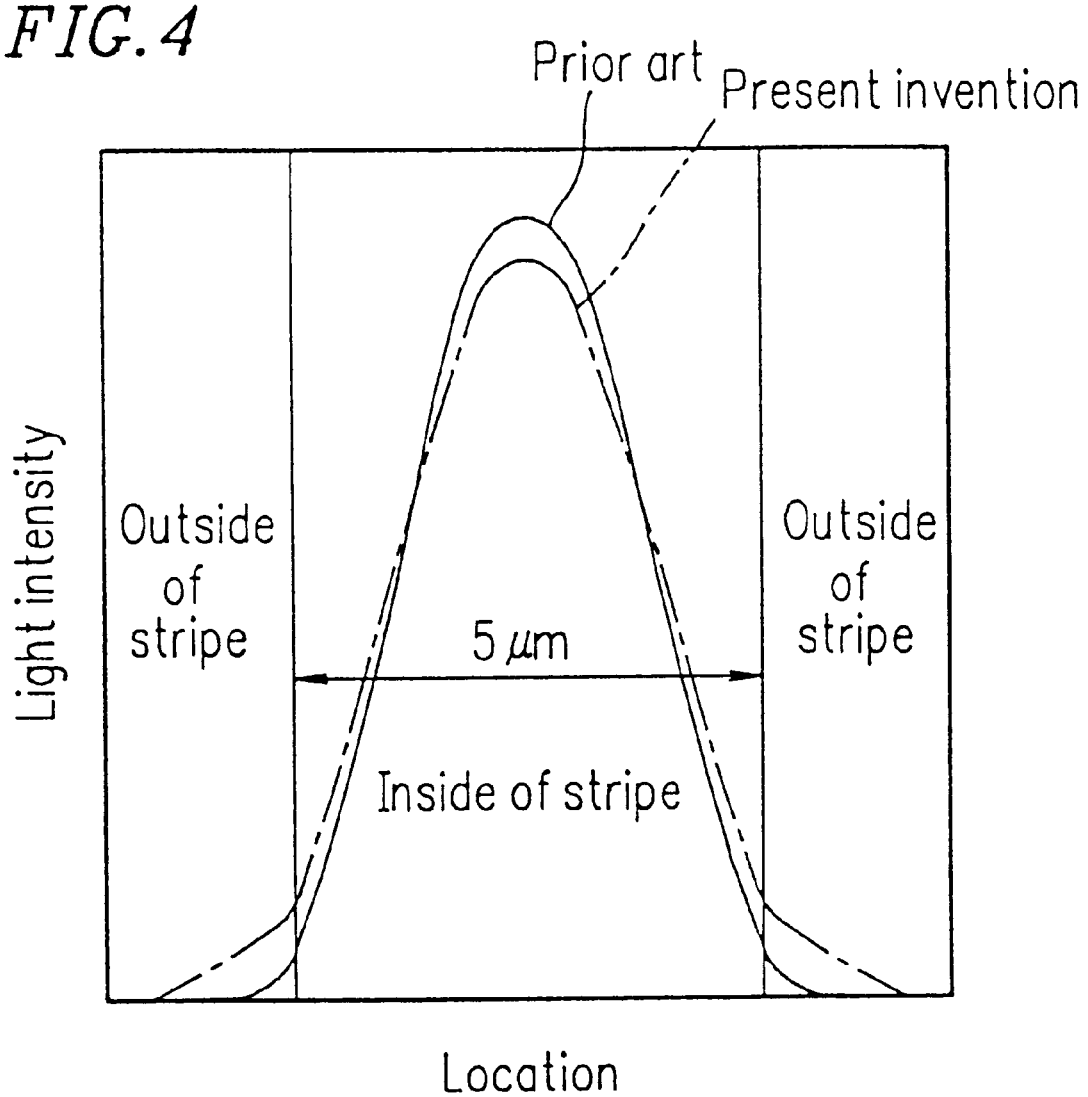
FIG. 4 is a diagram showing a distribution of light intensities in each of a semiconductor laser according to an example of the present invention and a conventional semiconductor laser, taken along a direction parallel to the layers of each semiconductor laser.
Figure 5A:
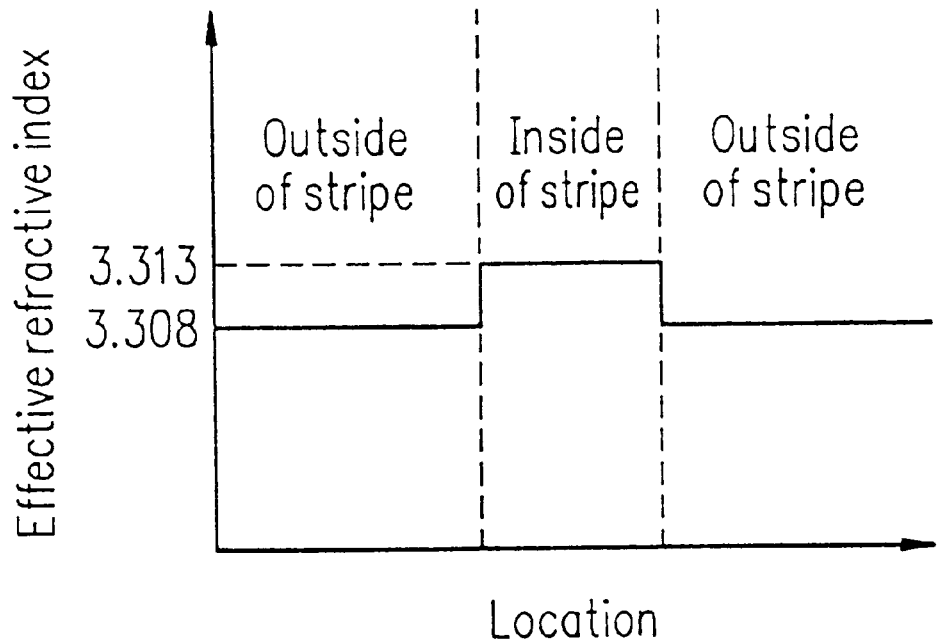
FIG. 5A is a diagram showing a distribution of effective refractive indices in a semiconductor laser according to an example of the present invention, taken along a direction parallel to the layers of each semiconductor laser.
Figure 5B:
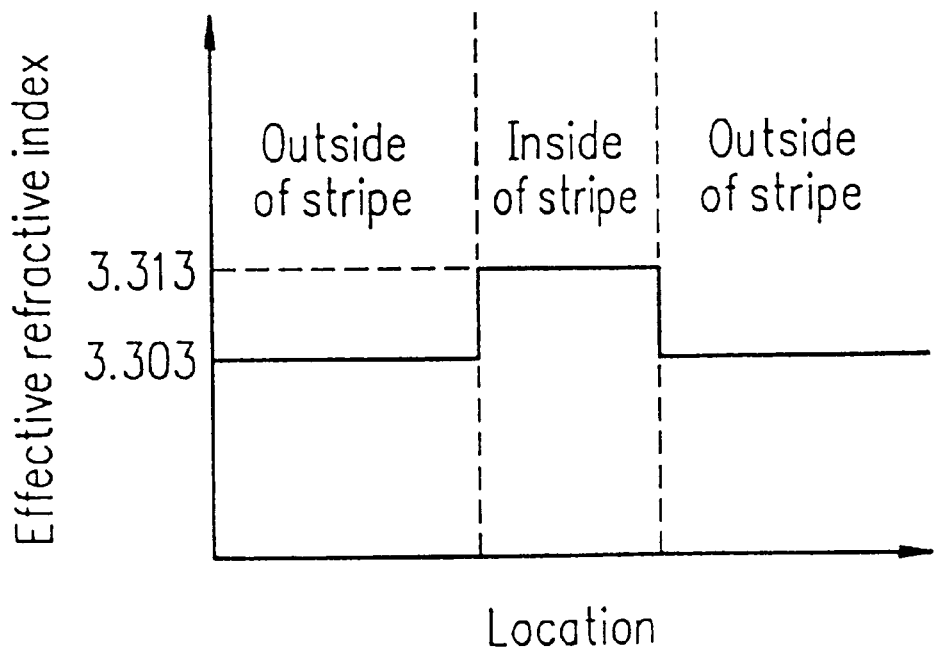
FIG. 5B is a diagram showing a distribution of effective refractive indices in a conventional semiconductor laser, taken along a direction parallel to the layers of each semiconductor laser.

FIG. 4 shows a distribution of light intensities in the vicinity of the stripe-shaped ridge of each of the semiconductor laser according to the present invention shown in FIG. 3 and the conventional semiconductor laser shown in FIG. 1. As seen from FIG. 4, the semiconductor laser according to the present invention (shown by the broken line) has more light leaking outside the stripe-shaped ridge as compared with the distribution of light in the conventional semiconductor laser (shown by the solid line). This is because, with reference to the distribution of effective refractive indices in the lateral direction, the difference between the respective effective refractive indices taken inside and outside the stripe-shaped ridge is smaller than that of the conventional semiconductor laser, as shown in FIGS. 5A and 5B, so that a smaller amount of light is confined than in the case of the conventional semiconductor laser. Since there is no gain outside the stripe-shaped ridge, light which has leaked outside the stripe-shaped ridge starts self-pulsation, which brings about a multitude of longitudinal modes. As a result, the RIN (Relative Intensity Noise) can be reduced to −135 dB/Hz or less. In the conventional semiconductor laser shown in FIG. 1, which do not include two current confining layers, the RIN is about −120 dB/Hz.

Self-pulsation may also be achieved by, in the conventional configuration shown in FIG. 1, increasing the thickness of a portion of the p-$(Al_{0.6}Ga_{0.4})_{0.5}In_{0.5}P$ cladding layer 5 present below the second current confining layer 8 so that an increased amount of light leaks outside the stripe-shaped ridge. In such cases, however, it is impossible to obtain a sufficiently large difference in the threshold gain between the fundamental lateral mode and the lateral mode of higher orders. As a result, the lateral mode may become unstable, which results in poor practicality of the semiconductor laser. Moreover, the number of the carriers that leak outside the stripe-shaped ridge may increase, thereby increasing the driving current and resulting in poor reliability of the semiconductor laser.

Thus, the combination of the two current confining layers 7 and 8 having different properties from each other according to the present invention realizes an advantage that cannot be obtained by a conventional semiconductor laser, that is, the advantage of adequately lowering the light confining effect while maintaining the carrier confining effect.

The n-GaAs second current confining layer 8 of the semiconductor laser according to the present example and the n-GaAs current confining layer 8 of the conventional semiconductor laser shown in FIG. 1 are composed of the same material, and accordingly serve the same function of absorbing leak light. However, the n-$Al_{0.5}Ga_{0.5}As$ first current confining layer 7, which is relatively thin and therefore does not absorb leak light, is interposed between the n-GaAs second current confining layer 8 and the p-$(Al_{0.6}Ga_{0.4})_{0.5}In_{0.5}P$ cladding layer 5, so as to increase the effective refractive index of that region. As a result, the distribution of effective refractive indices as shown in FIG. 5A is obtained.

In the distribution of light intensities shown in FIG. 4, the peak light intensity of the semiconductor laser according to the present invention is smaller than that of the conventional semiconductor laser. As a result, the lateral mode instability due to spatial hole burning can be reduced, and kinks are prevented from occurring in the current-optical output characteristics of the semiconductor laser.

Figure 6:
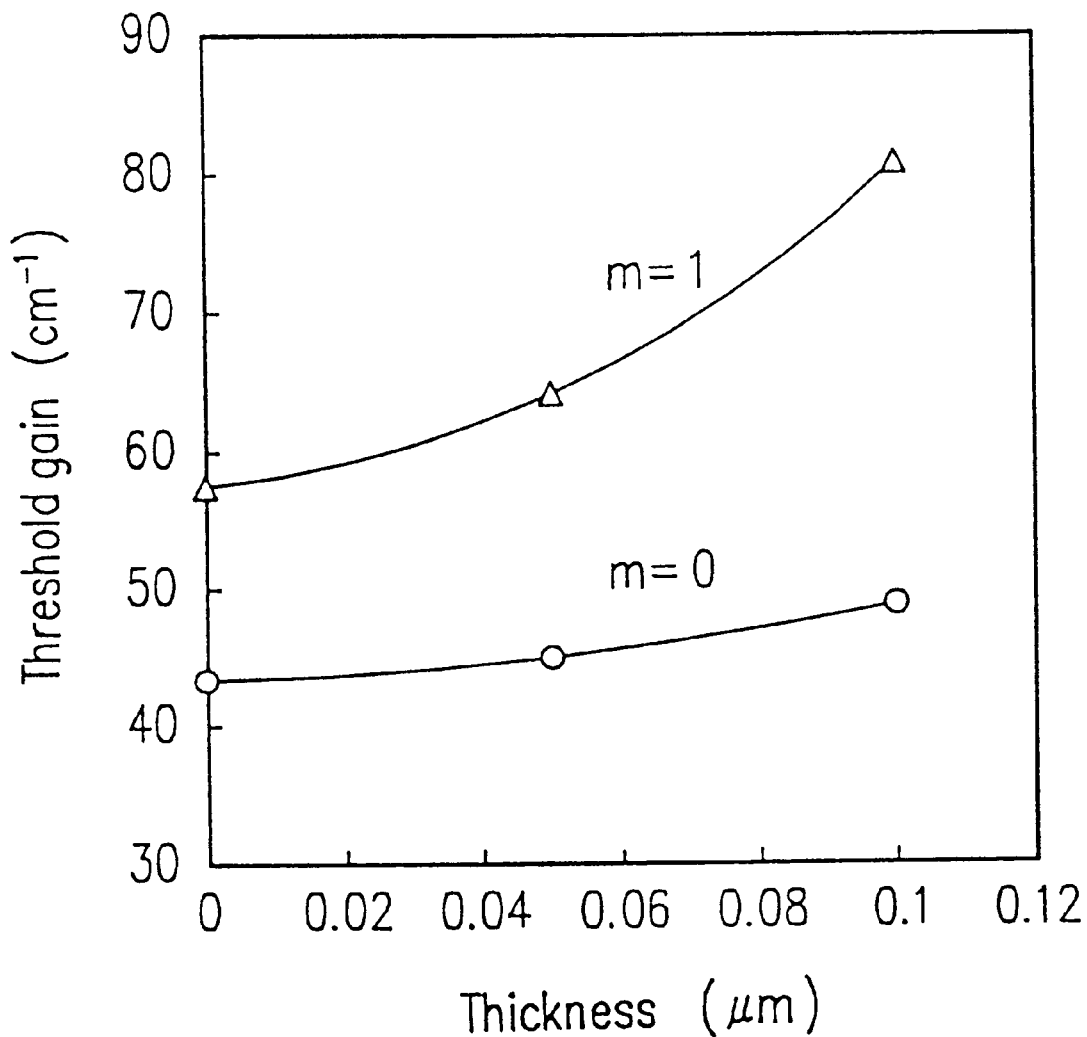
FIG. 6 is a graph for describing an effect of the semiconductor laser according to the present invention, which shows relationship between the threshold gain and the thickness of a first current confining layer.

FIG. 6 shows change in the threshold gain depending on the thickness of the n-$Al_{0.5}Ga_{0.5}As$ first current confining layer 7. Since the conventional semiconductor laser shown in FIG. 1 has no such first current confining layer, the threshold gain thereof appears on the axis of ordinates (i.e. thickness of the n-$Al_{0.5}Ga_{0.5}As$ first current confining layer 7=0). The curve m=0 denotes the fundamental lateral mode. The curve m=1 denotes the first order lateral mode. This graph shown in FIG. 6 is obtained under the conditions that the mirror loss is 34 $cm^{-1}$, and that the free carrier loss is 5 $cm^{-1}$.

As seen from FIG. 6, the configuration according to the present invention, in which the n-$A_{0.5}Ga_{0.5}As$ first current confining layer 7 is incorporated, has a large difference in the respective threshold gains of the fundamental lateral mode and the first order lateral mode, indicative of high stability of the fundamental lateral mode. Also to be seen from FIG. 6 is that the difference in threshold gains increases as the thickness of the n-$Al_{0.5}Ga_{0.5}As$ first current confining layer 7 increases. However, if the thickness of the n-$Al_{0.5}Ga_{0.5}As$ first current confining layer 7 is excessively large, the threshold gain of the fundamental lateral mode becomes so large that the laser oscillation becomes difficult to achieve, or if laser oscillation is achieved at all, the external differential quantum efficiency may decrease, thereby increasing the driving current. According to the configuration shown in FIG. 3, the materials used therein require the thickness of the n-$Al_{0.5}Ga_{0.5}As$ first current confining layer 7 to be, preferably, 0.3 $\mu$m or less. However, the preferred range of thickness of the n-$Al_{0.5}Ga_{0.5}As$ first current confining layer 7 may vary depending on such factors as the refractive indices and absorption coefficients for laser light of the layers included in the semiconductor laser, and the material used for the current confining layers 7 and 8.

As described above, according to the present example, the n-$Al_{0.5}Ga_{0.5}As$ first current confining layer 7 has an energy band gap larger than that of the active layer 4, and has a refractive index smaller than that of the active layer 4. In addition, the n-GaAs second current confining layer 8 provided above the n-$Al_{0.5}Ga_{0.5}As$ first current confining layer 7 has an energy band gap smaller than that of the active layer 4. As a result, self-pulsation is achieved, and a multitude of longitudinal modes are realized, whereby the RIN is reduced.

Figure 18:
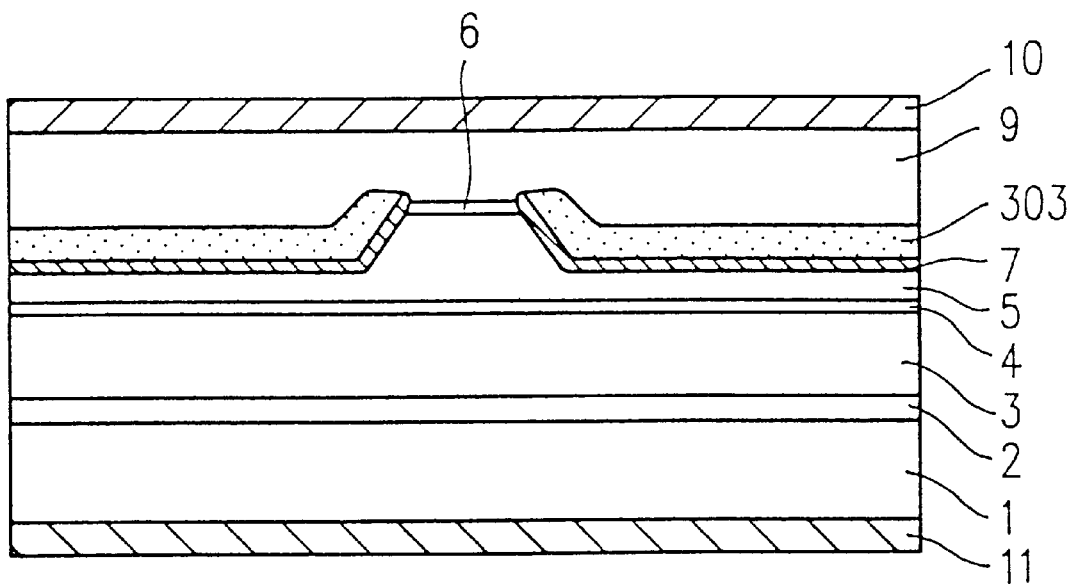
FIG. 18 is a cross-sectional view showing a lateral mode-controlled type red-light semiconductor laser according to an example of the present invention.

Although two current confining layers 7 and 8 are incorporated in the semiconductor laser shown in FIG. 3, it is also applicable to employ a configuration shown in FIG. 18, in which a p-GaAs layer 303 having the same conductivity type as that of a p-$(Al_{0.6}Ga_{0.4})_{0.5}In_{0.5}P$ cladding layer 5 is used instead of a second current confining layer, as long as a first current confining layer 7 closer to an active layer 4 is capable of sufficiently confining a current into the predetermined region of the active layer 4 under the stripe-shaped ridge.

Next, a method for producing the semiconductor laser according to the present example will be described with reference to FIGS. 7 to 11.

Figure 7:
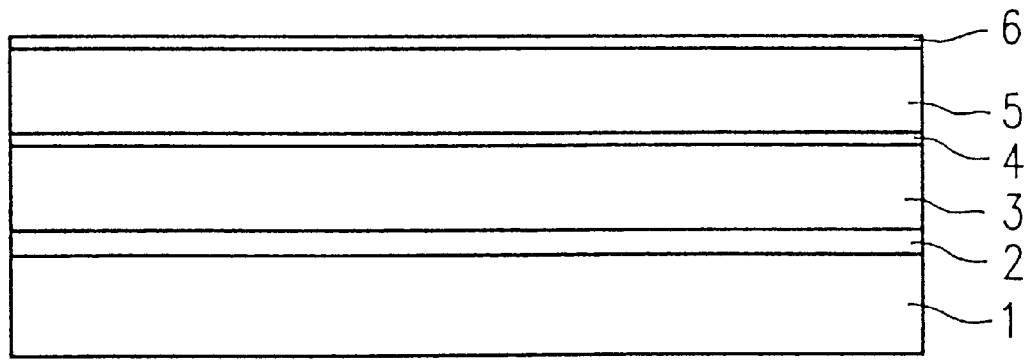
FIG. 7 is a first one of consecutive cross-sectional views showing a semiconductor laser according to the present invention during the fabrication thereof.
Figure 8:
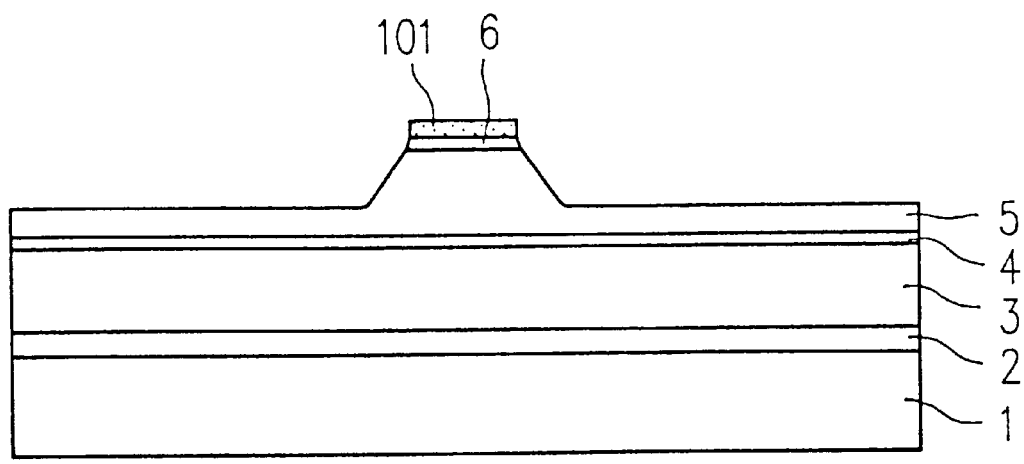
FIG. 8 is a second one of consecutive cross-sectional views showing a semiconductor laser according to the present invention during the fabrication thereof.

First, by a crystal growing method such as MOVPE, the n-GaAs buffer layer 2, the n-$(Al_{0.6}Ga_{0.4})_{0.5}In_{0.5}P$ cladding layer 3, the $Ga_{0.5}In_{0.5}P$ active layer 4, the p-$(Al_{0.6}Ga_{0.4})_{0.5}In_{0.5}P$ cladding layer 5, and the p-$Ga_{0.5}In_{0.5}P$ layer 6 are epitaxially grown upon the n-GaAs substrate 1 in this order (FIG. 7). Then, $SiO_2$ 101 is deposited on the p-$Ga_{0.5}In_{0.5}P$ layer 6 by a thermal CVD (Chemical Vapor Deposition) method, and is processed into a stripe shape by photolithography and etching. By using the $SiO_2$ 101 as an etching mask, the p-$Ga_{0.5}In_{0.5}P$ layer 6 and a portion of the p-$(Al_{0.6}Ga_{0.4})_{0.5}In_{0.5}P$ cladding layer 5 are etched so as to form a stripe-shaped ridge (FIG. 8). The width of the $SiO_2$ is about 5 $\mu$m.

In order to obtain a good control over the formation of the stripe-shaped ridge by etching a portion of the p-$(Al_{0.6}Ga_{0.4})_{0.5}In_{0.5}P$ cladding layer 5, it is preferable to compose the p-$(Al_{0.6}Ga_{0.4})_{0.5}In_{0.5}P$ cladding layer 5 of, for example, a film including an upper p-$(Al_{0.6}Ga_{0.4})_{0.5}In_{0.5}P$ layer, a lower p-$(Al_{0.6}Ga_{0.4})_{0.5}In_{0.5}P$ layer, and an etching stopper layer (not shown) interposed between the upper and lower p-$(Al_{0.6}Ga_{0.4})_{0.5}In_{0.5}P$ layers. A material which is relatively immune to etching by an etching solution used for primarily etching the upper p-$(Al_{0.6}Ga_{0.4})_{0.5}In_{0.5}P$ layer is used for such an etching stopper layer.

By incorporating such an etching stopper layer in the p-$(Al_{0.6}Ga_{0.4})_{0.5}In_{0.5}P$ cladding layer 5, a stripe-shaped ridge having a desired height can be stably obtained even if the etching conditions for the upper p-$(Al_{0.6}Ga_{0.4})_{0.5}In_{0.5}P$ layer fluctuate. However, the etching stopper layer should be formed sufficiently thin not to have any optical functions because the etching stopper will remain in the stripe-shaped ridge.

Figure 9:
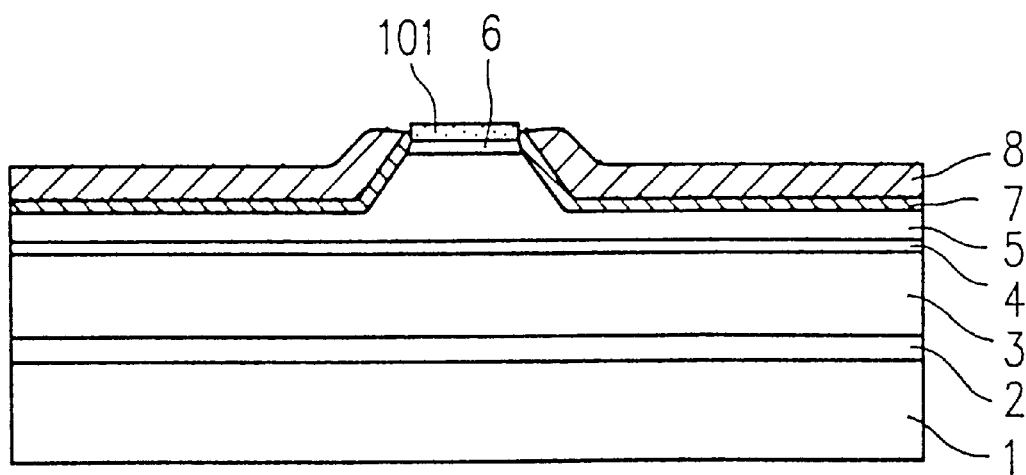
FIG. 9 is a third one of consecutive cross-sectional views showing a semiconductor laser according to the present invention during the fabrication thereof.
Figure 10:
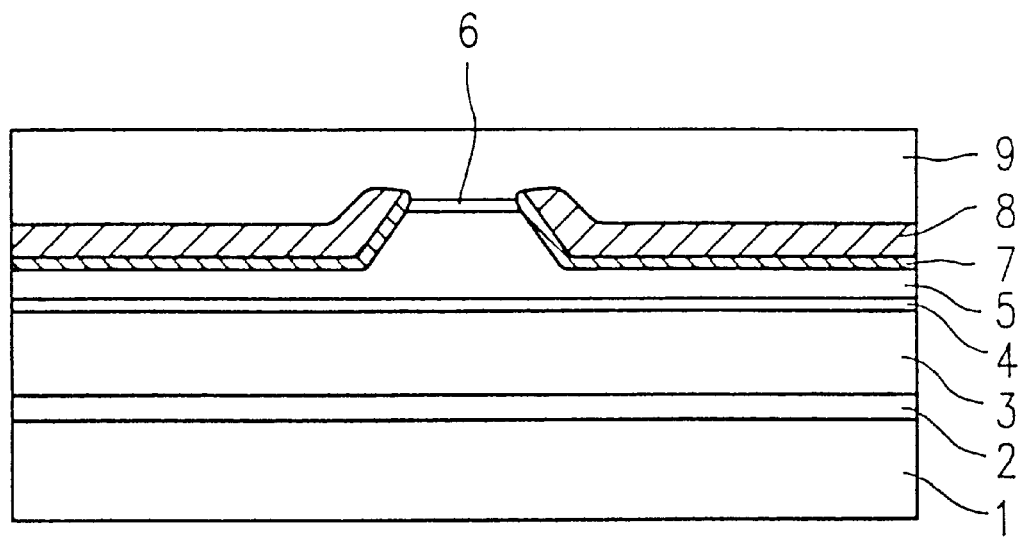
FIG. 10 is a fourth one of consecutive cross-sectional views showing a semiconductor laser according to the present invention during the fabrication thereof.
Figure 11:
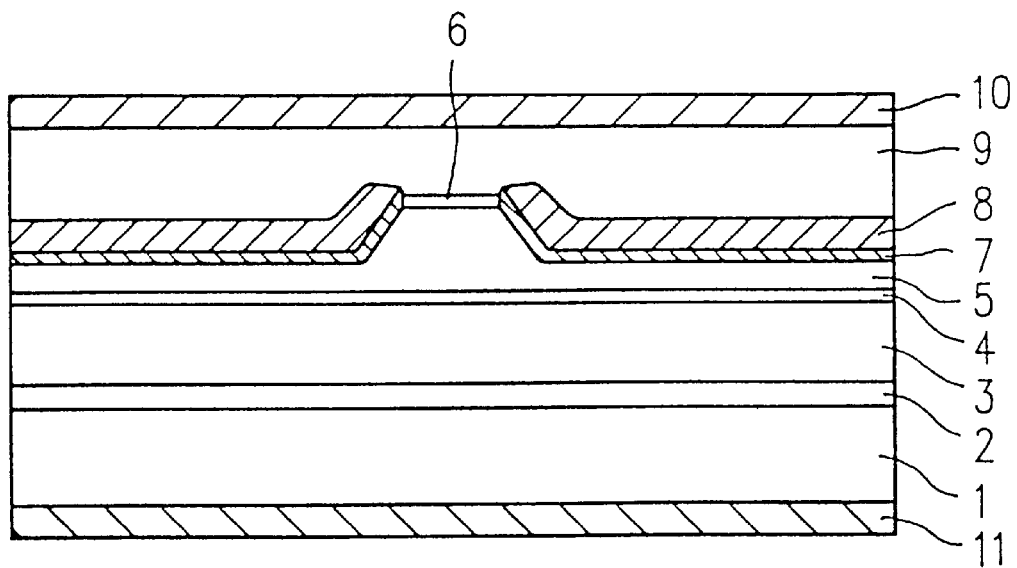
FIG. 11 is a fifth one of consecutive cross-sectional views showing a semiconductor laser according to the present invention during the fabrication thereof.

After thus forming the stripe-shaped ridge, the n-$Al_{0.5}Ga_{0.5}As$ first current confining layer 7 and the n-GaAs second current confining layer 8 are grown on portions of the p-$(Al_{0.6}Ga_{0.4})_{0.5}In_{0.5}P$ cladding layer 5 present on either side of the stripe-shaped ridge by using a selective growth method such as MOVPE, without allowing the n-$Al_{0.5}Ga_{0.5}As$ first current confining layer 7 or the n-GaAs second current confining layer 8 to grow on the $SiO_2$ 101 (FIG. 9). Thereafter, the $SiO_2$ 101 is removed, and the p-GaAs contact layer 9 is grown (FIG. 10). Finally, Cr/Pt/Au is deposited on the p-GaAs contact layer 9 so as to form the p-side electrode 10, and Au/Ge/Ni is deposited on the n-GaAs substrate 1 so as to form the n-side electrode 11 (FIG. 11). The p-$(Al_{0.6}Ga_{0.4})_{0.5}In_{0.5}P$ cladding layer 5 has a thickness of 0.25 $\mu$m below the n-$Al_{0.5}Ga_{0.5}As$ first current confining layer 7.

By the above-described method, the lateral mode-controlled type red-light semiconductor laser shown in FIG. 3 can be fabricated.

It is preferable to grow the n-$Al_{0.5}Ga_{0.5}As$ first current confining layer 7 and the n-GaAs second current confining layer 8 by a selective growth method such as MOVPE. In other words, since the thickness of the n-$Al_{0.5}Ga_{0.5}As$ first current confining layer 7 is essential to the lateral mode stability and the noise characteristics of the semiconductor laser, the n-$Al_{0.5}Ga_{0.5}As$ first current confining layer 7 should be fabricated by a crystal growing method, which realizes excellent control over the thickness of a film to be formed, instead of etching, etc. Moreover, since the n-$Al_{0.5}Ga_{0.5}As$ first current confining layer 7 contains Al, an oxide of Al is likely to form. Therefore, in order to improve the reliability of the semiconductor laser, it is necessary to prevent the n-$Al_{0.5}Ga_{0.5}As$ first current confining layer 7 from being exposed to the atmosphere. In this respect, it is preferable to successively grow the n-$Al_{0.5}Ga_{0.5}As$ first current confining layer 7 and the n-GaAs second current confining layer 8.

Thus, the method for producing a semiconductor laser according to the present invention can provide semiconductor lasers having low RIN with a high yield.

Although certain materials are prescribed for the layers of the semiconductor laser in the present example, it is also possible to produce with ease a semiconductor laser having low RIN by using $(Al_yGa_{1-y})_{0.5}In_{0.5}P$ for the cladding layers, and $(Al_zGa_{1-z})_{0.5}In_{0.5}P$ (where $0 \leq z \leq y \leq 1$) for the active layer. Although a semiconductor laser incorporating an active layer having a multiple quantum well structure or a strained multiple quantum well structure generally has a tendency to operate in a single longitudinal mode, and therefore is likely to have poor noise characteristics, the present invention can provide a multiple quantum well/strained multiple quantum well semiconductor laser having low RIN.

Although AlGaInP is used for the semiconductor laser according to the present example, other material can be used without undermining the advantages of the present invention. It is possible to produce a semiconductor laser having low RIN which is composed essentially of a II-VI semiconductor material, instead of a III-V semiconductor material, by incorporating at least one current confining layer having an energy band gap larger than that of the active layer and by incorporating a layer having an energy band gap smaller than that of the active layer above the current confining layer.

EXAMPLE 2

A semiconductor laser according to a second example of the invention will be described with reference to FIG. 12.

Figure 12:
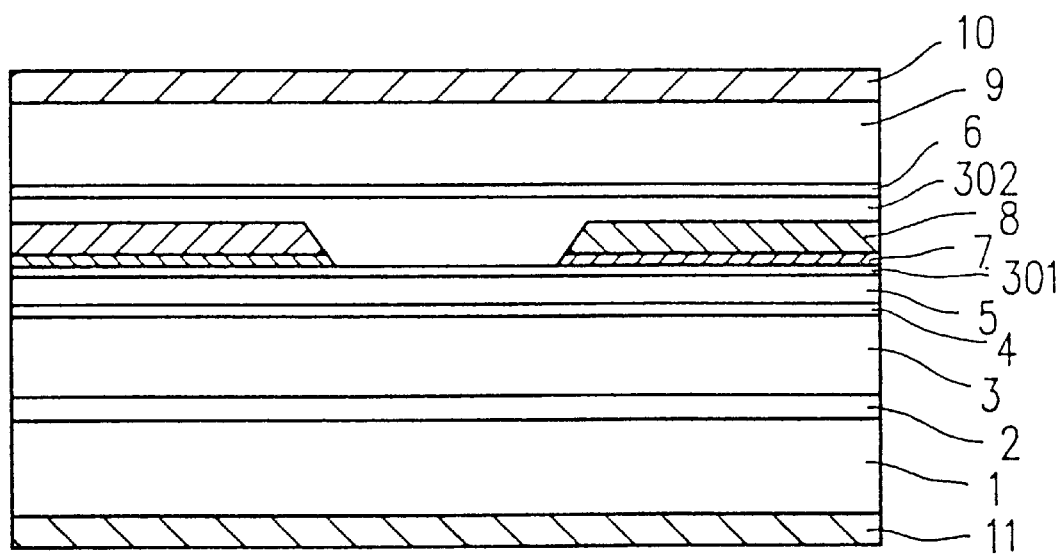
FIG. 12 is a cross-sectional view showing a lateral mode-controlled type red-light semiconductor laser according to an example of the present invention.

As shown in FIG. 12, the semiconductor laser according to the present example has a doublehetero structure in which a $Ga_{0.5}In_{0.5}P$ active layer 4 (thickness: 600 Å) is interposed between an n-$(Al_{0.6}Ga_{0.4})_{0.5}In_{0.5}P$ cladding layer 3 and a p-$(Al_{0.6}Ga_{0.4})_{0.5}In_{0.5}P$ cladding layer 5. These layers 3 to 5 are grown on an n-GaAs buffer layer 2, which in turn is grown on an n-GaAs substrate 1. Upon the-p-$(Al_{0.6}Ga_{0.4})_{0.5}In_{0.5}P$ cladding layer 5, a p-$Ga_{0.5}In_{0.5}P$ etching stopper layer 301 (thickness: 0.01 $\mu$m) is formed. Upon the p-$Ga_{0.5}In_{0.5}P$ etching stopper layer 301, an n-$Al_{0.5}Ga_{0.5}As$ first current confining layer 7 and an n-GaAs second current confining layer 8 are formed. A stripe-shaped opening for injecting carriers into a stripe-shaped predetermined region of the $Ga_{0.5}In_{0.5}P$ active layer 4 is formed in the n-$Al_{0.5}Ga_{0.5}As$ first current confining layer 7 and the n-GaAs current confining layer 8. Upon a stripe-shaped exposed region of the p-$Ga_{0.5}In_{0.5}P$ etching stopper layer 301 and upon the n-GaAs current confining layer 8, a second p-$(Al_{0.6}Ga_{0.4})_{0.5}In_{0.5}P$ cladding layer 302 is formed. Upon the second p-$(Al_{0.6}Ga_{0.4})_{0.5}In_{0.5}P$ cladding layer 302, a p-$Ga_{0.5}In_{0.5}P$ layer 6 and a p-GaAs contact layer 9 are formed in this order. A p-side electrode 10 is formed on the p-GaAs contact layer 9. An n-side electrode 11 is formed on the bottom face of the n-GaAs substrate 1. As seen from FIG. 12, a portion of the p-$(Al_{0.6}Ga_{0.4})_{0.5}In_{0.5}P$ cladding layer 302 is formed into a stripe-shaped ridge having a reversed posture (i.e. projecting downwards) with respect to the stripe-shaped ridge of the stripe-shaped ridge of the p-$(Al_{0.6}Ga_{0.4})_{0.5}In_{0.5}P$ cladding layer 5 shown in FIG. 3, so as to correspond to the stripe-shaped opening formed in the n-$Al_{0.5}Ga_{0.5}As$ first current confining layer 7 and the n-GaAs current confining layer 8.

The n-$Al_{0.5}Ga_{0.5}As$ first current confining layer 7 and the n-GaAs second current confining layer 8 function to control the lateral mode of the semiconductor laser as well as control a current to be injected into the predetermined region of the active layer 4. The energy band gap of the n-$Al_{0.5}Ga_{0.5}As$ first current confining layer 7 is about 2 eV, which is a larger value than that of the active layer 4. The refractive index of the n-$Al_{0.5}Ga_{0.5}As$ first current confining layer 7 is 3.38, which is a smaller value than that of the active layer 4. On the other hand, the energy band gap of the n-GaAs second current confining layer 8 is smaller than that of the active layer 4, so that a portion of light generated by the recombination of carriers is absorbed by the n-GaAs second current confining layer 8. The width of the stripe-shaped ridge of the p-$(Al_{0.6}Ga_{0.4})_{0.5}In_{0.5}P$ cladding layer 5 (i.e. the width of the stripe-shaped opening in the n-$Al_{0.5}Ga_{0.5}As$ first current confining layer 7 and the n-GaAs current confining layer 8) is prescribed to be such a value that the fundamental lateral mode and lateral modes of higher orders have a large difference in gain. For example, by prescribing the width of the stripe-shaped ridge to be about 5 $\mu$m, a large amount of lateral mode light of higher orders than the first order is absorbed in the above-mentioned portions of the p-$(Al_{0.6}Ga_{0.4})_{0.5}In_{0.5}P$ cladding layer 5 excluding the stripe-shaped ridge, so as to sufficiently increase the propagation loss. Thus, oscillation in a single lateral mode can be realized.

According to the present invention, the current confining layers 7 and 8 are provided on the p-$(Al_{0.6}Ga_{0.4})_{0.5}In_{0.5}P$ cladding layer 5 side of the active layer 4. If the current confining layers 7 and 8 were provided on the n-$(Al_{0.6}Ga_{0.4})_{0.5}In_{0.5}P$ cladding layer 3 side of the active layer 4, electrons, which are the majority carriers in the n-$(Al_{0.6}Ga_{0.4})_{0.5}In_{0.5}P$ cladding layer 3, have such a high mobility that those electrons which have passed through the current confining layers 7 and 8 would easily spread along the horizontal direction. Thus, the advantage of current confinement would be reduced, resulting in problems such as an increased driving current and a reduced lateral mode stability.

The thickness of portions of the p-$(Al_{0.6}Ga_{0.4})_{0.5}In_{0.5}P$ cladding layer 5 excluding the stripe-shaped ridge (i.e. the portions located below the n-$Al_{0.5}Ga_{0.5}As$ first current confining layer 7) is 0.25 nm. If this thickness is excessively large, a large number of carriers may leak outside the stripe-shaped ridge. As a result, the driving current increases, which results in a decrease in reliability, or higher modes become more likely to oscillate, which makes the lateral mode unstable.

Although the stripe-shaped ridge has a trapezoidal cross section in the present example, it may alternatively have a rectangular cross section.

Figure 13:
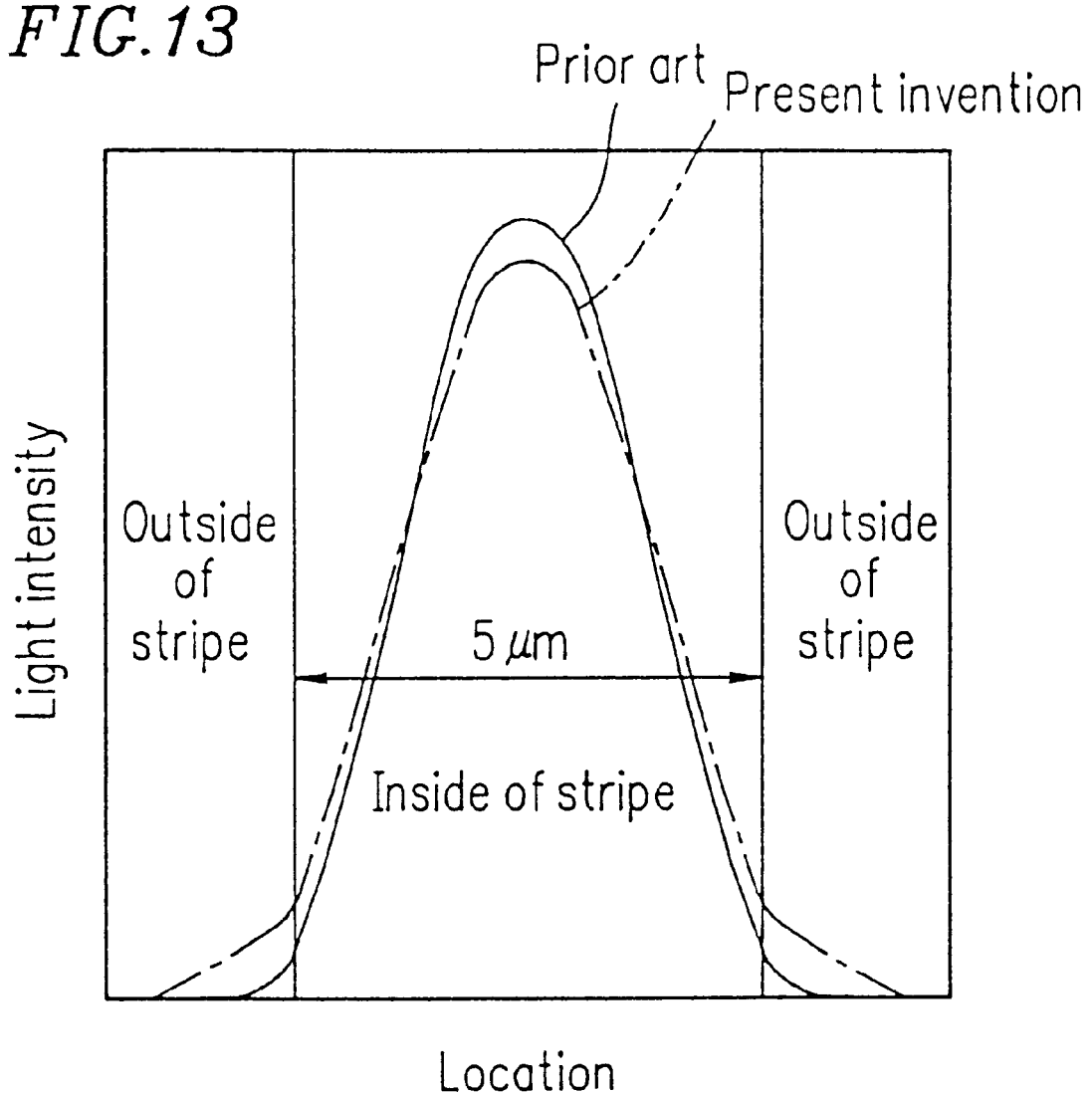
FIG. 13 is a diagram showing a distribution of light intensities in each of a semiconductor laser according to an example of the present invention and a conventional semiconductor laser, taken along a direction parallel to the layers of each semiconductor laser.

FIG. 13 shows a distribution of light intensities in the vicinity of the stripe-shaped ridge of each of the semiconductor laser according to the present invention shown in FIG. 12 and the conventional semiconductor laser shown in FIG. 1. As seen from FIG. 13, the semiconductor laser according to the present invention (shown by the broken line) has more light leaking outside the stripe-shaped ridge as compared with the distribution of light in the conventional semiconductor laser (shown by the solid line). This is because, the difference between the respective effective refractive indices taken inside and outside the stripe-shaped ridge is smaller than that of the conventional semiconductor laser, so that a smaller amount of light is confined than in the case of the conventional semiconductor laser. Since there is no gain outside the stripe-shaped ridge, light which has leaked outside the stripe-shaped ridge starts self-pulsation, which brings about a multitude of longitudinal modes. As a result, the RIN can be reduced to -135 dB/Hz or less. In the conventional semiconductor laser shown in FIG. 1, which does not include two current confining layers, the RIN is about −120 dB/Hz.

In the distribution of light intensities shown in FIG. 13, the peak light intensity of the semiconductor laser according to the present invention is smaller than that of the conventional semiconductor laser. As a result, the lateral mode instability due to spatial hole burning can be reduced, and kinks are prevented from occurring in the current-optical output characteristics of the semiconductor laser.

As described above, according to the present example, self-pulsation is achieved, and a multitude of longitudinal modes are realized so as to reduce the RIN, by ensuring that the semiconductor laser has first and second current confining layers, and that the first current confining layer has an energy band gap larger than that of the active layer and a refractive index smaller than that of the active layer, and further that the second current confining layer provided above the first current confining layer has an energy band gap smaller than that of the active layer, although the thicknesses and materials of the first and second current confining layers may vary depending on the design of the semiconductor laser.

Although two current confining layers 7 and 8 are incorporated in the semiconductor laser shown in FIG. 12, it is also applicable to incorporate, instead of the n-GaAs second current confining layer 8, a p-GaAs layer (which is of the same conductivity type as that of the p-$(Al_{0.6}Ga_{0.4})_{0.5}In_{0.5}P$ cladding layer 5), as long as the n-$Al_{0.5}Ga_{0.5}As$ first current confining layer 7 closer to the active layer 4 is capable of sufficiently confining a current into the stripe-shaped predetermined region of the active layer 4.

Next, a method for producing the semiconductor laser according to the present example will be described with reference to FIGS. 14 to 17.

Figure 14:
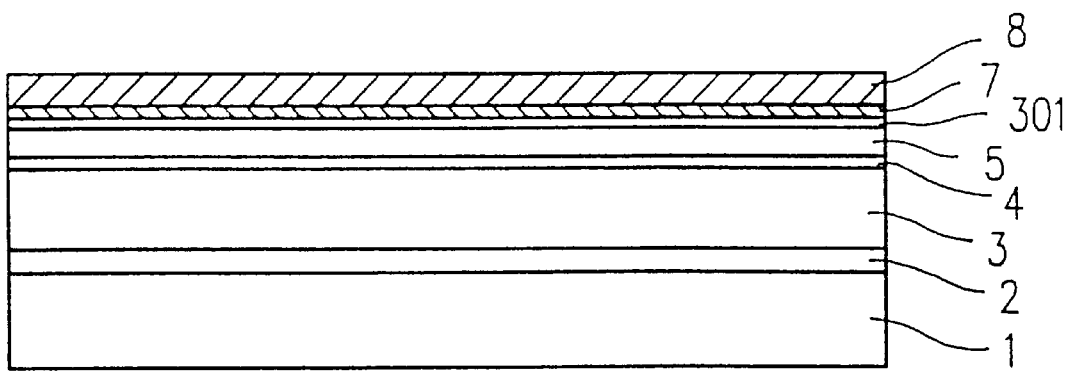
FIG. 14 is a first one of consecutive cross-sectional views showing a semiconductor laser according to the present invention during the fabrication thereof.
Figure 15:
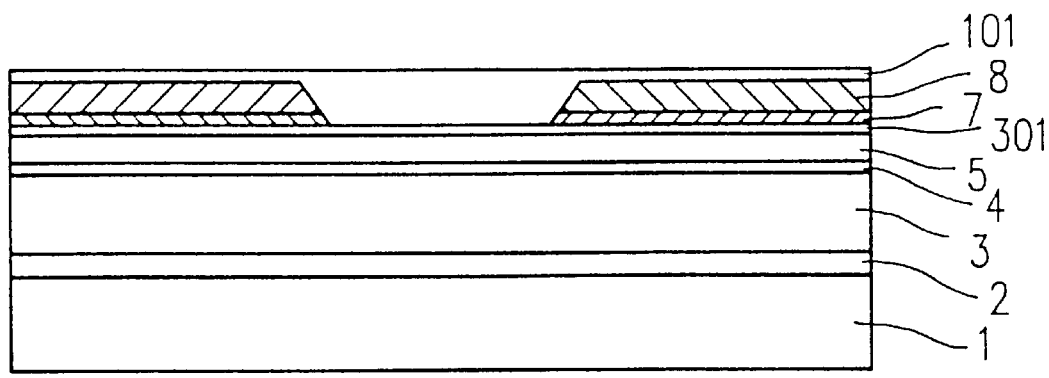
FIG. 15 is a second one of consecutive cross-sectional views showing a semiconductor laser according to the present invention during the fabrication thereof.

First, by a crystal growing method such as MOVPE, the n-GaAs buffer layer 2, the n-$(Al_{0.6}Ga_{0.4})_{0.5}In_{0.5}P$ cladding layer 3, the $Ga_{0.5}In_{0.5}P$ active layer 4, the p-$(Al_{0.6}Ga_{0.4})_{0.5}In_{0.5}P$ cladding layer 5, the $Ga_{0.5}In_{0.5}P$ etching stopper layer 301, the n-$Al_{0.5}Ga_{0.5}As$ first current confining layer 7, and n-GaAs second current confining layer 8 are epitaxially grown upon the n-GaAs substrate 1 in this order (FIG. 14). Then, $SiO_2$ 101 is deposited on the n-GaAs second current confining layer 8 by a thermal CVD method, and is processed into a stripe shape by photolithography and etching. By using the $SiO_2$ 101 as an etching mask, a portion of the n-GaAs second current confining layer 8 and a portion of the n-$Al_{0.5}Ga_{0.5}As$ first current confining layer 7 are etched so as to expose the p-$Ga_{0.5}In_{0.5}P$ etching stopper layer 301 in a stripe-like shape (FIG. 15). The width of the fabricated stripe is about 5 μm.

Figure 16:
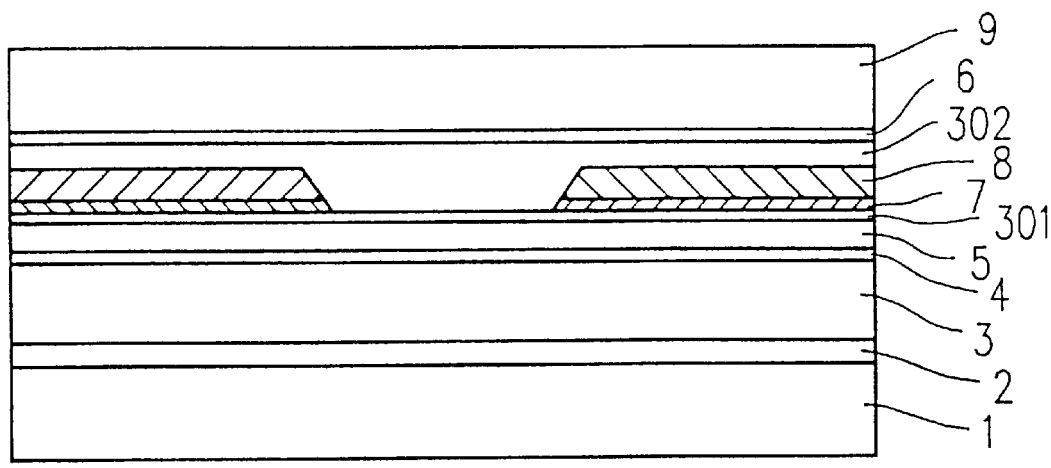
FIG. 16 is a third one of consecutive cross-sectional views showing a semiconductor laser according to the present invention during the fabrication thereof.
Figure 17:
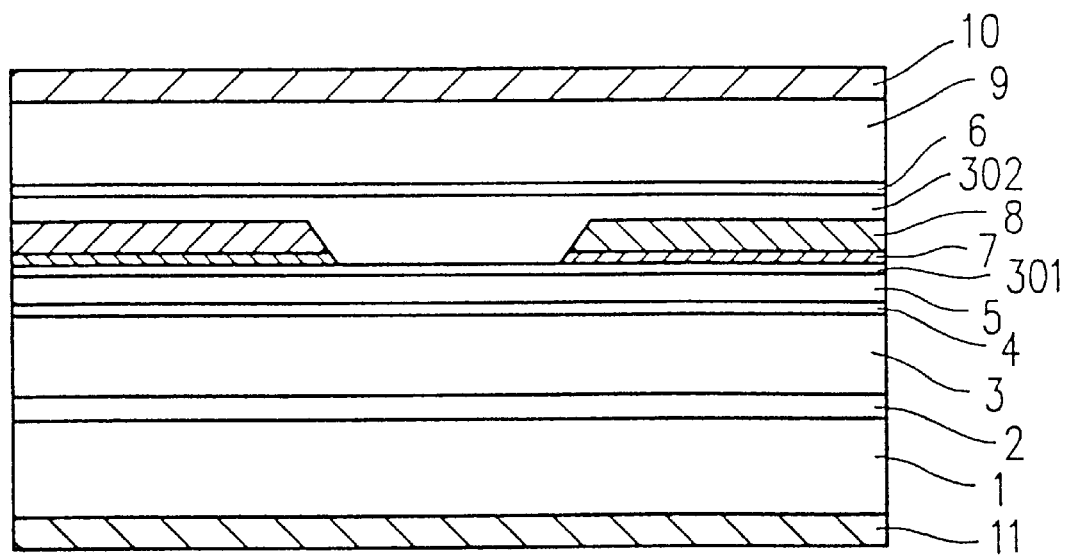
FIG. 17 is a fourth one of consecutive cross-sectional views showing a semiconductor laser according to the present invention during the fabrication thereof.

Thereafter, the second p-$(Al_{0.6}Ga_{0.4})_{0.5}In_{0.5}P$ cladding layer 302 and the p-$Ga_{0.5}In_{0.5}P$ layer 6 are grown on the p-$Ga_{0.5}In_{0.5}P$ etching stopper layer 301 exposed in a stripe-like shape and the n-GaAs second current confining layer 8, by using a selective growth method such as MOVPE, and the p-GaAs contact layer 9 is further grown on the p-$Ga_{0.5}In_{0.5}P$ layer 6 (FIG. 16). Finally, Cr/Pt/Au is deposited on the p-GaAs contact layer 9 so as to form the p-side electrode 10, and Au/Ge/Ni is deposited on the n-GaAs substrate 1 so as to form the n-side electrode 11 (FIG. 17). The p-$(Al_{0.6}Ga_{0.4})_{0.5}In_{0.5}P$ cladding layer 5 has a thickness of 0.25 μm below the n-$Al_{0.5}Ga_{0.5}As$ first current confining layer 7.

By the above-described method, the lateral mode-controlled type red-light semiconductor laser shown in FIG. 12 can be fabricated.

It is preferable to grow the n-$Al_{0.5}Ga_{0.5}As$ first current confining layer 7 and the n-GaAs second current confining layer 8 by a crystal growing method such as MOVPE. In other words, since the thickness of the n-$Al_{0.5}Ga_{0.5}As$ first current confining layer 7 is essential to the lateral mode stability and the noise characteristics of the semiconductor laser, the n-$Al_{0.5}Ga_{0.5}As$ first current confining layer 7 should be fabricated by a crystal growing method, which realizes excellent control over the thickness of a film to be formed, instead of etching, etc. Moreover, since the n-$Al_{0.5}Ga_{0.5}As$ first current confining layer 7 contains Al, an oxide of Al is likely to form. Therefore, in order to improve the reliability of the semiconductor laser, it is necessary to prevent the n-$Al_{0.5}Ga_{0.5}As$ first current confining layer 7 from being exposed to the atmosphere. In this respect, it is preferable to successively grow the n-$Al_{0.5}Ga_{0.5}As$ first current confining layer 7 and the n-GaAs second current confining layer 8.

Thus, the method for producing a semiconductor laser according to the present invention can provide semiconductor lasers having low RIN with a high yield.

Although certain materials are prescribed for the layers of the semiconductor laser in the present example, it is also possible to produce with ease a semiconductor laser having low RIN by using $(Al_yGa_{1-y})_{0.5}In_{0.5}P$ for the cladding layers, and $(Al_zGa_{1-z})_{0.5}In_{0.5}P$ (where $0 \leq z \leq y \leq 1$) for the active layer. Although a semiconductor laser incorporating an active layer having a multiple quantum well structure or a strained multiple quantum well structure generally has a tendency to operate in a single longitudinal mode, and therefore is likely to have poor noise characteristics, the present invention can provide a multiple quantum well/strained multiple quantum well semiconductor laser having low RIN.

Figure 19:
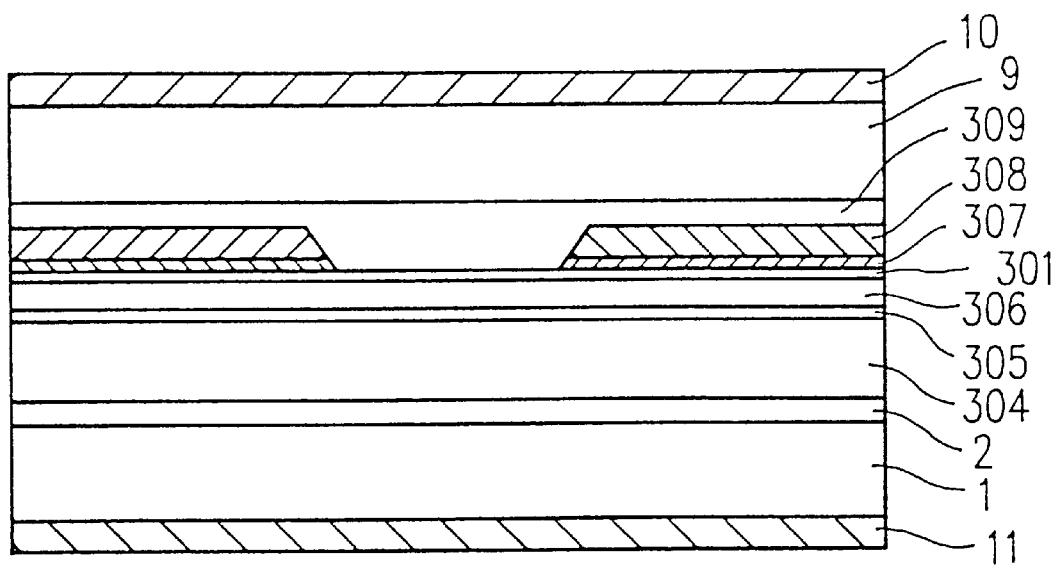
FIG. 19 is a cross-sectional view showing a lateral mode-controlled type red-light semiconductor laser according to an example of the present invention.

Although AlGaInP is used for the semiconductor laser according to the present example, other material can be used without undermining the advantages of the present invention. It is possible to produce a semiconductor laser having low RIN which is composed essentially of a II-VI semiconductor material, instead of a III-V semiconductor material, by incorporating at least one current confining layer having an energy band gap larger than that of the active layer and by incorporating a layer having an energy band gap smaller than that of the active layer above the current confining layer. An exemplary semiconductor laser composed essentially of AlGaAs is shown in FIG. 19.

As described above, according to the present example, the first current confining layer has an energy band gap larger than that of the active layer and a refractive index smaller than that of the active layer, so that the difference between the respective effective refractive indices taken inside and outside the stripe-shaped ridge is reduced. As a result, the amount of light that leaks outside the stripe-shaped ridge increases, thereby achieving self-pulsation. Thus, a multitude of longitudinal modes are realized, thereby reducing the RIN.

By adopting a multiple quantum well structure or a strained multiple quantum well structure for the active layer, the oscillation efficiency can be increased, whereby the threshold current can be reduced.

EXAMPLE 3

Figure 20:
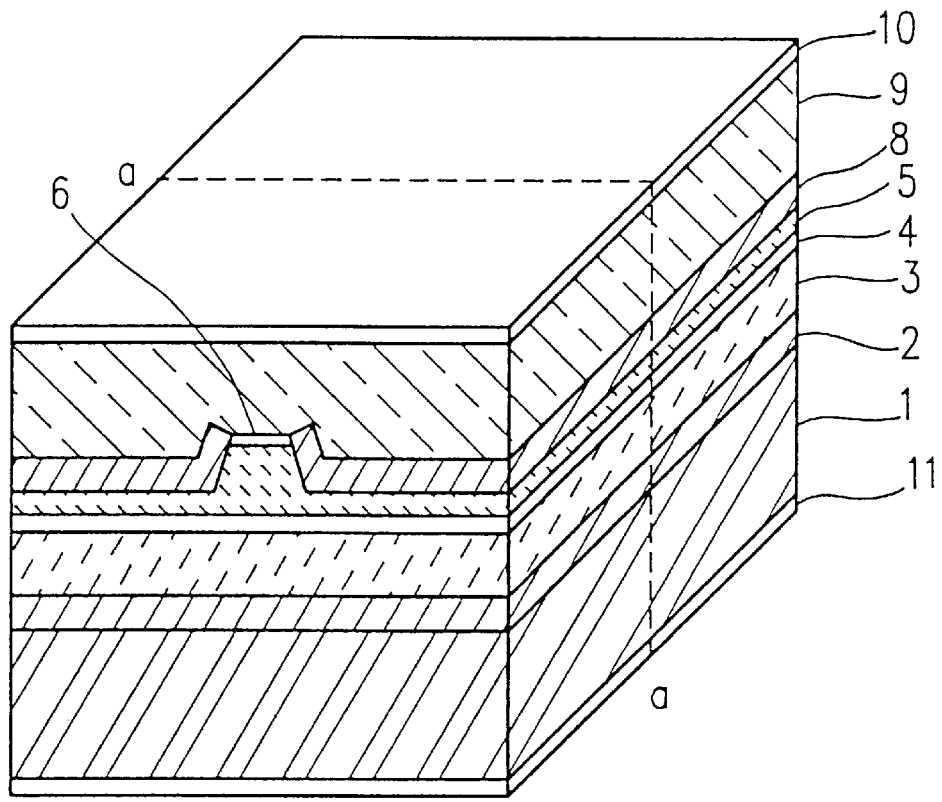
FIG. 20 is a perspective view showing a lateral mode-controlled type red-light semiconductor laser according to an example of the present invention.

FIG. 20 shows a semiconductor laser according to the present invention. This semiconductor laser is a lateral mode-controlled type red-light semiconductor laser.

As shown in FIG. 20, the semiconductor laser according to the present example has a doubleheterostructure in which a $Ga_{0.5}In_{0.5}P$ active layer 4 (thickness: 600 Å) is interposed between an n-$(Al_{0.6}Ga_{0.4})_{0.5}In_{0.5}P$ cladding layer 3 and a p-$(Al_{0.6}Ga_{0.4})_{0.5}In_{0.5}P$ cladding layer 5. These layers 3 to 5 are grown on an n-GaAs buffer layer 2, which in turn is grown on an n-GaAs substrate 1. Upon the p-$(Al_{0.6}Ga_{0.4})_{0.5}In_{0.5}P$ cladding layer 5, a p-$Ga_{0.5}In_{0.5}P$ layer 6 (thickness: 0.1 μm) is formed. The p-$Ga_{0.5}In_{0.5}P$ layer 6 and a portion of the p-$(Al_{0.6}Ga_{0.4})_{0.5}In_{0.5}P$ cladding layer 5 are formed into a stripe-shaped ridge having a trapezoidal cross section. The p-$(Al_{0.6}Ga_{0.4})_{0.5}In_{0.5}P$ cladding layer 5 has a thickness of 1 μm at the stripe-shaped ridge, and a thickness of 0.25 μm at portions excluding the stripe-shaped ridge. Upon the portions of the p-$(Al_{0.6}Ga_{0.4})_{0.5}In_{0.5}P$ cladding layer 5 excluding the stripe-shaped ridge, an n-GaAs current confining layer 8 is formed. Furthermore, upon the p-$Ga_{0.5}In_{0.5}P$ layer 6 and the n-GaAs current confining layer 8, a p-GaAs contact layer 9 is formed. A p-side electrode 10 is formed on the p-GaAs contact layer 9. An n-side electrode 11 is formed on the bottom face of the n-GaAs substrate 1.

The n-GaAs current confining layer 8 functions to control the lateral mode of the semiconductor laser as well as control a current to be injected into a predetermined region of the active layer 4. The energy band gap of the n-GaAs current confining layer 8 is smaller than that of the active layer 4, so that a portion of light generated by the recombination of carriers is absorbed by the n-GaAs current confining layer 8. By prescribing the width of the stripe-shaped ridge to be about 5 μm, a large amount of lateral mode light of higher orders than the first order can be absorbed on both sides of the stripe-shaped ridge, thereby increasing the propagation loss. Thus, oscillation in a single lateral mode can be realized.

According to the present invention, the n-GaAs current confining layer 8 is provided on the p-$(Al_{0.6}Ga_{0.4})_{0.5}In_{0.5}P$ cladding layer 5 side of the active layer 4. If the n-GaAs current confining layer 8 was provided on the n-$(Al_{0.6}Ga_{0.4})_{0.5}In_{0.5}P$ cladding layer 3 side of the active layer 4, electrons, which are the majority carriers in the n-$(Al_{0.6}Ga_{0.4})_{0.5}In_{0.5}P$ cladding layer 3, have such a high mobility that those electrons which have passed through the n-GaAs current confining layer 8 would easily spread along the horizontal direction. Thus, the advantage of current confinement would be reduced, resulting in problems such as an increased driving current and a reduced lateral mode stability.

According to the present invention, in all regions within the cavity, the n-GaAs current confining layer 8 is provided above the thin portions, i.e. portions excluding the stripe-shaped ridge, of the p-$(Al_{0.6}Ga_{0.4})_{0.5}In_{0.5}P$ cladding layer 5. If the n-GaAs current confining layer 8 was provided with a hetero junction interposed between the n-GaAs current confining layer 8 and the p-$(Al_{0.6}Ga_{0.4})_{0.5}In_{0.5}P$ cladding layer 5, e.g. in cases where the n-GaAs current confining layer 8 was provided on the p-$Ga_{0.5}In_{0.5}P$ layer 6, the heterojunction present between the p-$(Al_{0.6}Ga_{0.4})_{0.5}In_{0.5}P$ cladding layer and the p-$Ga_{0.5}In_{0.5}P$ layer 6 is so large that holes injected from the p-side electrode 10 would spread in an excessively broad area along the horizontal direction. As a result, the driving current might increase, and the area for the injected holes to spread might fluctuate depending on changes in the thermal circumstances. The injected holes might, for example, spread about 50 μm along a direction perpendicular to the stripe-shaped ridge, i.e. along the horizontal direction, resulting in an increased driving current and undermining the practicality of the semiconductor laser, the area for the current to spread possibly fluctuating depending on the temperature.

Figure 21:
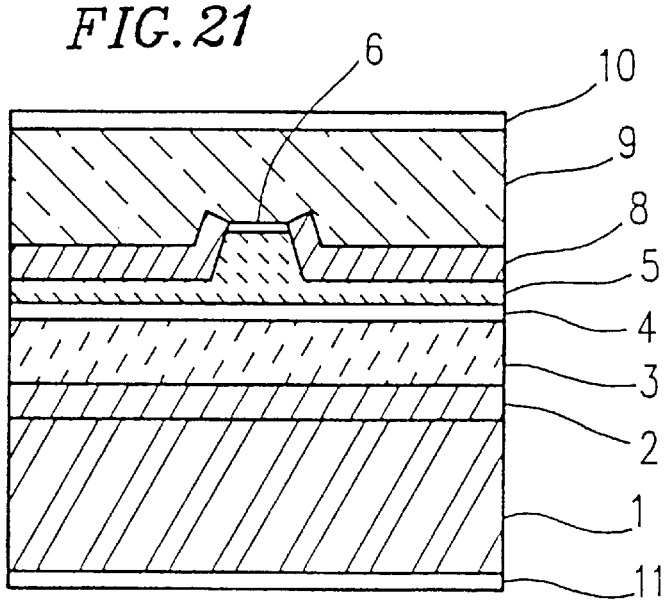
FIG. 21 is a cross-sectional view showing a semiconductor laser according to an example of the present invention taken in a region not in the vicinity of the end faces of a cavity thereof.

FIG. 21 shows a cross section of the semiconductor laser shown in FIG. 20 taken along the line a—a. The width of the stripe-shaped ridge is about 5 μm in the vicinity of end faces of the cavity, and is about 16 μm in regions excluding the end faces of the cavity. The width of the stripe-shaped ridge, in the vicinity of the end faces of the cavity, is prescribed to be such a value that the fundamental lateral mode and lateral modes of higher orders have a large difference in gain, so that laser oscillation in a single lateral mode is realized. The thickness of portions of the p-$(Al_{0.6}Ga_{0.4})_{0.5}In_{0.5}P$ cladding layer 5 excluding the stripe-shaped ridge (i.e. the portions located below the n-GaAs current confining layer 8) is made uniform along the cavity length direction. Although the stripe-shaped ridge has a trapezoidal cross section in the present example, it may alternatively have a rectangular cross section.

A semiconductor laser according to the present invention is such that the width of the stripe-shaped ridge thereof is substantially equal to the width of the n-GaAs current confining layer 8, i.e. a width through which a current is to be injected. If the width of the stripe-shaped ridge has a very large difference from the width through which a current is to be injected, carriers may be injected with fluctuation, since carriers have different mobilities depending on the thermal circumstances. This would make the characteristics of the semiconductor laser, and in particular the driving current, unstable against temperature changes.

Figure 22:
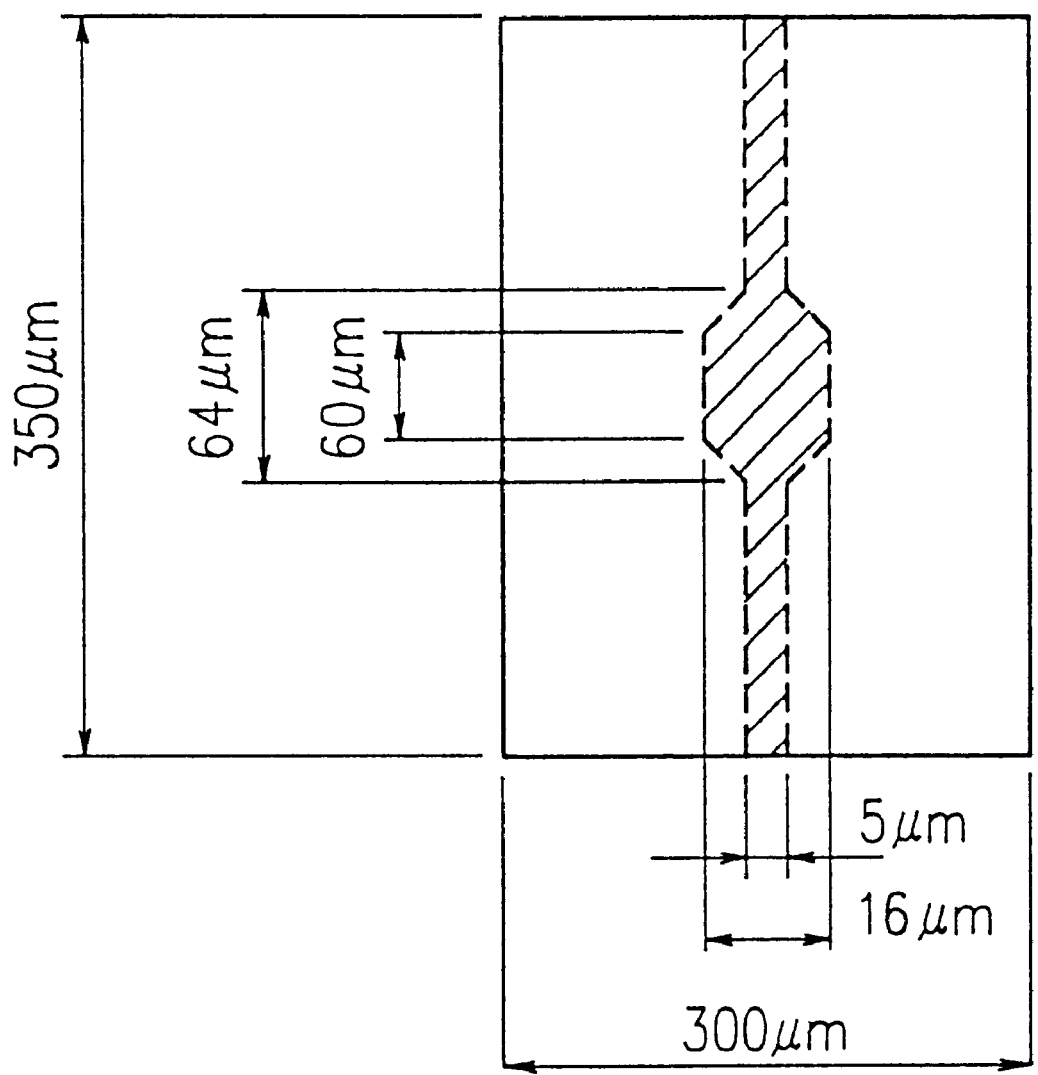
FIG. 22 is a plan view showing a semiconductor laser according to an example of the present invention.

FIG. 22 is a plan view showing the semiconductor laser shown in FIG. 20. In FIG. 22, the stripe-shaped ridge is indicated with hatching lines for clarity as to the varying width thereof. This semiconductor laser has a cavity length of 350 μm and a width of 300 μm. The region in which the width of the stripe-shaped ridge is relatively large (hereinafter referred to as "large-width region") extends for a length of 60 μm. The regions in which the width of the stripe-shaped ridge gradually varies from a relatively small value to the relatively large value (or vice versa) extend for a total of about 4 μm. By incorporating such regions in which the width of the stripe-shaped ridge gradually varies between regions in the vicinity of the cavity end faces (hereinafter referred to as "small-width region") and the large-width region, it becomes possible to fabricate the semiconductor laser without allowing crystal defects to occur in a region between the small-width region near the cavity end faces and the large-width region in a central portion of the semiconductor laser, so that a highly reliable semiconductor laser can be provided.

Figure 23:
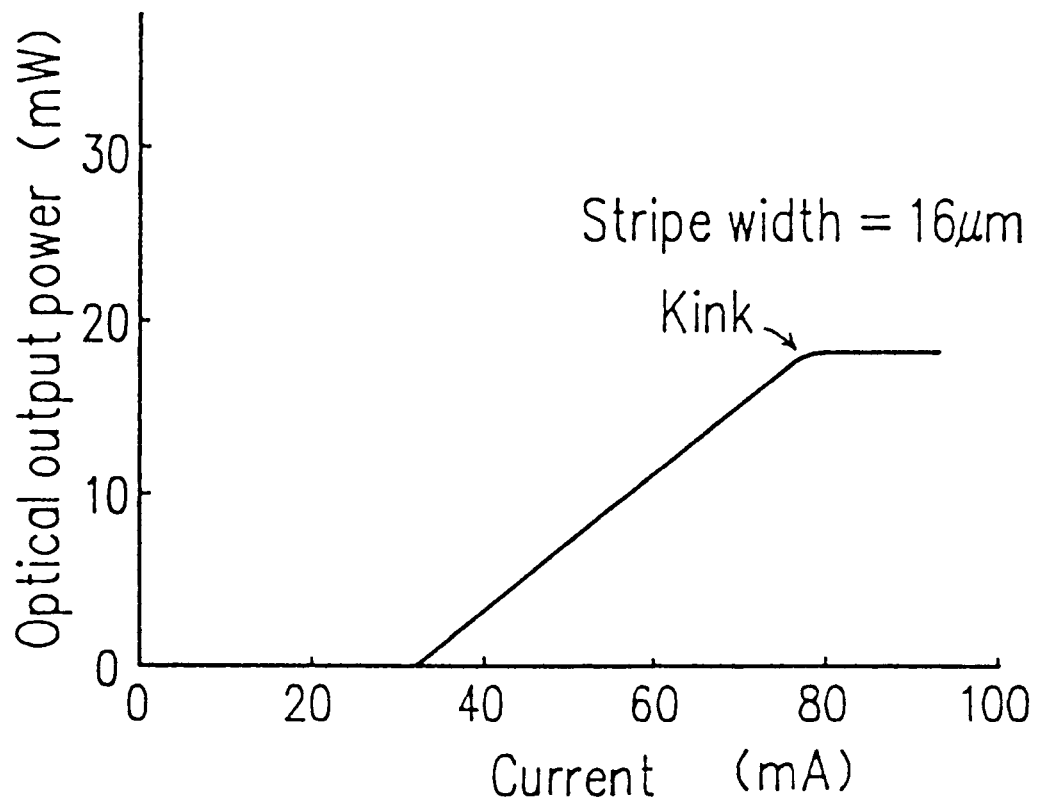
FIG. 23 is a graph showing relationship between the optical output power and the driving current of a semiconductor laser according to an example of the present invention.

FIG. 23 shows relationship between the optical output power and the driving current of a semiconductor laser according to the present invention. As seen from FIG. 23, the semiconductor laser has a threshold current of 37 mA. A single lateral mode oscillation is obtained until the optical output power reaches 16 mW, where a kink occurs. Since optical output power on the order of 5 mW is utilized for a reproduction-only optical disk, the semiconductor laser according to the present invention provides a sufficient optical output power.

A multitude of longitudinal modes are realized in the above-mentioned large-width region of the stripe-shaped ridge, resulting in a multi-mode oscillation of the semiconductor laser. As a result of the multi-mode oscillation, the semiconductor laser achieves excellent noise characteristics. For example, a RIN of −133 dB/Hz was obtained under the conditions that the temperature was at 25° C.; the optical output power was 3 mW; and the amount of the returned light was 0.1%.

Figure 24:
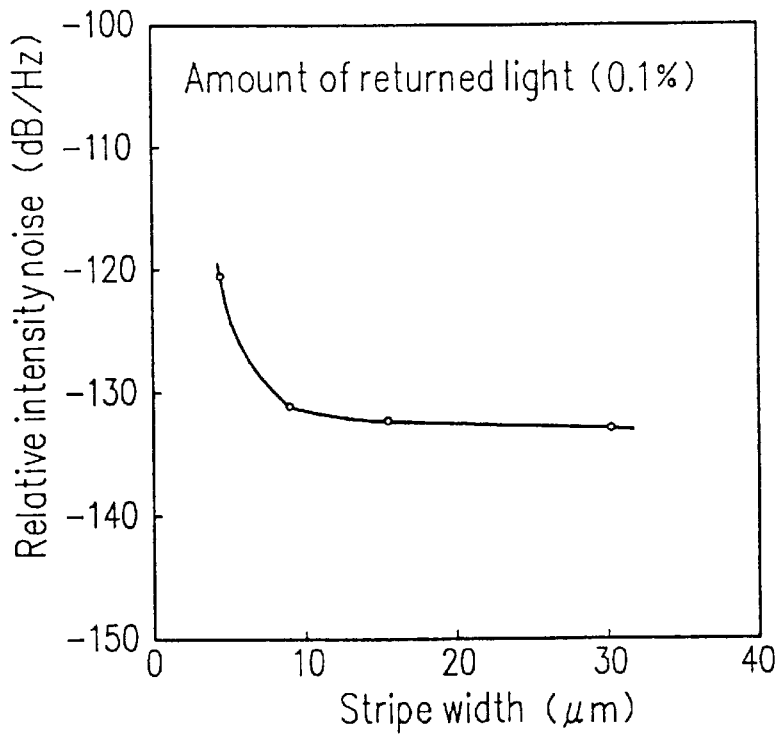
FIG. 24 is a graph for describing an effect of the semiconductor laser according to the present invention, which shows relationship between RIN (Relative Intensity Noise) and the width of a stripe-shaped ridge in portions excluding the end faces of a cavity.

FIG. 24 shows the stripe width dependence of the RIN, where the stripe width in the central portion of the semiconductor laser, i.e. regions excluding the cavity end faces, is varied. A point on the curve shown in FIG. 24 at which the stripe width is 5 μm denotes a case where no large-width region exists, that is, the stripe width is uniform along the cavity length direction. As seen from FIG. 24, the RIN has a tendency to decrease as the stripe width increases. For example, a RIN of −120 dB/Hz is obtained when the stripe width is 5 μm, while a RIN of −130 dB/Hz is obtained when the stripe width is about 7 μm or more. This is because the difference in the threshold gains between the fundamental lateral mode and the higher order lateral modes decreases as the stripe width exceeds 7 μm, thereby resulting in a multitude of longitudinal modes. All the semiconductor lasers used for this measurement showed a RIN of −130 dB/Hz or less when the stripe width was 7 μm or more.

Figure 25:
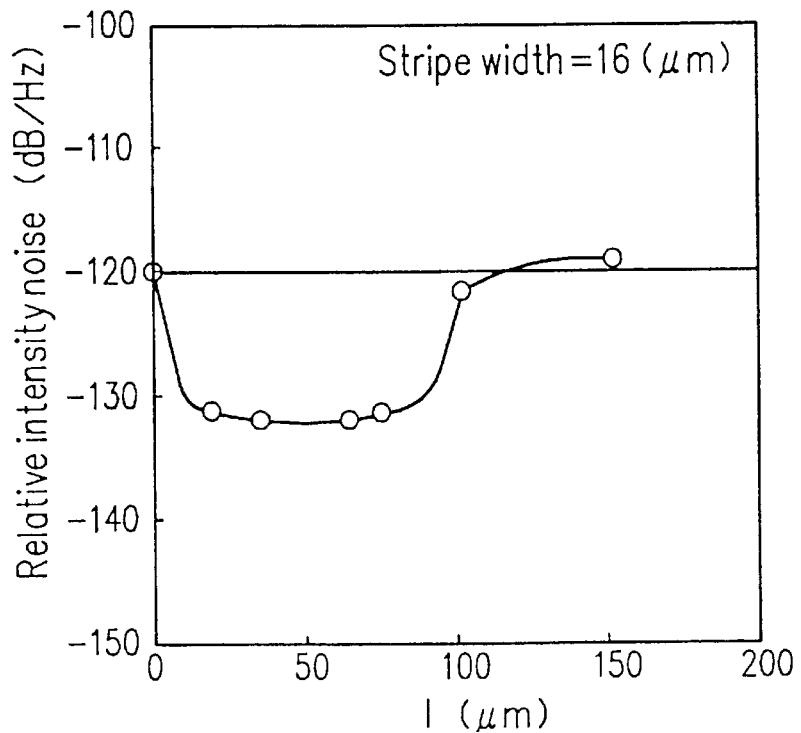
FIG. 25 is a graph for describing an effect of the semiconductor laser according to the present invention, which shows relationship between RIN (Relative Intensity Noise) and the length of a portion of a stripe-shaped ridge excluding the end faces of a cavity.

FIG. 25 shows relationship between the length l of the large-width region of the stripe-shaped ridge and the RIN. The width of the stripe-shaped ridge is 16 μm in the large-width region. A point on the curve shown in FIG. 25 at which the length l is zero denotes a case where no large-width region exists, that is, the stripe width is uniform along the cavity length direction. As seen from FIG. 25, the RIN decreases to a minimum of −130 dB/Hz as the length l exceeds about 20 μm, starts increasing as the length l exceeds about 90 μm, and remains in the vicinity of −120 dB/Hz when the length l is 100 μm or more. As will be appreciated, the length l of the large-width region of the stripe-shaped ridge should be in the range of 20 μm to 100 μm in order to obtain good noise characteristics. Since the length l depends on the cavity length L, the relationship $l/L \leq 0.3$ should be satisfied in order to obtain good noise characteristics.

As described above, a semiconductor laser having a low RIN can be obtained by achieving a multitude of longitudinal modes.

EXAMPLE 4

A semiconductor laser according to the present invention will be described with reference to FIG. 26.

Figure 26:
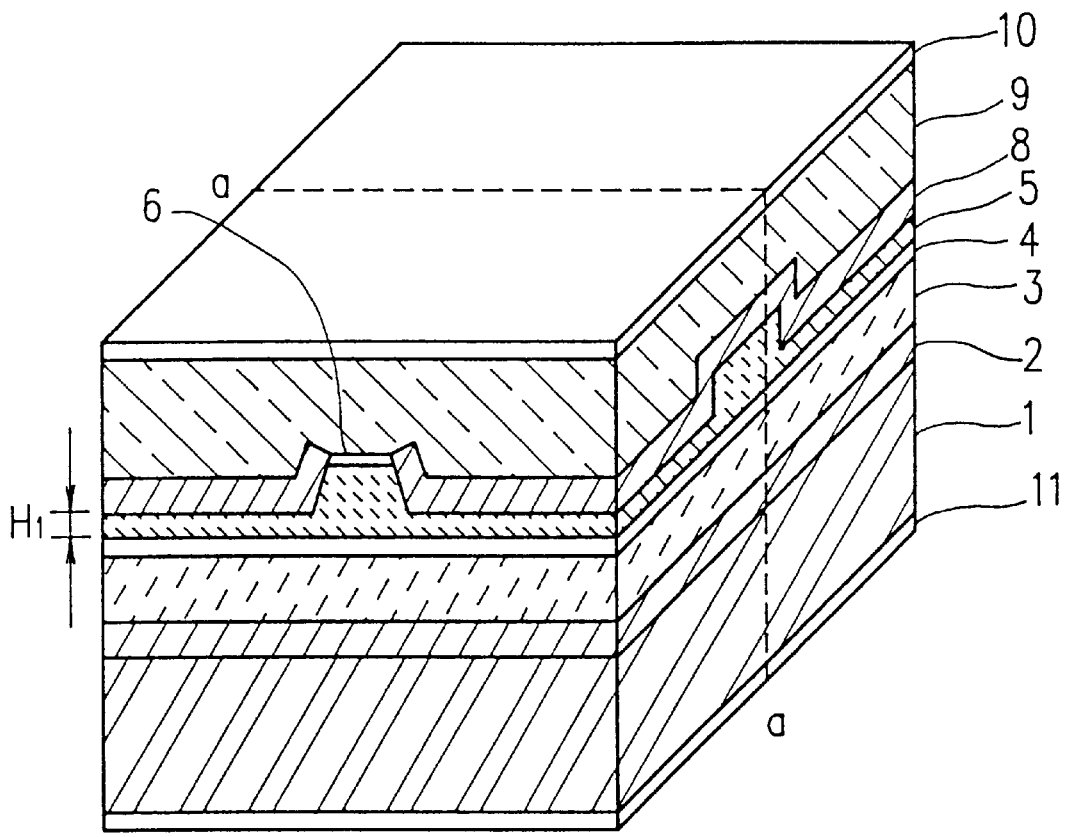
FIG. 26 is a perspective view showing a lateral mode-controlled type red-light semiconductor laser according to an example of the present invention.

As shown in FIG. 26, the semiconductor laser according to the present example has a doubleheterostructure in which a $Ga_{0.5}In_{0.5}P$ active layer 4 (thickness: 600 Å) is interposed between an n-$(Al_{0.6}Ga_{0.4})_{0.5}In_{0.5}P$ cladding layer 3 and a p-$(Al_{0.6}Ga_{0.4})_{0.5}In_{0.5}P$ cladding layer 5. These layers 3 to 5 are grown an an n-GaAs buffer layer 2, which in turn is grown on an n-GaAs substrate 1. Upon the p-$(Al_{0.6}Ga_{0.4})_{0.5}In_{0.5}P$ cladding layer 5, a p-$Ga_{0.5}In_{0.5}P$ layer 6 (thickness: 0.1 μm) is formed. The p-$Ga_{0.5}In_{0.5}P$ layer 6 and a portion of the p-$(Al_{0.6}Ga_{0.4})_{0.5}In_{0.5}P$ cladding layer 5 are formed into a stripe-shaped ridge having a trapezoidal cross section. The p-$(Al_{0.6}Ga_{0.4})_{0.5}In_{0.5}P$ cladding layer 5 has a thickness of 1 μm at the stripe-shaped ridge. In portions excluding the stripe-shaped ridge, the p-$(Al_{0.6}Ga_{0.4})_{0.5}In_{0.5}P$ cladding layer 5 has a thickness of 0.25 μm (indicated as H1 in FIG. 26) in the vicinity of end faces of the cavity, and 0.45 μm (indicated as H2 in FIG. 27) in portions excluding the cavity end faces. Upon the portions of the p-$(Al_{0.6}Ga_{0.4})_{0.5}In_{0.5}P$ cladding layer 5 excluding the stripe-shaped ridge, an n-GaAs current confining layer 8 is formed. Furthermore, upon the p-$Ga_{0.5}In_{0.5}P$ layer 6 and the n-GaAs current confining layer 8, a p-GaAs contact layer 9 is formed. A p-side electrode 10 is formed on the p-GaAs contact layer 9. An n-side electrode 11 is formed on the bottom face of the n-GaAs substrate 1.

Although the stripe-shaped ridge has a trapezoidal cross section in the present example, it may alternatively have a rectangular cross section.

The n-GaAs current confining layer 8 functions to control the lateral mode of the semiconductor laser as well as control a current to be injected into the predetermined region of the active layer 4.

According to the present invention, the n-GaAs current confining layer 8 is provided on the p-$(Al_{0.6}Ga_{0.4})_{0.5}In_{0.5}P$ cladding layer 5 side of the active layer 4. If the n-GaAs current confining layer 8 was provided on the n-$(Al_{0.6}Ga_{0.4})_{0.5}In_{0.5}P$ cladding layer 3 side of the active layer 4, electrons, which are the majority carriers in the n-$(Al_{0.6}Ga_{0.4})_{0.5}In_{0.5}P$ cladding layer 3, have such a high mobility that those electrons which have passed through the n-GaAs current confining layer 8 would easily spread along the horizontal direction. Thus, the advantage of current confinement would be reduced, resulting in problems such as an increased driving current and a reduced lateral mode stability.

According to the present invention, in all regions within the cavity, the n-GaAs current confining layer 8 is provided above the thin portions, i.e. portions excluding the stripe-shaped ridge, of the p-$(Al_{0.6}Ga_{0.4})_{0.5}In_{0.5}P$ cladding layer 5. If the n-GaAs current confining layer 8 was provided with a hetero junction interposed between the n-GaAs current confining layer 8 and the p-$(Al_{0.6}Ga_{0.4})_{0.5}In_{0.5}P$ cladding layer 5, e.g. in cases where the n-GaAs current confining layer 8 was provided on the p-$Ga_{0.5}In_{0.5}P$ layer 6, the heterojunction present between the p-$(Al_{0.6}Ga_{0.4})_{0.5}In_{0.5}P$ cladding layer 5 and the p-$Ga_{0.5}In_{0.5}P$ layer 6 is so large that holes injected from the p-side electrode 10 would spread in an excessively broad area along the horizontal direction. As a result, the driving current may increase, and the area for the injected holes to spread may fluctuate depending on changes in the thermal circumstances. The injected holes may, for example, spread about 50 μm along a direction perpendicular to the stripe-shaped ridge, i.e. along the horizontal direction, resulting in an increased driving current and undermining the practicality of the semiconductor laser, the area for the current to spread possibly fluctuating depending on the temperature.

Figure 27:
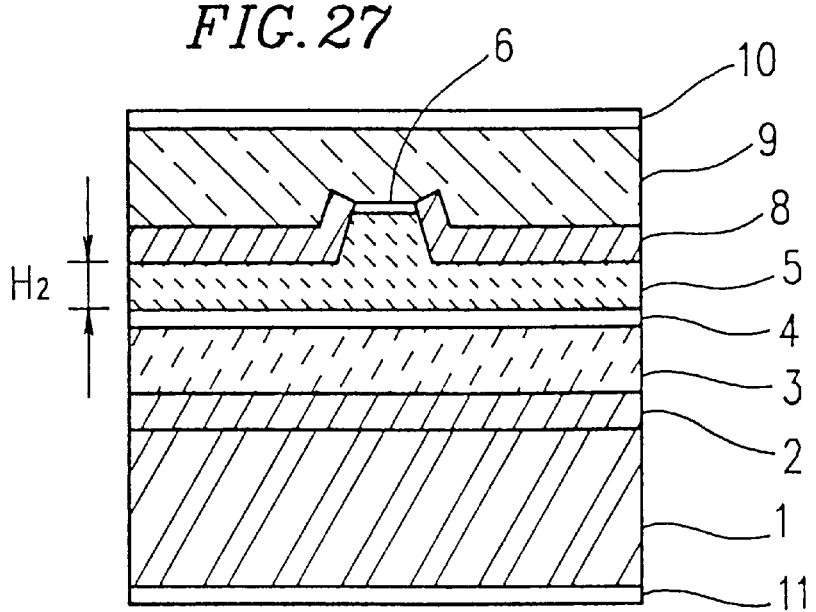
FIG. 27 is a cross-sectional view showing a semiconductor laser according to an example of the present invention taken in a region not in the vicinity of the end faces of a cavity thereof.

FIG. 27 shows a cross section of the semiconductor laser shown in FIG. 26 taken along the line a—a. The thicknesses H1 and H2 of p-$(Al_{0.6}Ga_{0.4})_{0.5}In_{0.5}P$ cladding layer 5 satisfy the relationship H1<H2. The effective refractive index taken outside the stripe-shaped ridge is 3.303 in the vicinity of the cavity end faces, and 3.309 in portions excluding the cavity end faces, e.g. at the a—a cross section. In other words, the effective reactive index taken outside the stripe-shaped ridge is smaller in the vicinity of the cavity end faces than in the other portions. The effective refractive index taken inside the stripe-shaped ridge is 3.313. Thus, the difference between the respective effective refractive indices taken inside and outside the stripe-shaped ridge is reduced at the a—a cross section. As a result, the difference in the threshold gains between the fundamental lateral mode and the higher order lateral modes is reduced, so that a multitude of longitudinal modes are obtained.

A semiconductor laser according to the present invention is such that the width of the stripe-shaped ridge thereof is substantially equal to the width of the n-GaAs current confining layer 8, i.e. a width through which a current is to be injected. Specifically, the width of the stripe-shaped ridge or the width through which a current is to be injected is uniformly 5 μm along the cavity length direction. By providing a distribution of thicknesses for the portions of the p-$(Al_{0.6}Ga_{0.4})_{0.5}In_{0.5}P$ cladding layer 5 excluding the stripe-shaped ridge as in the present example, it becomes possible to obtain desired noise characteristics. As will be appreciated, the RIN can similarly be reduced by providing a distribution of widths for the stripe-shaped ridge as in Example 3 as well as providing such a distribution of thicknesses for the p-$(Al_{0.6}Ga_{0.4})_{0.5}In_{0.5}P$ cladding layer 5. However, since increasing the width of the stripe-shaped ridge also results in increasing the driving current for the semiconductor laser, it is preferable to make the width of the stripe-shaped ridge uniform along the cavity length direction.

Figure 28:
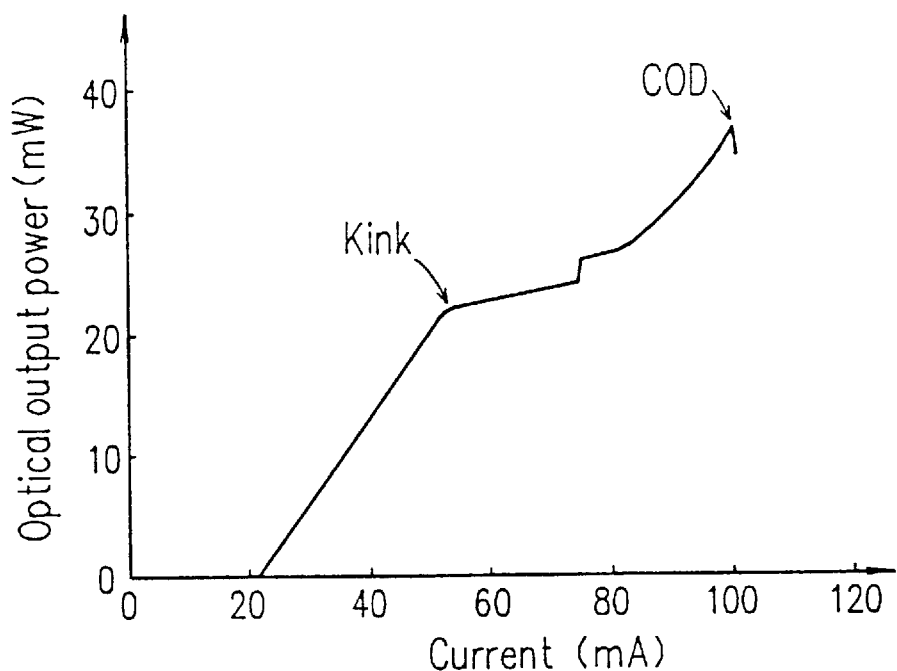
FIG. 28 is a graph showing relationship between the optical output power and the driving current of a semiconductor laser according to an example of the present invention.

FIG. 28 shows relationship between the optical output power and the driving current of a semiconductor laser according to the present invention. As seen from FIG. 23, the semiconductor laser has a threshold current of 22 mA. A single lateral mode oscillation is obtained until the optical output power reaches 22 mW, where a kink occurs. Since optical output power on the order of 5 mW is utilized for a reproduction-only optical disk, the semiconductor laser according to the present invention provides a sufficient optical output power.

In a region of the p-$(Al_{0.6}Ga_{0.4})_{0.5}In_{0.5}P$ cladding layer 5 excluding the stripe-shaped ridge where the p-$(Al_{0.6}Ga_{0.4})_{0.5}In_{0.5}P$ cladding layer 5 has the relatively large thickness of H2 (hereinafter, this region will be referred to as "large-thickness region"), the difference between the respective effective refractive indices inside and outside the stripe-shaped ridge is reduced, so that a multitude of lateral modes are obtained, whereby a multitude of longitudinal modes are obtained. As a result of the multi-mode oscillation, the semiconductor laser achieves excellent noise characteristics. For example, a RIN of −132 dB/Hz was obtained under the conditions that the temperature was at 25° C.; the optical output power was 4 mW; and the amount of the returned light was 0.1%.

Figure 29:
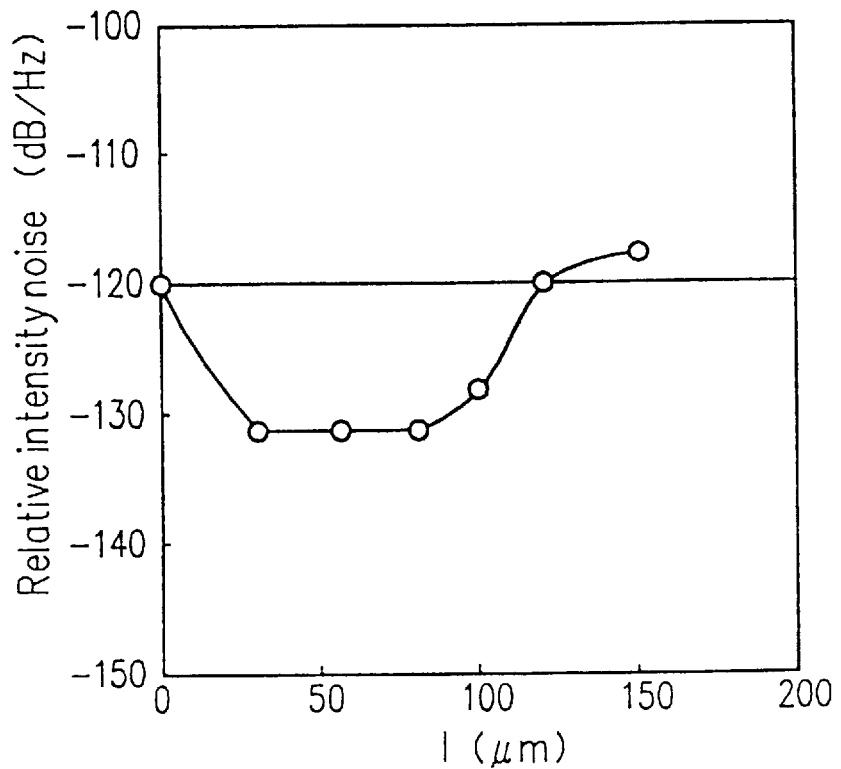
FIG. 29 is a graph for describing an effect of the semiconductor laser according to the present invention, which shows relationship between RIN (Relative Intensity Noise) and the length of a portion of a stripe-shaped ridge excluding the end faces of a cavity.

FIG. 29 shows relationship between a length l of the large-thickness region of the p-$(Al_{0.6}Ga_{0.4})_{0.5}In_{0.5}P$ cladding layer 5 (i.e. the portions thereof excluding the regions in the vicinity of the cavity end faces) and the RIN. A point on the curve shown in FIG. 29 at which the length l is zero denotes a case where no large-thickness region exists, that is, the p-$(Al_{0.6}Ga_{0.4})_{0.5}In_{0.5}P$ cladding layer 5 has a uniform thickness along the cavity length direction. As seen from FIG. 29, the RIN decreases to a minimum of −130 dB/Hz as the length l exceeds about 20 $\mu$m, starts increasing as the length l exceeds about 100 $\mu$m, and remains in the vicinity of −120 dB/Hz when the length l is 125 $\mu$m or more. As will be appreciated, the length l of the large-thickness region of the p-$(Al_{0.6}Ga_{0.4})_{0.5}In_{0.5}P$ cladding layer 5 should be in the range of 20 $\mu$m to 100 $\mu$m in order to obtain good noise characteristics. Since the length l depends on the cavity length L, the relationship $l/L \leq 0.3$ should be satisfied in order to obtain good noise characteristics.

As described above, a semiconductor laser having a low RIN can be obtained by achieving a multitude of longitudinal modes.

Next, a method for producing the semiconductor laser according to the present example will be described with reference to FIGS. 30 to 36.

Figure 30:
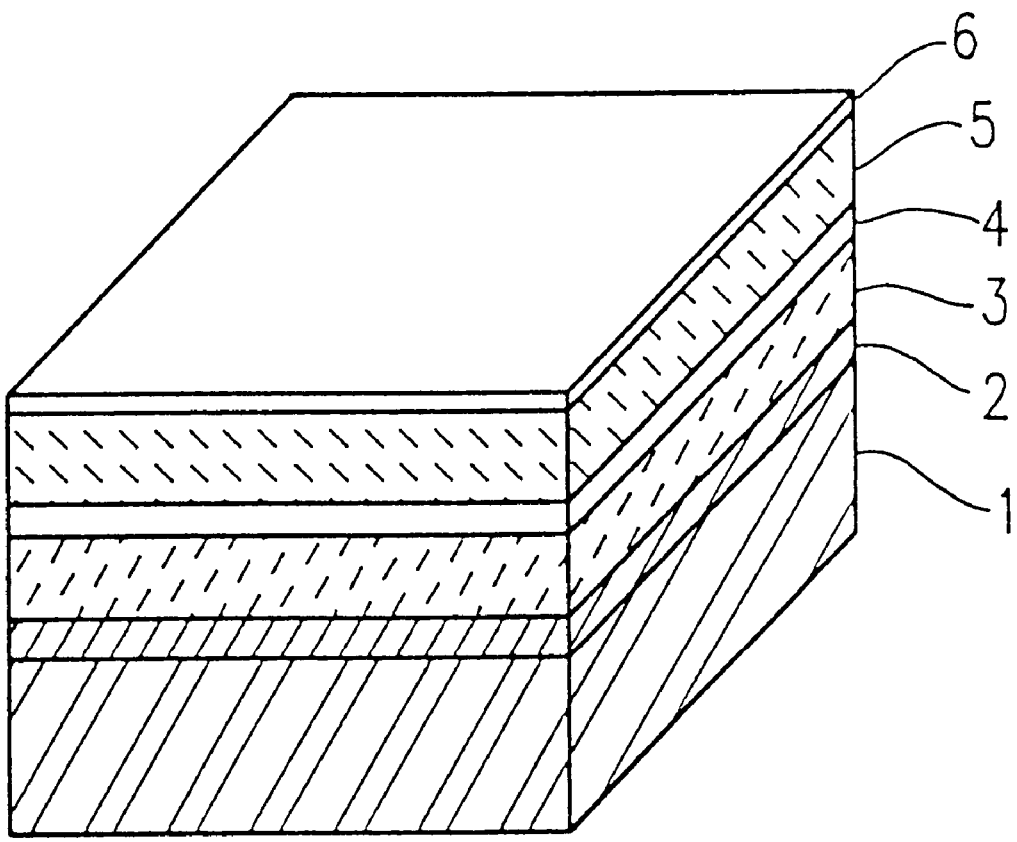
FIG. 30 is a first one of consecutive perspective views showing a semiconductor laser according to the present invention during the fabrication thereof.
Figure 31:
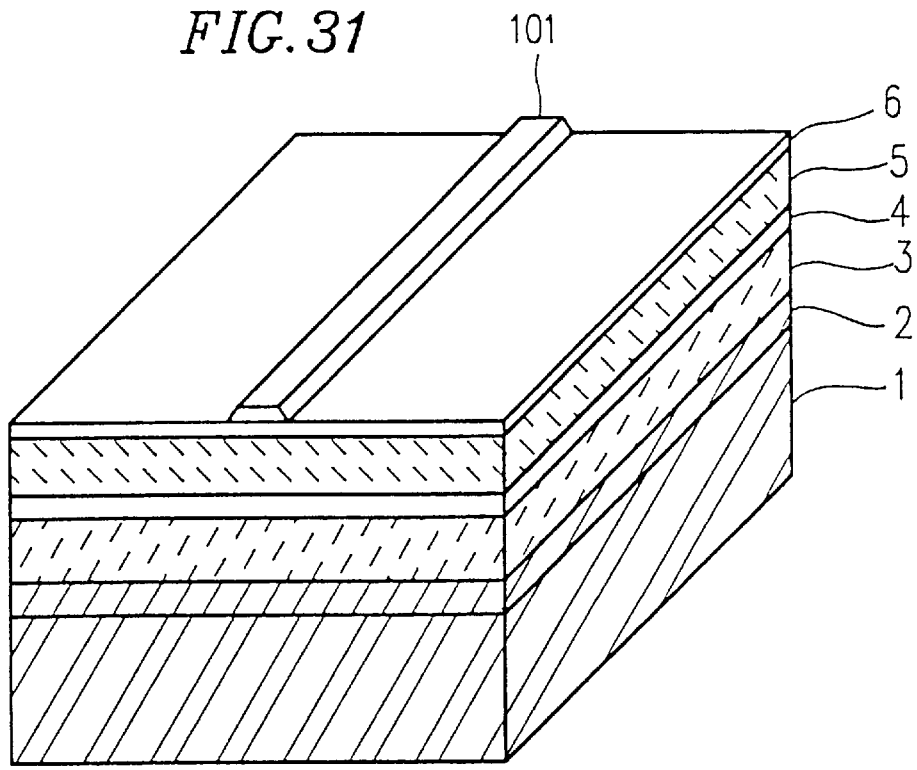
FIG. 31 is a second one of consecutive perspective views showing a semiconductor laser according to the present invention during the fabrication thereof.
Figure 32:
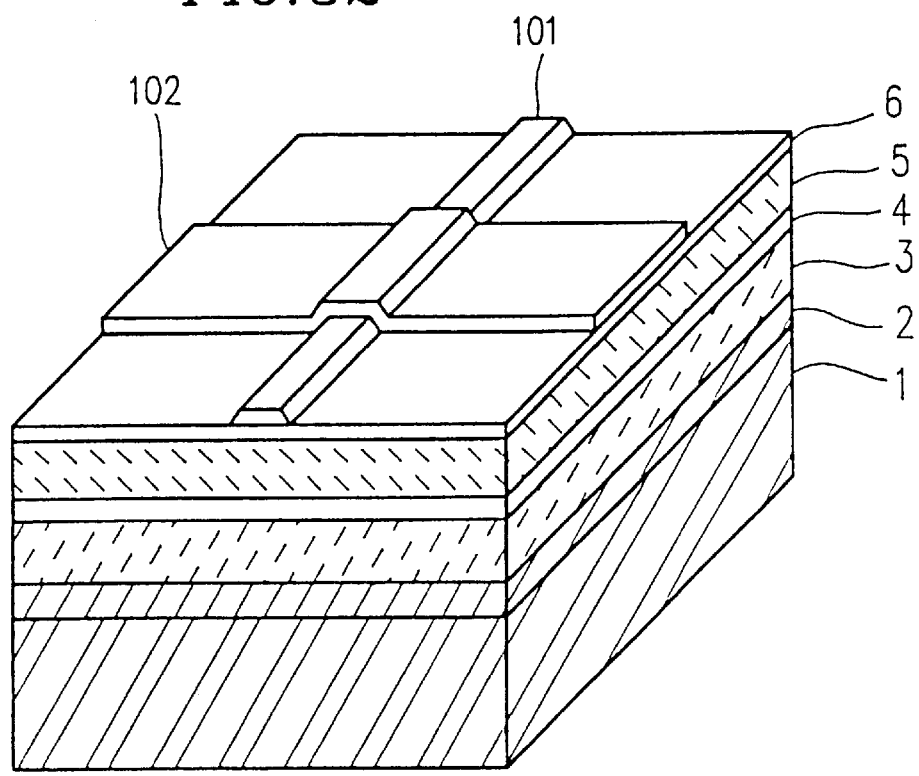
FIG. 32 is a third one of consecutive perspective views showing a semiconductor laser according to the present invention during the fabrication thereof.
Figure 33:
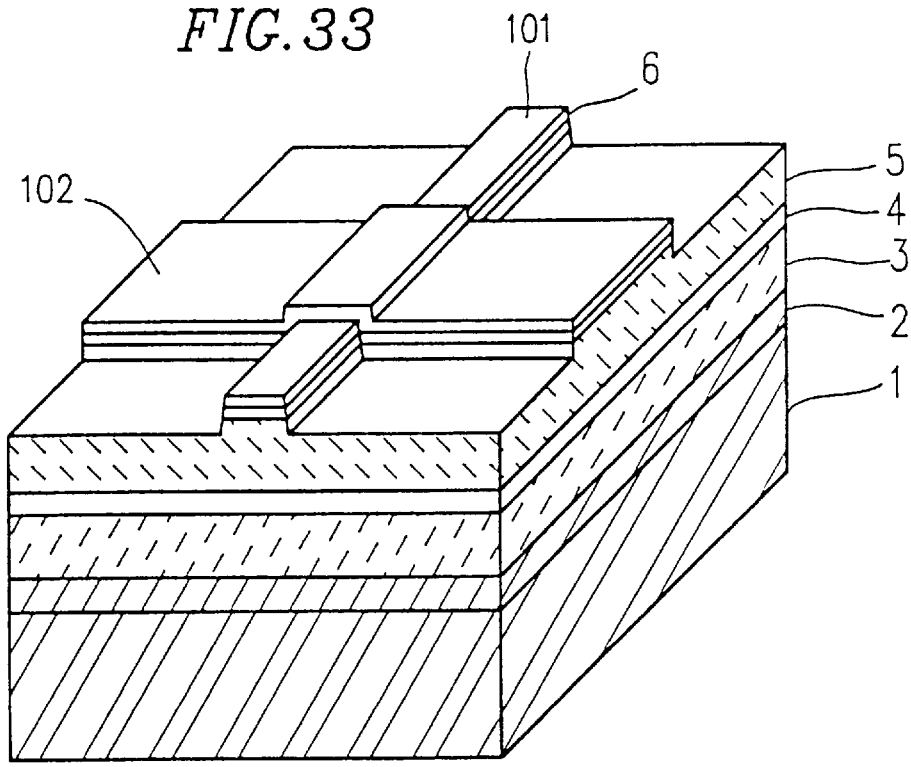
FIG. 33 is a fourth one of consecutive perspective views showing a semiconductor laser according to the present invention during the fabrication thereof.

First, by a crystal growing method such as MOVPE, the n-GaAs buffer layer 2, the n-$(Al_{0.6}Ga_{0.4})_{0.5}In_{0.5}P$ cladding layer 3, the $Ga_{0.5}In_{0.5}P$ active layer 4, the p-$(Al_{0.6}Ga_{0.4})_{0.5}In_{0.5}P$ cladding layer 5, and the p-$Ga_{0.5}In_{0.5}P$ layer 6 are epitaxially grown upon the n-GaAs substrate 1 in this order (FIG. 30). Then, $SiO_2$ 101 is deposited on the p-$Ga_{0.5}In_{0.5}P$ layer 6 by a thermal CVD method, and is processed into a stripe shape by photolithography and etching. The width of the $SiO_2$ is about 5 $\mu$m. Thereafter, $Si_3N_4$ 102 is deposited on the $SiO_2$ 101 by a plasma CVD method and is processed into a stripe-like shape extending perpendicular to a direction in which the stripe-shaped $SiO_2$ 101 extends (FIG. 32). The width of the $Si_3N_4$ 102 is 75 $\mu$m. Then, by using the $SiO_2$ 101 and the $Si_3N_4$ 102 as etching masks, the p-$Ga_{0.5}In_{0.5}P$ layer 6 and a portion of the p-$(Al_{0.6}Ga_{0.4})_{0.5}In_{0.5}P$ cladding layer 5 are etched (FIG. 33). At this point, the p-$(Al_{0.6}Ga_{0.4})_{0.5}In_{0.5}P$ cladding layer 5 has a stepped portion having a thickness of 0.2 $\mu$m.

Figure 34:
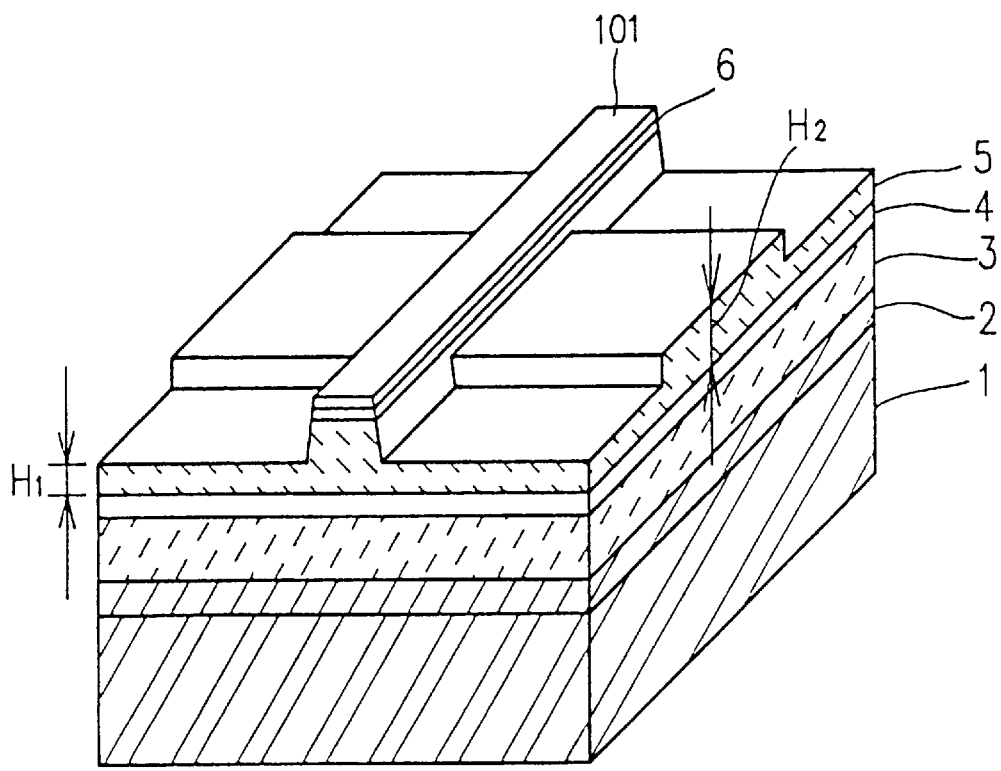
FIG. 34 is a fifth one of consecutive perspective views showing a semiconductor laser according to the present invention during the fabrication thereof.
Figure 35:
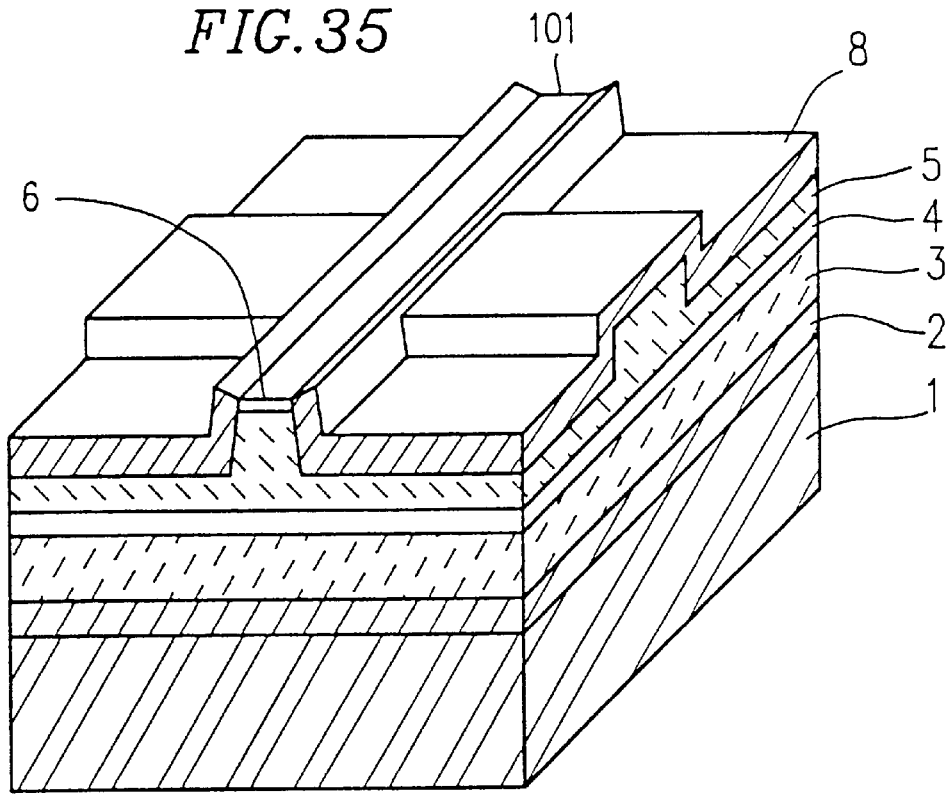
FIG. 35 is a sixth one of consecutive perspective views showing a semiconductor laser according to the present invention during the fabrication thereof.
Figure 36:
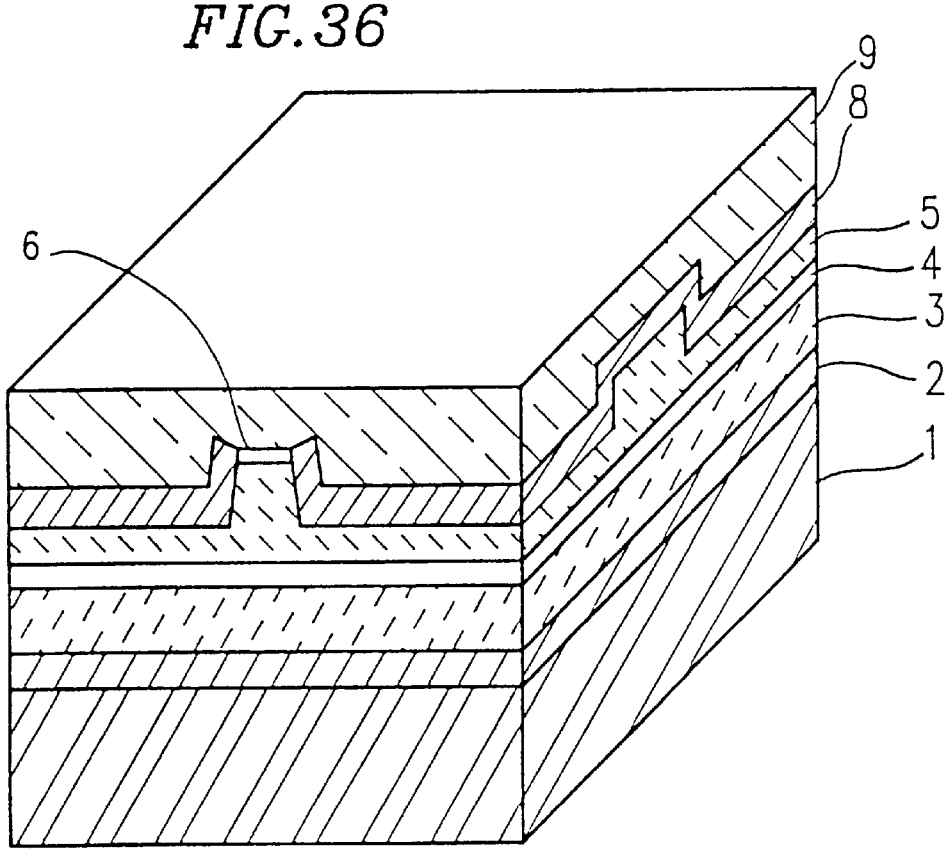
FIG. 36 is a seventh one of consecutive perspective views showing a semiconductor laser according to the present invention during the fabrication thereof.

Thereafter, the $Si_3N_4$ 102 is selectively removed, and the p-$(Al_{0.6}Ga_{0.4})_{0.5}In_{0.5}P$ cladding layer 5 is further etched (FIG. 34). After thus forming the stripe-shaped ridge, the n-GaAs current confining layer 8 is grown on portions of the p-$(Al_{0.6}Ga_{0.4})_{0.5}In_{0.5}P$ cladding layer 5 present on either side of the stripe-shaped ridge by using a selective growth method such as MOVPE, without allowing the n-GaAs current confining layer 8 to grow on the $SiO_2$ 101 (FIG. 35). Thereafter, the $SiO_2$ 101 is removed, and the p-GaAs contact layer 9 is grown (FIG. 36). Finally, Cr/Pt/Au is deposited on the p-GaAs contact layer 9 so as to form the p-side electrode 10 (not shown), and Au/Ge/Ni is deposited on the n-GaAs substrate 1 so as to form the n-side electrode 11 (not shown).

By the above-described method, the lateral mode-controlled type red-light semiconductor laser shown in FIG. 26 can be fabricated.

Although certain materials are prescribed for the layers of the semiconductor laser in the present example, it is also possible to produce with ease a semiconductor laser having low RIN by using $(Al_yGa_{1-y})_{0.5}In_{0.5}P$ for the cladding layers, and $(Al_zGa_{1-z})_{0.5}In_{0.5}P$ (where $0 \leq z \leq y \leq 1$) for the active layer. Although a semiconductor laser incorporating an active layer having a multiple quantum well structure or a strained multiple quantum well structure generally has a tendency to operate in a single longitudinal mode, and therefore is likely to have poor noise characteristics, the present invention can provide a multiple quantum well/strained multiple quantum well semiconductor laser having low RIN.

Although AlGaInP is used for the semiconductor laser according to the present example, other material can be used without undermining the advantages of the present invention. It is possible to produce a semiconductor laser having low RIN which is composed essentially of a II-VI semiconductor material, instead of a III-V semiconductor material, by incorporating at least one current confining layer having an energy band gap larger than that of the active layer and by incorporating a layer having an energy band gap smaller than that of the active layer above the current confining layer.

As described above, in accordance with the semiconductor laser of the present invention, the stripe-shaped ridge has a width (stripe width) sufficient to achieve single lateral mode oscillation in the vicinity of at least one cavity end face, and the stripe width is made large in the portions of the p-$(Al_{0.6}Ga_{0.4})_{0.5}In_{0.5}P$ cladding layer 5 excluding the vicinity of the cavity end faces (i.e. the large-thickness region). As a result, a multitude of longitudinal modes are realized in the large-thickness region of the p-$(Al_{0.6}Ga_{0.4})_{0.5}In_{0.5}P$ cladding layer 5, that the noise is reduced. By prescribing the stripe width in the vicinity of the cavity end faces to be a value in the range of 1 $\mu$m to 7 $\mu$m, in particular, laser oscillation in the fundamental lateral mode can be realized. Moreover, by ensuring that the cavity length L and the length l of a region having a thickness more than 7 $\mu$m (i.e. the large-thickness region) satisfy the relationships $l/L \leq 0.3$, the RIN of the semiconductor laser can be prevented from increasing.

By incorporating a configuration in which the width of the stripe-shaped ridge gradually varies between the regions in the vicinity of the cavity end faces and the large-thickness region in a linear or curving manner, it becomes possible to fabricate the semiconductor laser without allowing crystal defects to occur in a region between the vicinity of the cavity end faces and the large-thickness region, so that a highly reliable semiconductor laser can be provided.

Moreover, by ensuring that the difference between the respective effective refractive indices taken inside and outside the stripe-shaped ridge in the vicinity of at least one cavity end face is smaller as compared with the difference taken in the portions of the p-$(Al_{0.6}Ga_{0.4})_{0.5}In_{0.5}P$ cladding layer 5 excluding the vicinity of the cavity end faces, the light confining effect in the region in which the difference in the effective refractive indices is small can be reduced, so that a multitude of longitudinal modes are realized. As a result, the noise characteristics of the semiconductor laser are improved.

By ensuring that the cavity length L and the length l of the region in which the difference between the respective refractive indices taken inside and outside the stripe-shaped ridge is small satisfy the relationship $l/L \leq 0.3$, the RIN of the semiconductor laser can be prevented from increasing.

EXAMPLE 5

As described in the above examples of the invention, by realizing a multitude of longitudinal modes, changes in the light intensities of the respective modes are averaged out, and the light intensities of the respective modes are made resistant against external disturbance. As a result, stable low noise characteristics can be obtained. However, according to these methods, the laser oscillation efficiency of the semiconductor laser may decrease. In view of this problem, a method for realizing a multitude of longitudinal modes has been proposed in which a high frequency a.c. voltage having a frequency on the order of several hundred MHz (megahertz) is superimposed on a driving voltage for the semiconductor laser. It is known that superimposing a high frequency a.c. voltage on the driving voltage for the semiconductor laser can, as a result of temporal fluctuation of the density of the carriers injected into an active region of the semiconductor laser, increase the width of the frequency band in which relatively high gain values can be obtained, so that multi-mode oscillation is realized. Thus, a single lateral mode semiconductor laser having both high efficiency and improved noise characteristics can be provided.

Figure 44:
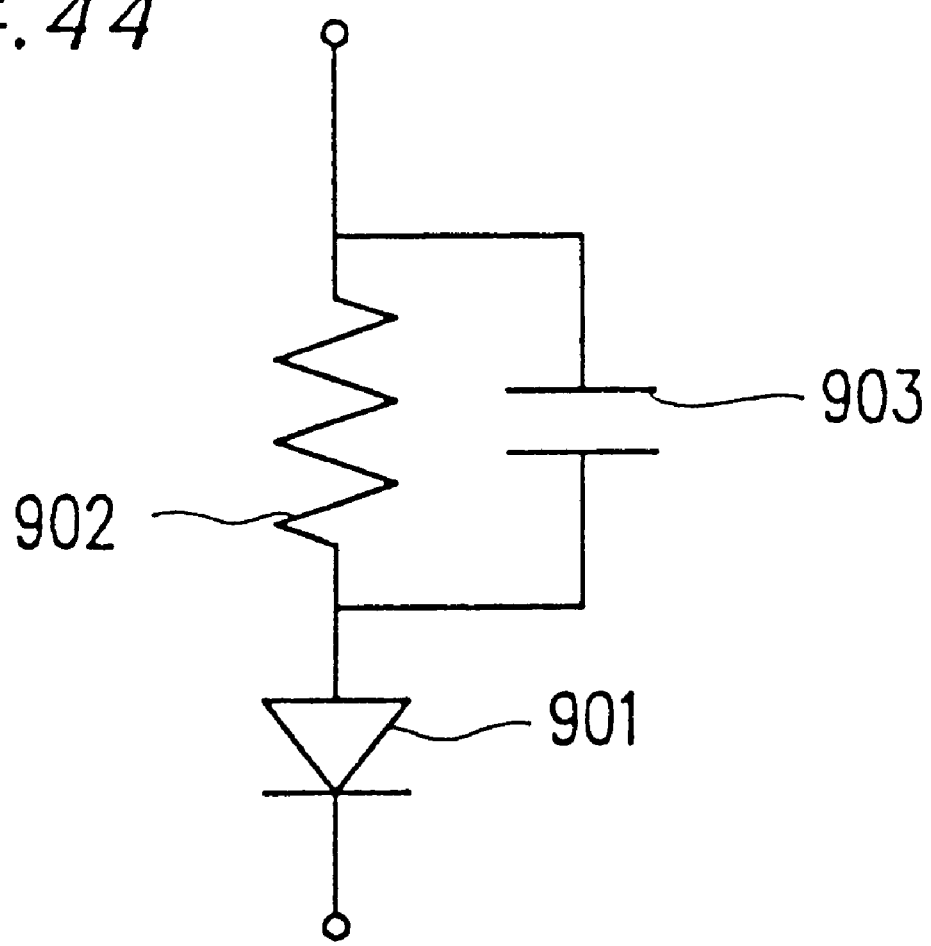
FIG. 44 is a diagram showing an electrically equivalent circuit of a semiconductor laser.

Although it is presumable that the noise characteristics of an AlGaInP type semiconductor laser can be similarly improved by the superimposition of a high frequency a.c. voltage, such an AlGaInP type semiconductor laser is expected to have the following inherent problems: FIG. 44 shows an electrically equivalent circuit of the AlGaInP type semiconductor laser shown in FIG. 16. As shown in FIG. 44, the semiconductor laser includes a parasitic electric resistor (R) 902 connected in series to a parasitic diode 901 constituted by a PN junction. The electric resistor 902 is constituted essentially by a stripe-shaped ridge of a p-AlGaInP cladding layer, which has the highest resistivity and into which a current is to be confined. Moreover, the semiconductor laser includes a parasitic electric capacitor (C) 903 connected in parallel to the electric resistor 902. The electric capacitor 903 emerges due to an n-GaAs current confining layer and a second p-AlGaInP cladding layer being inversely biased during operation of the semiconductor laser. The high frequency characteristics of the semiconductor laser are determined primarily by a product C×R. For example, the resistance R of the electric resistor 902 is about 1 Ω in the case of an AlGaAs type semiconductor laser, and about 10 Ω in the case of an AlGaInP type semiconductor laser, which is a considerably larger value than the former value. This is due to the difficulty of increasing the dopant concentration in p-AlGaInP, and the small mobility of the holes. Accordingly, the AlGaInP type semiconductor laser cannot have as good high frequency characteristics as those of the AlGaAs type semiconductor laser. For example, the frequency at which the modulation amplitude decays by −3 dB is about 80 MHz in the case of such an AlGaAs type semiconductor laser, which is a quite low frequency. Having such frequency characteristics, the AlGaAs type semiconductor laser cannot be substantially modulated by the superimposition of a high frequency a.c. voltage of several hundred MHz. Therefore, the effect of improving the noise characteristics of the semiconductor laser is greatly reduced.

Figure 37:
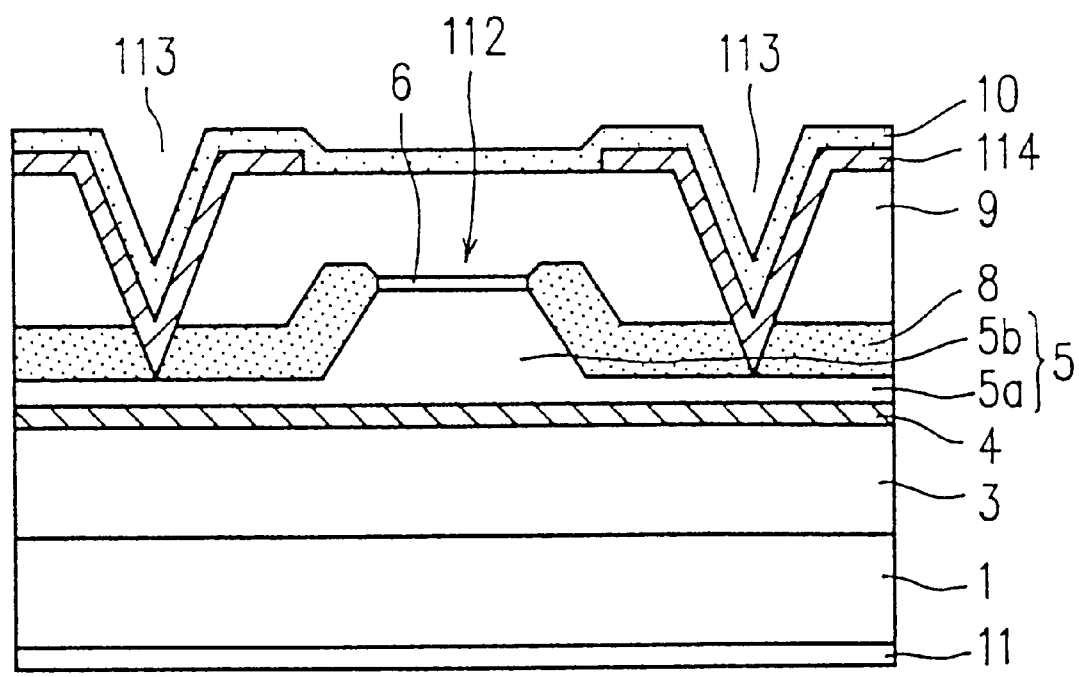
FIG. 37 is a cross-sectional view showing an AlGaInP type semiconductor laser according to an example of the present invention.

Hereinafter, an AlGaInP type semiconductor laser according to the present example, developed in order to solve the above-mentioned problems, will be described with reference to FIG. 37. FIG. 37 shows a cross section of the AlGaInP type semiconductor laser.

The semiconductor laser according to the present example includes a multilayer including an n-AlGaInP cladding layer 3, a multiple quantum well active layer 4, a first p-AlGaInP cladding layer 5a, a stripe-shaped second p-AlGaInP cladding layer 5b, and a p-GaInP protection layer 6 grown in this order, the multilayer being formed on an n-GaAs substrate 1. This multilayer further includes an n-GaAs current confining layer 8 and a p-GaAs contact layer 9.

The semiconductor laser according to the present example has a unique feature not encompassed by the other examples of the invention; that is, a groove 113 is formed on each of the right and left sides of the stripe-shaped ridge (i.e. the second p-AlGaInP cladding layer 5b). The grooves 113 are spaced by a distance on the order of several dozen micrometers from each other. The grooves 113 are formed by etching predetermined portions of the p-GaAs contact layer 9 and the n-GaAs current confining layer 8 with the use of a mixture of hydrochloric acid and phosphoric acid, for example. Since the grooves 113 do not reach the multiple quantum well active layer 4, no surface state is generated across the PN junction during the fabrication of the grooves 113.

An insulating film 114 having an opening for injecting a current therethrough is formed above the stripe-shaped ridge (i.e. the second p-AlGaInP cladding layer 5b) so as to cover the surface of the grooves 113. On the upper face of the semiconductor laser, a first electrode 10 is formed so as to cover the insulating film 114. A second electrode 11 is formed on the lower face of the semiconductor laser.

The positions and the depths of the grooves 113 are essential to the improvement of the frequency characteristics of the semiconductor laser. If the grooves 113 are too distant from a light emitting portion of the semiconductor laser or too shallow, for example, the parasitic capacitance does not substantially reduce as compared with that of a conventional semiconductor laser. On the other hand, if the distance between the grooves 113 is too small, the insulating film 114 prevents the heat generated in the light emitting portion from being radiated, thus increasing the thermal resistance and decreasing the reliability of the semiconductor laser. Therefore, the positions and the depths of the grooves 113 must be optimized, as described below.

Figure 38:
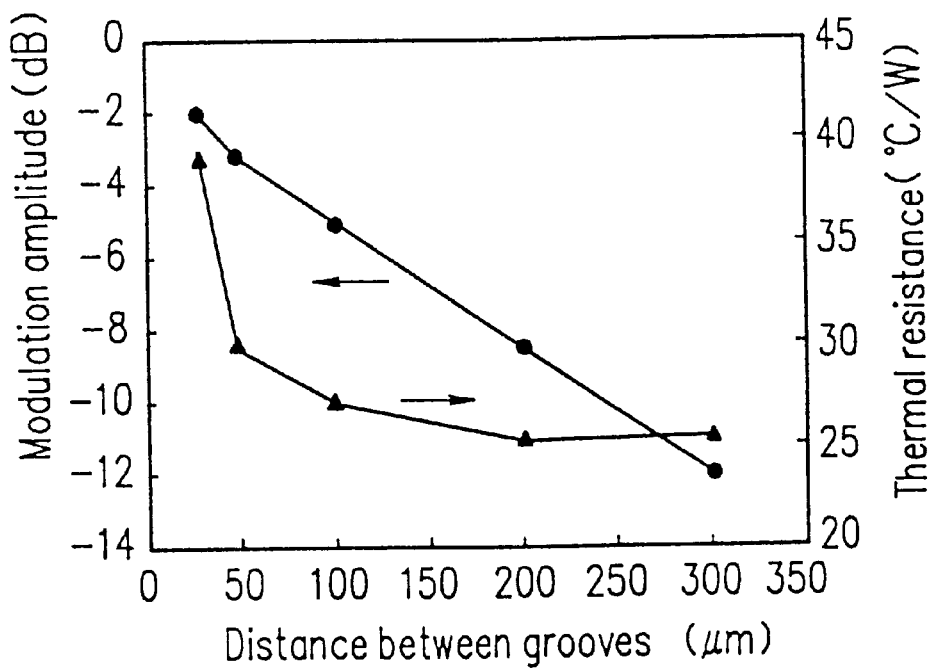
FIG. 38 is a graph showing experimentally obtained data of relationship between the distance between grooves formed in an AlGaInP type semiconductor laser according to the present invention, the modulation amplitude at 350 MHz, and the thermal resistance.

FIG. 38 shows experimentally obtained data of relationship between the distance between the grooves 113 (defined as the distance between the centers of the respective grooves 113); the modulation amplitude at 350 MHz; and the thermal resistance. As seen from FIG. 38, the modulation amplitude is attenuated more as the distance between the grooves 113 increases, and has no substantial effect when the distance between the grooves 113 exceeds 200 μm. The high frequency characteristics are more improved as the distance between the grooves 113 decreases. However, the thermal resistance drastically increases as the distance between the grooves 113 decreases. For example, the thermal resistance reaches about 40° C./W when the distance between the grooves 113 is 30 μm, past which point an excessive increase in the temperature of the semiconductor laser is expected to occur during the operation, thereby unfavorably affecting the reliability thereof. Thus, the distance between the grooves 113 should preferably be within the range of 30 to 200 μm.

Figure 39:
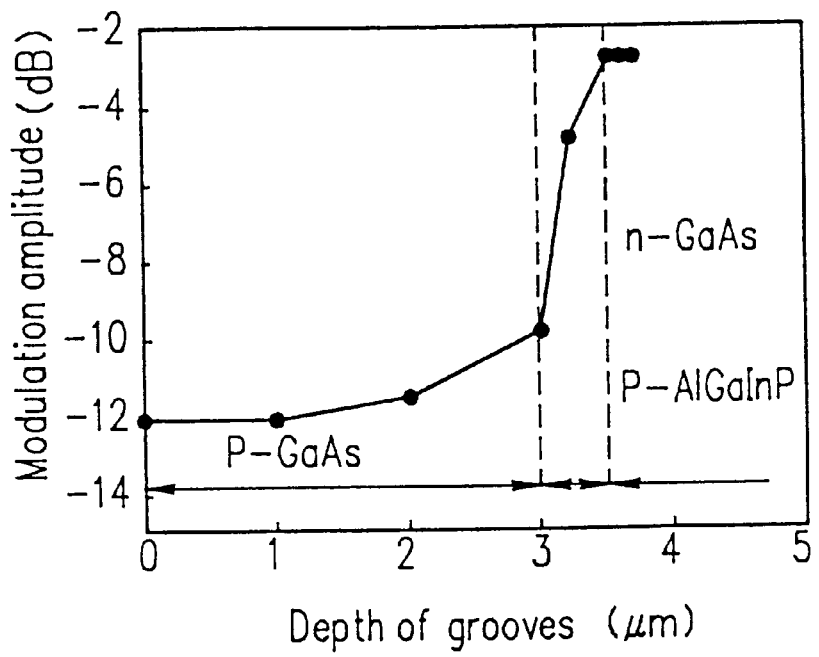
FIG. 39 is a graph showing experimentally obtained data of relationship between the depth of each groove formed in an AlGaInP type semiconductor laser according to the present invention and the modulation amplitude at 350 MHz.

FIG. 39 shows experimentally obtained data of relationship between the depth of each groove 113 and the modulation amplitude at 350 MHz. The width of each groove 113 is 50 μm. While the bottoms of the grooves 113 are located in the p-GaAs contact layer 9, the modulation amplitude gently increases as the depth of each groove 113 increases. The modulation amplitude drastically increases as the bottoms of the grooves 113 reach the n-GaAs current confining layer 8, and does not increase or decrease after the bottoms of the grooves 113 leave the n-GaAs current confining layer 8. Thus, it is established that the grooves 113 need only to be deep enough to disrupt the n-GaAs current confining layer 8, and that the grooves 113 do not need to reach the active layer 4. Some effect was observed as long as the bottoms of the grooves 113 were into, if only part of the way, the n-GaAs current confining layer 8. Since the grooves 113 according to the present invention do not traverse the active layer 4, no leakage current occurs due to generation of a surface state. Thus, a high-efficiency semiconductor laser having excellent reliability can be provided according to the present example.

Figure 40:
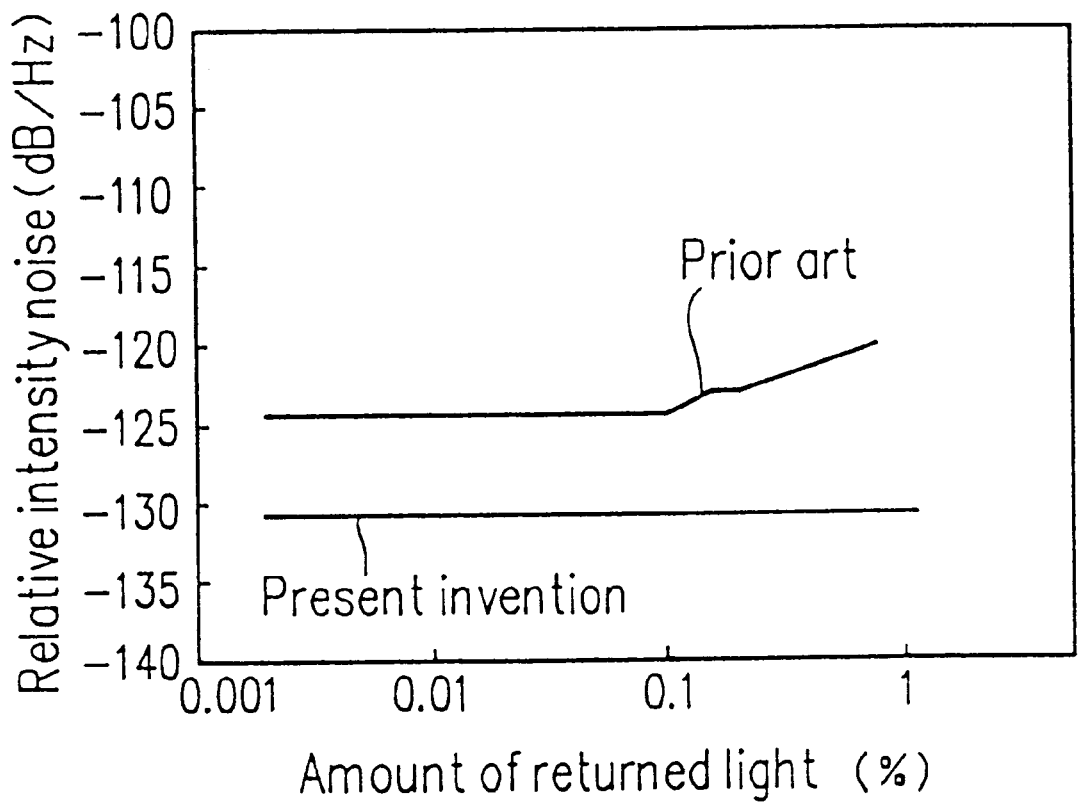
FIG. 40 is a graph showing the dependence of the RIN on the amount of returned light for each of a semiconductor laser according to the present invention and a conventional semiconductor laser.

FIG. 40 illustrates the dependence of the RIN on the returned light amount, with respect to a conventional semiconductor laser and the semiconductor laser according to the present example. As seen from FIG. 40, the RIN when the returned light amount is 0.1% is −124 dB for the conventional semiconductor laser, and −130 dB for the semiconductor laser according to the example, indicative of a significantly reduced RIN of the semiconductor laser according to the present example. Moreover, it can be seen that the semiconductor laser according to the present example is more stable against any increase in the returned light amount.

Figure 41:
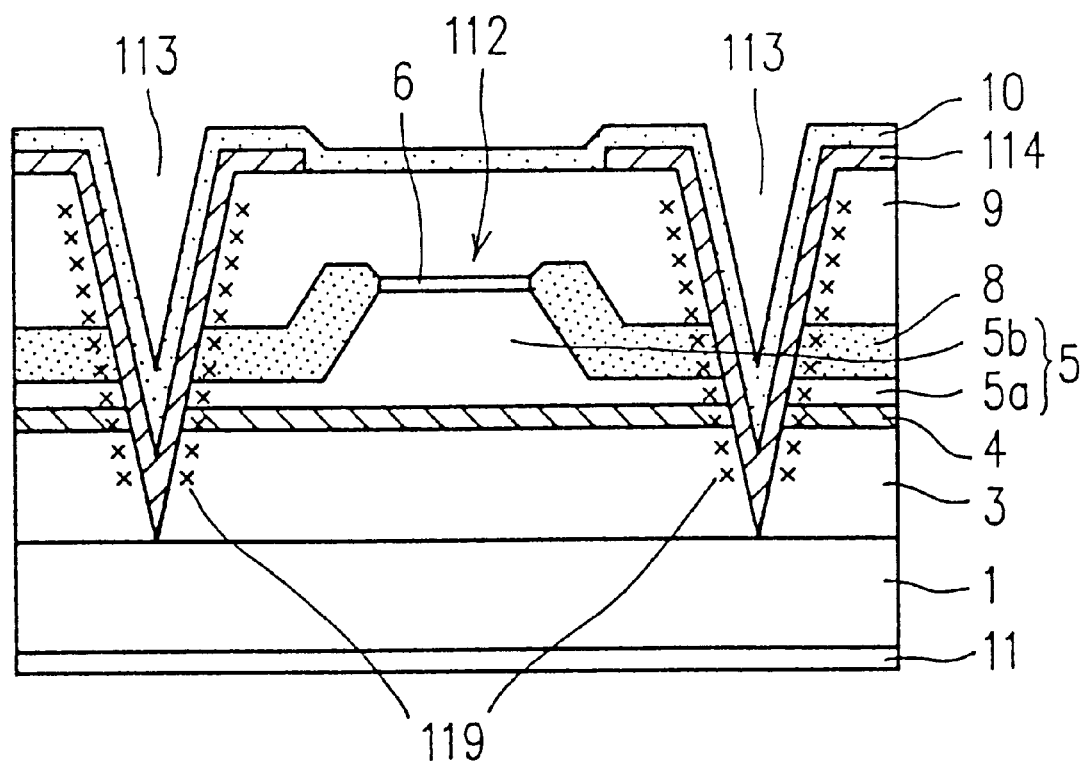
FIG. 41 is a cross-sectional view showing an AlGaInP type semiconductor laser in which grooves reaching an active layer are provided.

However, in cases where the grooves 113 are formed by using a mixture of hydrochloric acid and phosphoric acid, the depth of each groove 113 is required to be controlled in terms of the etching time, which is a very unstable process, and may occasionally allow the grooves 113 to be formed into and past the active layer 4. FIG. 41 shows a cross section of an exemplary semiconductor laser in which the bottoms of grooves 113 fully reach a multiple quantum well active layer 4. The exemplary semiconductor laser is obtained by etching a p-GaAs contact layer 9 and an n-GaAs current confining layer 8 for an excessively long period of time. As a result of the etching, defects emerge, so that a surface level 119 is generated across the multiple quantum well active layer 4. Thus, the light emitting efficiency of the semiconductor laser is deteriorated.

Figure 42:
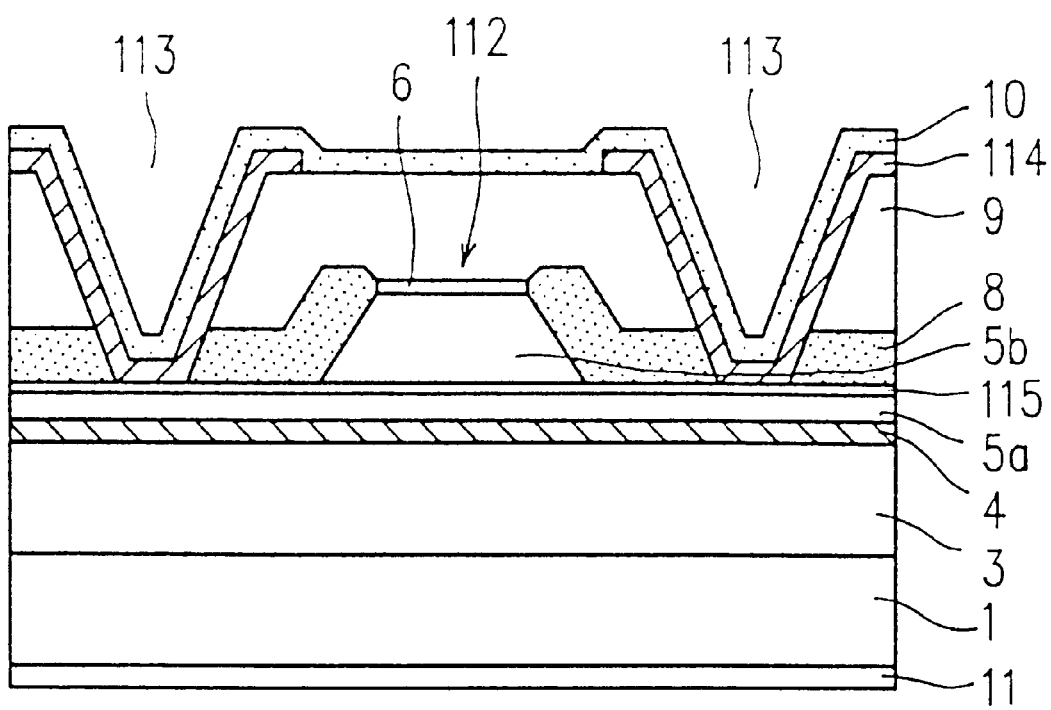
FIG. 42 is a cross-sectional view showing an AlGaInP type semiconductor laser according to an example of the present invention.

FIG. 42 shows a cross section of a variant of the semiconductor laser according to the present example. FIGS. 43A to 43D each show a cross section of the semiconductor laser during the fabrication thereof. Hereinafter, a method for producing the semiconductor laser will be described with reference to FIGS. 43A to 43D.

Figure 43A:
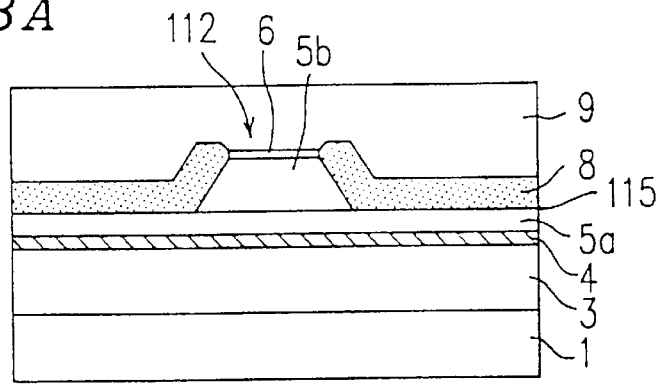
FIGS. 43A to 43D are cross-sectional views showing an AlGaInP type semiconductor laser according to the present invention during the fabrication thereof.

First, as shown in FIG. 43A, an etching stopper layer 115 composed essentially of a material such as GaInP is grown between a first p-AlGaInP cladding layer 5a and a second p-AlGaInP cladding layer 5b. In cases where concentrated sulfuric acid is used as an etching solution, GaInP tends to be more immune to etching than are AlGaInP and GaAs.

Figure 43B:
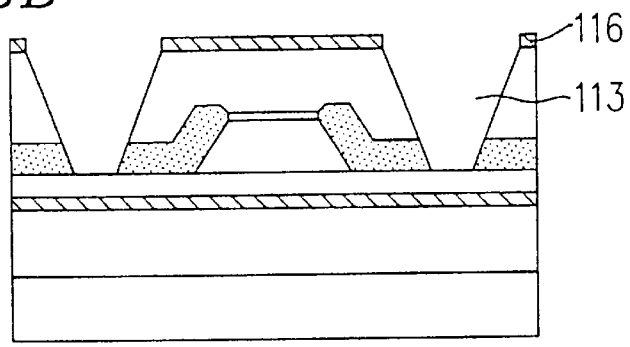

Next, after fabricating a refractive index guiding structure through a process shown in FIGS. 7 to 10, for example, a mask 116 having a stripe-shaped opening on each of the right and left sides of a stripe-shaped ridge 112 is formed on a p-GaAs contact layer 9, as shown in FIG. 43B. Such materials as photoresists or oxide films are used as the mask 116. Thereafter, the p-GaAs contact layer 9 and the n-GaAs current confining layer 8 are successively etched until reaching the etching stopper layer 115. Thus, grooves 113 not reaching a multiple quantum well active layer 4 are securely obtained.

Figure 43C:
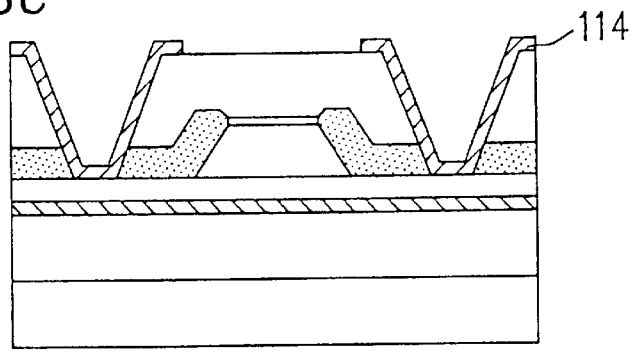
Figure 43D:
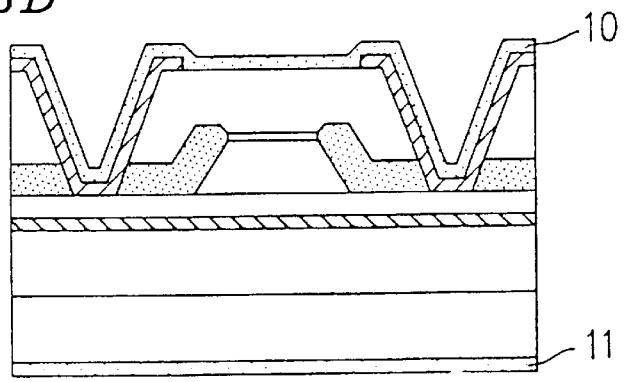

Next, as shown in FIG. 43C, an insulating film 114 having a stripe-shaped opening is formed on the stripe-shaped ridge 112 so as to at least partially cover the surface of the above-described multilayer structure. Thereafter, as shown in FIG. 43D, a first electrode 10 and a second electrode 11 are formed.

Thus, as seen from FIG. 39, a semiconductor laser having excellent high frequency characteristics can be fabricated with high repeatability by selectively etching the n-GaAs current confining layer 8 so as to ensure that the etching is terminated at the surface of the first p-AlGaInP cladding layer 5a.

According to the present example, grooves 113 for electrically separating a large portion of the current confining region, i.e. the n-GaAs current confining layer 8 are provided, the grooves 113 not being deep enough to reach the active layer 4. As a result, the parasitic capacitance is reduced, thereby realizing excellent high frequency characteristics. Moreover, no defects, or surface level due to defects, are present in the vicinity of the active layer 4, so that a high current-light conversion efficiency is realized with only a small amount of leakage current.

Furthermore according to the present example, by providing an etching stopper layer 115 in the cladding layers 5a and 5b located above the active layer 4, selective etching can be conducted so that grooves having predetermined depths not sufficient to reach the active layer 4 are stably formed with high repeatability. As a result, the high frequency characteristics of the semiconductor laser can be stabilized, while improving the yield of the semiconductor laser.

EXAMPLE 6

In most of the semiconductor lasers according to the examples and variants of the present invention described above, AlGaInP/GaAs is used, and a cladding layer including a stripe-shaped ridge is provided. However, when one attempts to further shift the oscillation wavelength of such an AlGaInP/GaAs type semiconductor laser to the shorter wavelength side, there arises the problem of the ordering phenomenon, which is a phenomenon inherent to this material system. If ordering occurs, the energy band gap decreases, making it difficult to realize a short wavelength semiconductor laser.

On the other hand, by using a substrate including a (100) oriented surface having a misorientation toward the [011]

direction, ordering can be prevented from occurring. By using this method, the oscillation wavelength of the semiconductor laser can be lowered, and a higher carrier density can be attained, so that a red-light semiconductor laser having an oscillation wavelength of 640 nm, for example, can be realized.

The upper face (principal face) of an ordinary (100) substrate, i.e. the (100) oriented surface, is a plane including lines parallel to the [011] direction. The (100) oriented surface also includes lines parallel to the [0-1-1] direction, since the [0-1-1] direction is an opposite direction of the [011] direction. A "substrate including a (100) oriented surface having a misorientation toward the [011] direction" as used herein is defined as a substrate whose upper face (principal face) has a normal line which, instead of extending along the [100] direction, is at an angle with the [100] direction, revolving toward the [011] direction or the [0-1-1] direction by a predetermined angle. The misorientation, also referred to as an "off-angle", of the substrate is defined as the angle of the normal line of the substrate with respect to the [100] direction. A "misoriented substrate" is defined as a substrate having an off-angle not equal to zero.

Figure 45A:
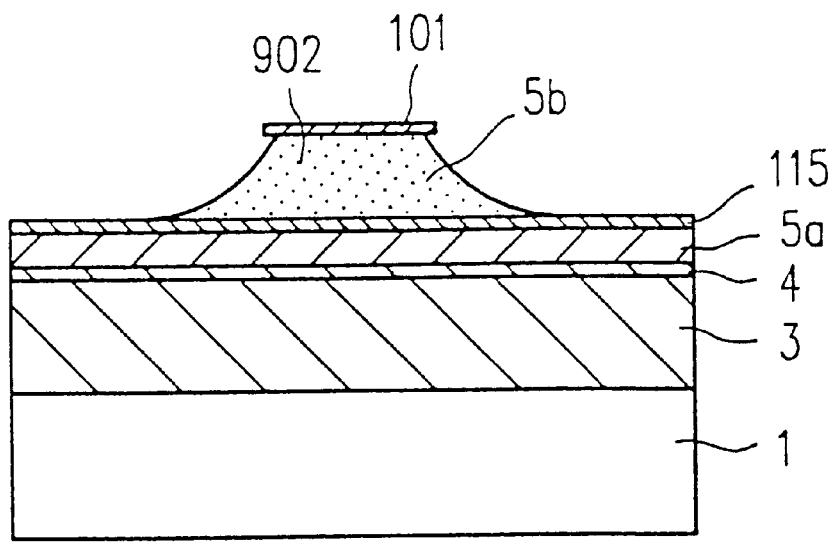
FIG. 45A is a cross-sectional view showing a conventional light emitting device.
Figure 45B:
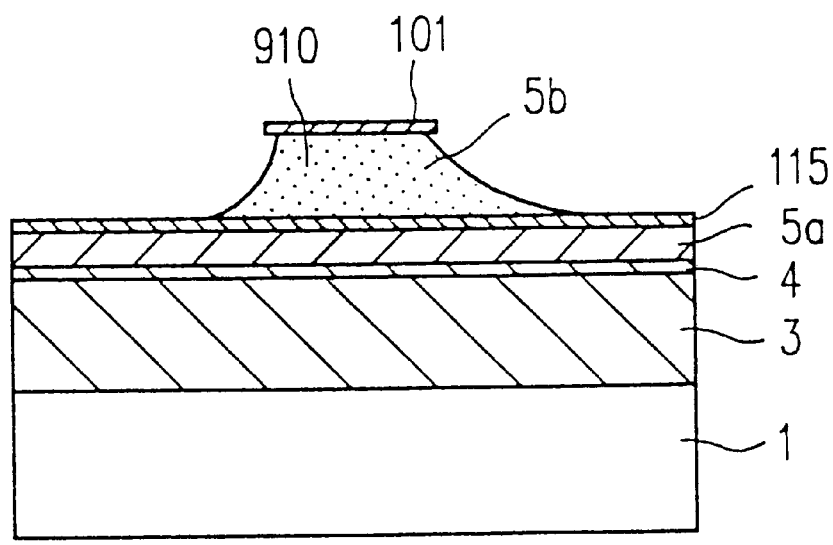
FIG. 45B is a cross-sectional view showing a conventional light emitting device.

FIGS. 45A and 45B each describe a ridge portion of a red-light semiconductor laser fabricated according to the prior art. FIG. 45A describes a case where an ordinary non-misoriented n-type semiconductor substrate 1 is used. FIG. 45B describes a case where a misoriented n-type semiconductor substrate 1 is used.

There are two problems to be solved that are inherent to the prior art technique. The first problem is that, as seen from FIG. 45A, the use of a sulfuric acid type etching solution for the formation of a ridge 902 causes a bottom portion of the ridge 902 to spread out, so that the threshold current increases, and that the lateral mode becomes unstable. In particular, in cases where a misoriented substrate is used, as shown in FIG. 45B, the side faces of a ridge 910 constitute gentler slopes than in the case described in FIG. 45A, so that the right side face facing the [0-1-1] direction (i.e. the right side slope as observed in the figure) may spread out more than the other side face at the bottom. Thus, the ridge 910 becomes asymmetrical, thereby further decreasing the lateral mode stability.

The ridge 910 spreads out toward the [0-1-1] direction in cases where the normal line of the substrate surface is revolving toward the [0-1-1] direction, and spreads out toward the [011] direction (i.e. the left side as observed in the figure) in cases where the normal line of the substrate surface is revolving toward the [011] direction.

The second problem to be solved is that the etching time should be relatively short because the etching stopper layer 115 has only a small thickness, and that it is difficult to determine when to terminate the etching. Specifically, the etching stopper layer 115 is composed essentially of GaInP, a sufficiently dissimilar composition to that of a second cladding layer, so as to secure a sufficient selectivity during the selective etching. In order to prevent the emitted light from being absorbed, the etching stopper layer 115 is required to be a quantum well layer having a smaller thickness than an active layer 4. Therefore, even if a sufficient selectivity is secured between the relevant materials, the actual etching time becomes extremely short. Moreover, since the interference color changes only slightly when the etching stopper layer 115 is exposed, it is difficult to determine when to terminate the etching.

An etching method according to the present invention, which was developed in order to solve the above-mentioned problems, will be described below.

Figure 46A:
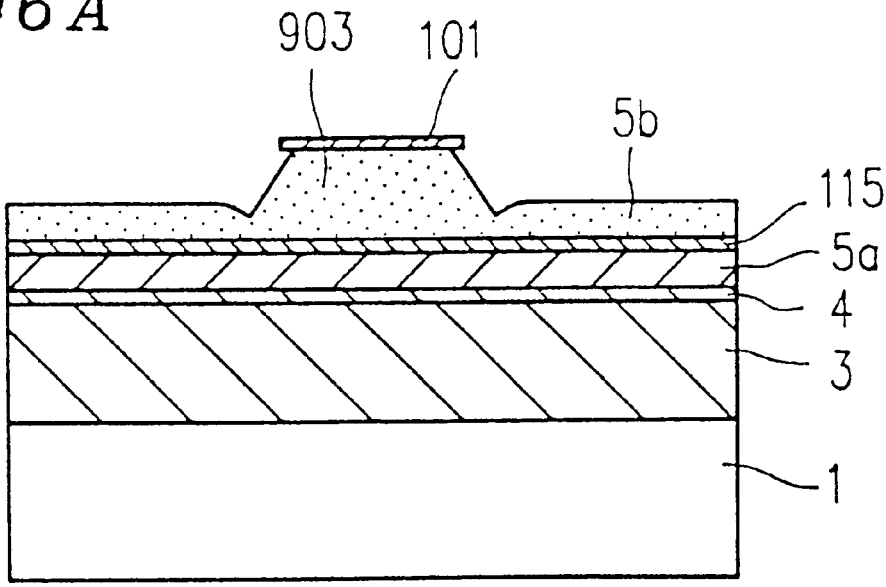
FIGS. 46A and 46B are cross-sectional views showing a semiconductor laser according to an example of the present invention during the fabrication thereof.
Figure 46B:
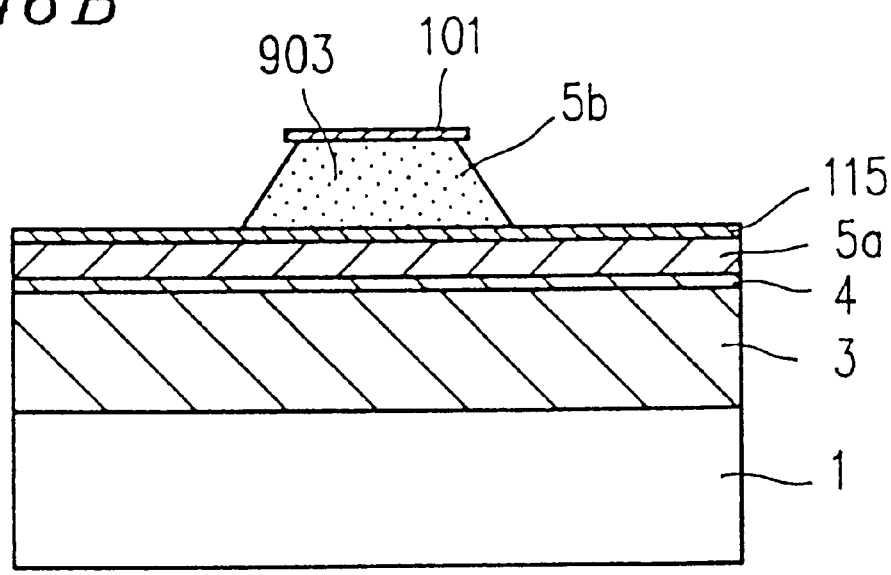

FIGS. 46A and 46B each show a cross section of a red-light semiconductor laser during the formation of a ridge thereof. First, an n-$(Al_{0.6}Ga_{0.4})_{0.5}In_{0.5}P$ cladding layer 3 (thickness: 1 $\mu$m), an active layer 4 having a multiple quantum well structure composed essentially of $Ga_{0.5}In_{0.5}P$ (thickness: 100 Å)/$(Al_{0.6}Ga_{0.4})_{0.5}In_{0.5}P$ (thickness: 40 Å), a first p-$(Al_{0.6}Ga_{0.4})_{0.5}In_{0.5}P$ cladding layer 5a (thickness: 0.25 $\mu$m), a p-$Ga_{0.5}In_{0.5}P$ etching stopper layer 115 (thickness: 60 Å), and a second p-$(Al_{0.6}Ga_{0.4})_{0.5}In_{0.5}P$ cladding layer 5b (thickness: 0.9 $\mu$m) are grown on an n-GaAs semiconductor substrate 1 in this order.

Next, a stripe-shaped mask 101 is formed. The stripe-shaped mask 101 is composed essentially of a silicon oxide film, but may alternatively be composed of a silicon nitride film. Then, a ridge 903 is formed by an etching process with the use of the mask 101. The etching process employs, in a first step thereof, a first etching solution of a diffusion-controlled type such that the rate of the etching reaction is determined by a diffusion phenomenon. The first step of the etching process is conducted, by using the first etching solution, until the second p-$(Al_{0.6}Ga_{0.4})_{0.5}In_{0.5}P$ cladding layer 5b is etched to a certain depth. In the present example, a mixture including acetic acid, hydrochloric acid, and hydrogen peroxide at a ratio of 36:3:1 is used as the first etching solution. Alternatively, a mixture including Br and methanol ($CH_3OH$) at a ratio of 1:100 may be used as the first etching solution. In the present example, the second p-$(Al_{0.6}Ga_{0.4})_{0.5}In_{0.5}P$ cladding layer 5b (thickness: 0.9 $\mu$m) is etched by about 0.5 $\mu$m.

A second step of the etching process according to the present invention employs a second etching solution having etching selectivity between AlGaInP (of the second p-cladding layer 5b) and GaInP (of the etching stopper layer 115). That is, the second etching solution preferentially etches AlGaInP rather than GaInP. The etching reaction is terminated as soon as reaching the p-$Ga_{0.5}In_{0.5}P$ etching stopper layer 115.

Thus, according to the present example, a portion of the second p-cladding layer 5b, which is in contact with the upper face of the etching stopper layer 115, is selectively etched by using the first etching solution. Since the first etching solution is of a diffusion-controlled type, a relatively deeply etched concave portion is formed in the etched portion of the second p-cladding layer 5b, as shown in FIG. 46A. Specifically, the concave portion is formed in a region adjoining the non-etched portion of the second p-cladding layer 5b. The reason for this is that a relatively large amount of etchant included in the first etching solution is supplied for regions adjoining the non-etched portion of the second p-cladding layer 5b, the etchant not having been consumed in the non-etched portion of the second p-cladding layer 5b. The above-mentioned concave portion is not formed when a surface reaction-controlled type etching solution is used.

Figure 47:
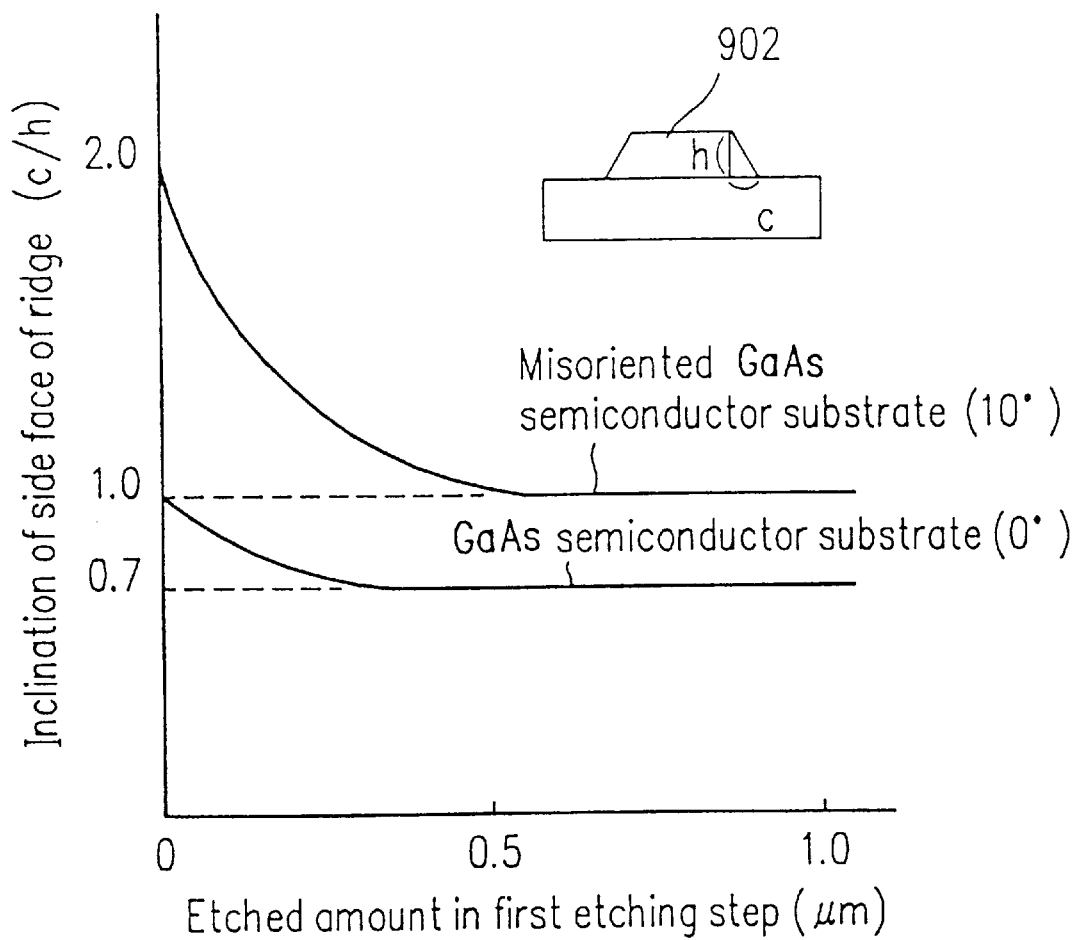
FIG. 47 is a diagram showing relationship between the etched amount and the shape of a resultant ridge according to an example of the present invention.

FIG. 47 shows relationship between the shape of the ridge 902 thus obtained and the amount etched by the first etching solution. In FIG. 47, the axis of ordinates represents the degree of inclination of the side slopes of the ridge 902 defined as a ratio c/h, where c denotes the spreading length of the ridge 902 taken at the bottom thereof, and h denotes the height of the ridge 902 as described in a small diagram inserted in FIG. 47. The ridge shape described in FIG. 47 represents a state after the etching was conducted until reaching the p-$Ga_{0.5}In_{0.5}P$ etching stopper layer 115 as shown in FIG. 46B. The axis of abscissas in FIG. 47 represents the amount etched during the first etching step with the first etching solution.

First, a case is described where a GaAs semiconductor substrate (misorientation: 0°) is used. If the etched amount during the first etching step is 0 μm, that is, all the etching is conducted during the second etching step, the ratio c/h is 1.0. If the etched amount during the first etching step is 0.5 μm, the ratio c/h is about 0.7 μm, which indicates that the (111) oriented face appears on the surface of each side slope of the ridge 902. Next, a case is described where a semiconductor substrate including a (100) oriented surface having a misorientation of 10° with respect to the [011] direction is used. If no etching is conducted during the first etching step, the ratio c/h is 2.0, thereby resulting in the shape of the ridge 910 shown in FIG. 45B, in which the side slope facing the [0-1-1] direction (i.e. the right side slope as observed in the figure) of the ridge 910 has a gentler inclination than that of the other side slope. On the other hand, if the etched amount during the first etching step of etching is 0.5 μm, the ratio c/h becomes 1.0, indicative of considerably improved symmetry of the ridge shape. Thus, the effect of restraining the spreading of the ridge 902 at the bottom thereof is obtained by the use of the first etching solution of a diffusion-controlled type.

In cases where the substrate has a different misorientation than that of the substrate described above, e.g. if the normal line of the substrate surface is revolving toward the [011] direction, the side face of the ridge facing the [011] direction (instead of the side face facing the [0-1-1] direction) is previously and exclusively etched in the first etching step.

The improved characteristics of the semiconductor laser thus obtained are described below.

Figure 48:
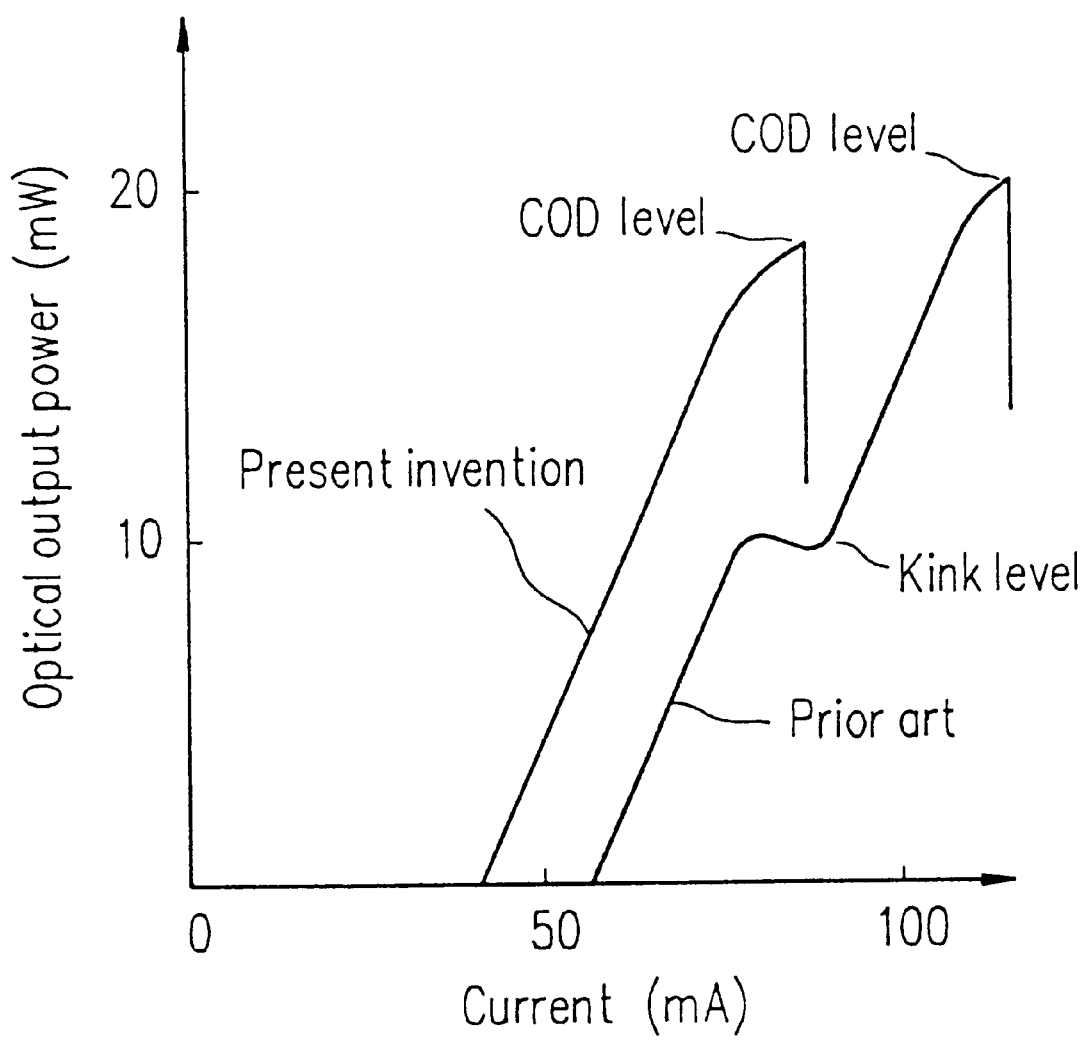
FIG. 48 is a graph showing the current-optical output power characteristics of each of a semiconductor laser according to an example of the present invention and a conventional semiconductor laser.

FIG. 48 shows the current-optical output power characteristics of each of a conventional red-light semiconductor laser and a red-light semiconductor laser according to the present example. As seen from FIG. 48, the threshold current of the semiconductor laser according to the present example is reduced. While a kink is generated in the conventional semiconductor laser due to lateral mode instability, no kinks are detected in the semiconductor laser according to the present example until COD (Catastrophic Optical Damage) is generated, since the lateral mode of the semiconductor laser according to the present example is stabilized. As will be appreciated, the present invention intends to provide no limitations as to the conductivity type of the layers of the semiconductor laser, and each layer may have the opposite conductivity.

The following characteristics, in addition to the current-optical output power characteristics, of the semiconductor laser according to the present example and a conventional semiconductor laser were evaluated: the temperature dependence of the far field pattern (FFP), the substrate off-angle (misorientation) dependence of the photoluminescence (PL) intensity, and the operation lifetime.

Hereinafter, the evaluation results of the above-mentioned characteristics will be described.

Figure 49A:
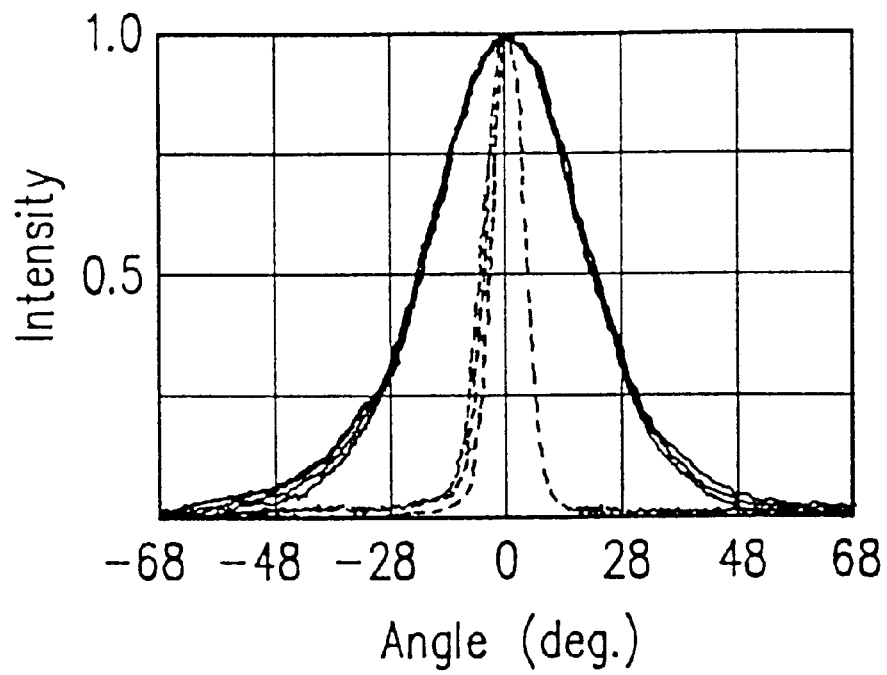
FIG. 49A is a diagram showing a FFP (Far Field Pattern) of a conventional semiconductor laser.
Figure 49B:
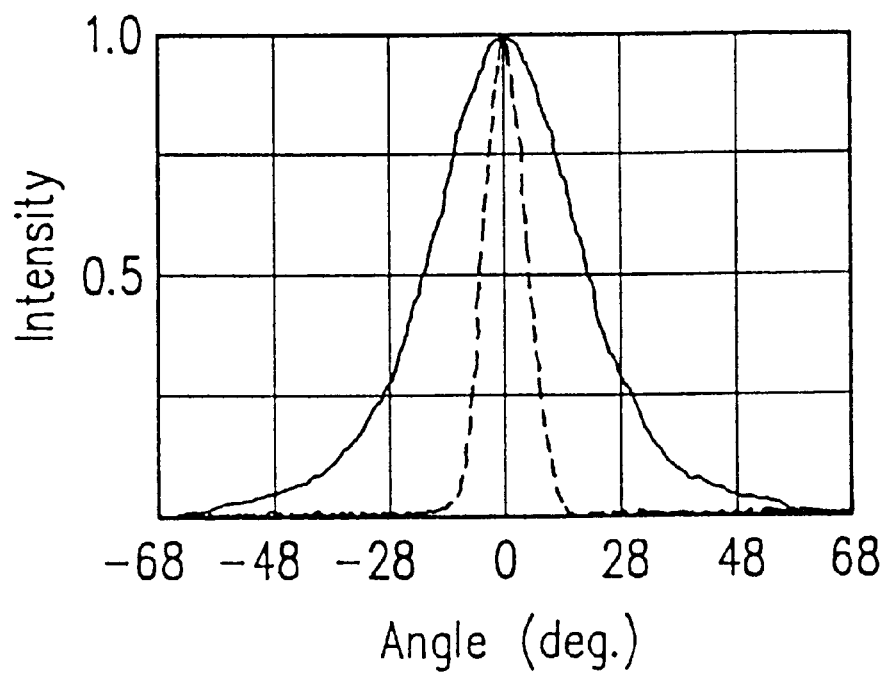
FIG. 49B is a diagram showing a FFP of a semiconductor laser according to an example of the present invention.

FIG. 49A shows a FFP of the conventional semiconductor laser, while FIG. 49B shows a FFP of the semiconductor laser according to the present example. The solid line in each figure illustrates a distribution of light intensities along a direction perpendicular to the direction in which the active layer of the corresponding semiconductor laser extends. The broken line in each figure illustrates a distribution of light intensities along a direction parallel to the direction in which the active layer of the corresponding semiconductor laser extends. The FFP of each semiconductor laser was measured while varying the temperature within the range of 20° C. to 50° C. As shown in FIG. 49A, the FFP of the conventional semiconductor laser is represented as a relatively thick curve, which indicates that the FFP varies depending on the measurement temperature.

Figure 50:
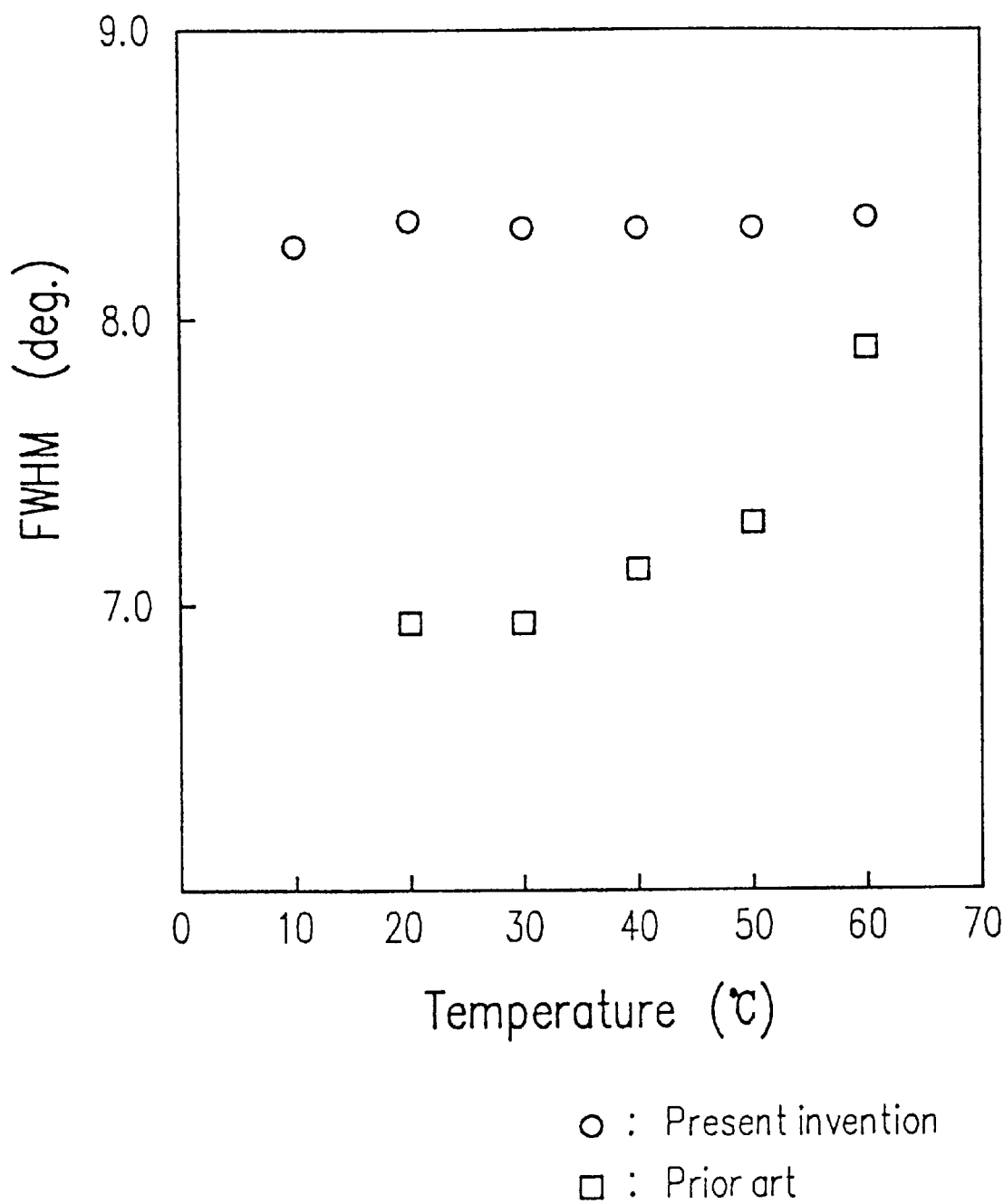
FIG. 50 is a graph showing the temperature dependence of the FWHM (Full Width at Half Maximum) of the FFP of each of a semiconductor laser according to the present invention and a conventional semiconductor laser.

FIG. 50 shows the temperature dependence of the FWHM (Full Width at Half Maximum) of the FFP of each of the semiconductor laser according to the present example and a conventional semiconductor laser. The circles (○) represent the data of the semiconductor laser fabricated by the etching method according to the present invention. The squares (□) represent data of the conventional semiconductor laser. As seen from FIG. 50, the FFP of the semiconductor laser fabricated by the etching method according to the present invention has a small dependence on temperature as compared with that of the conventional semiconductor laser. The reason for the fluctuation of the FFP of the conventional semiconductor laser depending on the temperature is that more current spreads along the lateral direction in the asymmetrical stripe-shaped ridge as the temperature increases. On the other hand, the etching method according to the present invention controls the shape (i.e. cross section) of the stripe-shaped ridge, so that problems relating to the spreading of the current in the stripe-shaped ridge are restrained.

Figure 51:
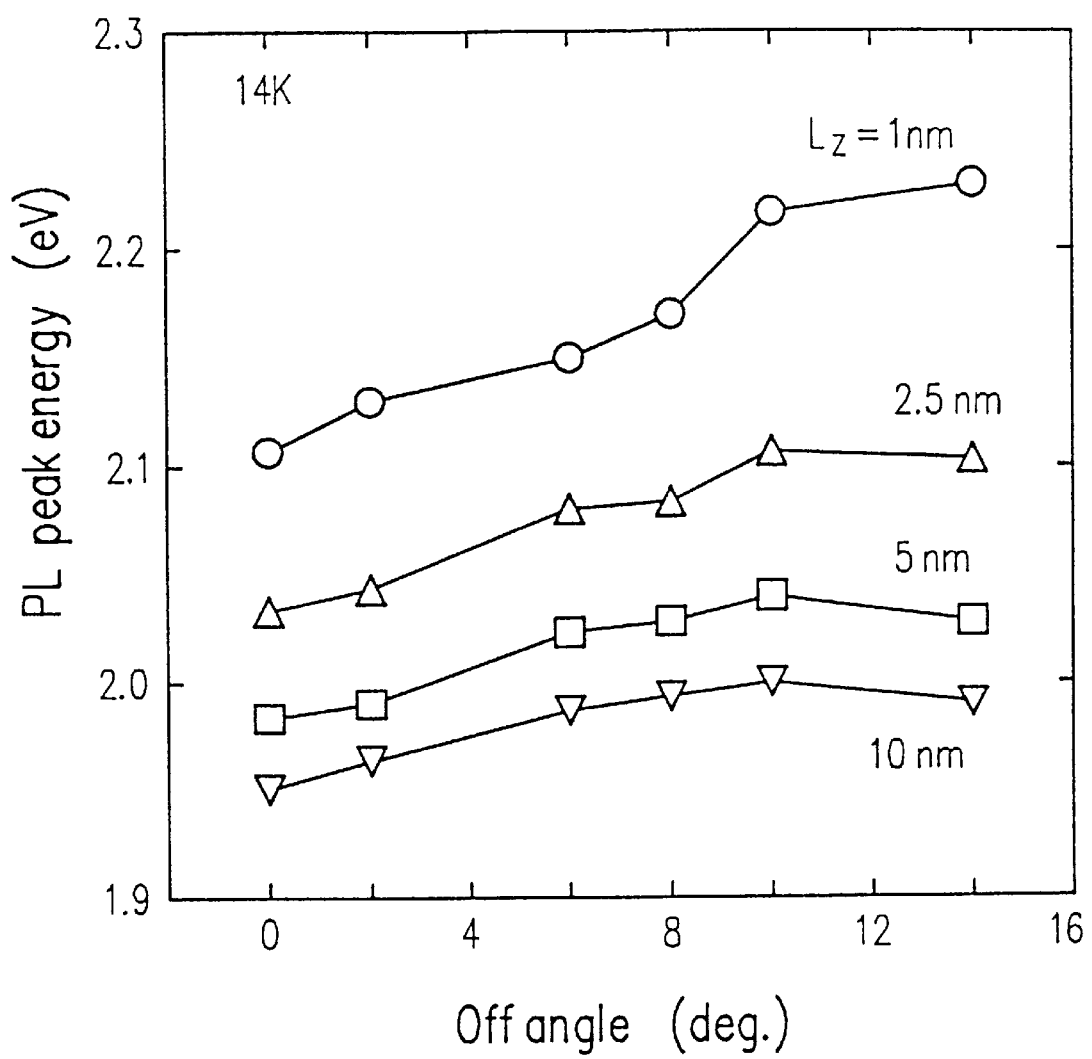
FIG. 51 is a graph showing relationship between the PL intensity and the off-angle of a substrate of a semiconductor laser including an active layer having a quantum well structure.

FIG. 51 shows change in the PL intensity depending on the off-angle of a substrate of a semiconductor laser including an active layer having a quantum well structure. In FIG. 51, the circles (○), triangles (△), squares (□), and reversed triangles (▽) respectively represent data of the cases in which each well layer included in the active layer has a thickness of 1 nm, 2.5 nm, 5 nm, and 10 nm. As seen from FIG. 51, the PL intensity increases as the off-angle of the substrate increases, which indicates that the energy band gap increases as the off-angle of the substrate increases. In order to realize a short-wavelength semiconductor laser, the off-angle of the substrate should preferably be 8° or more. According to the prior art, it is difficult to lower the oscillation wavelength while using a substrate having an off-angle of 8° or more, since it is difficult to obtain a highly symmetrical stripe-shaped ridge.

Figure 52:
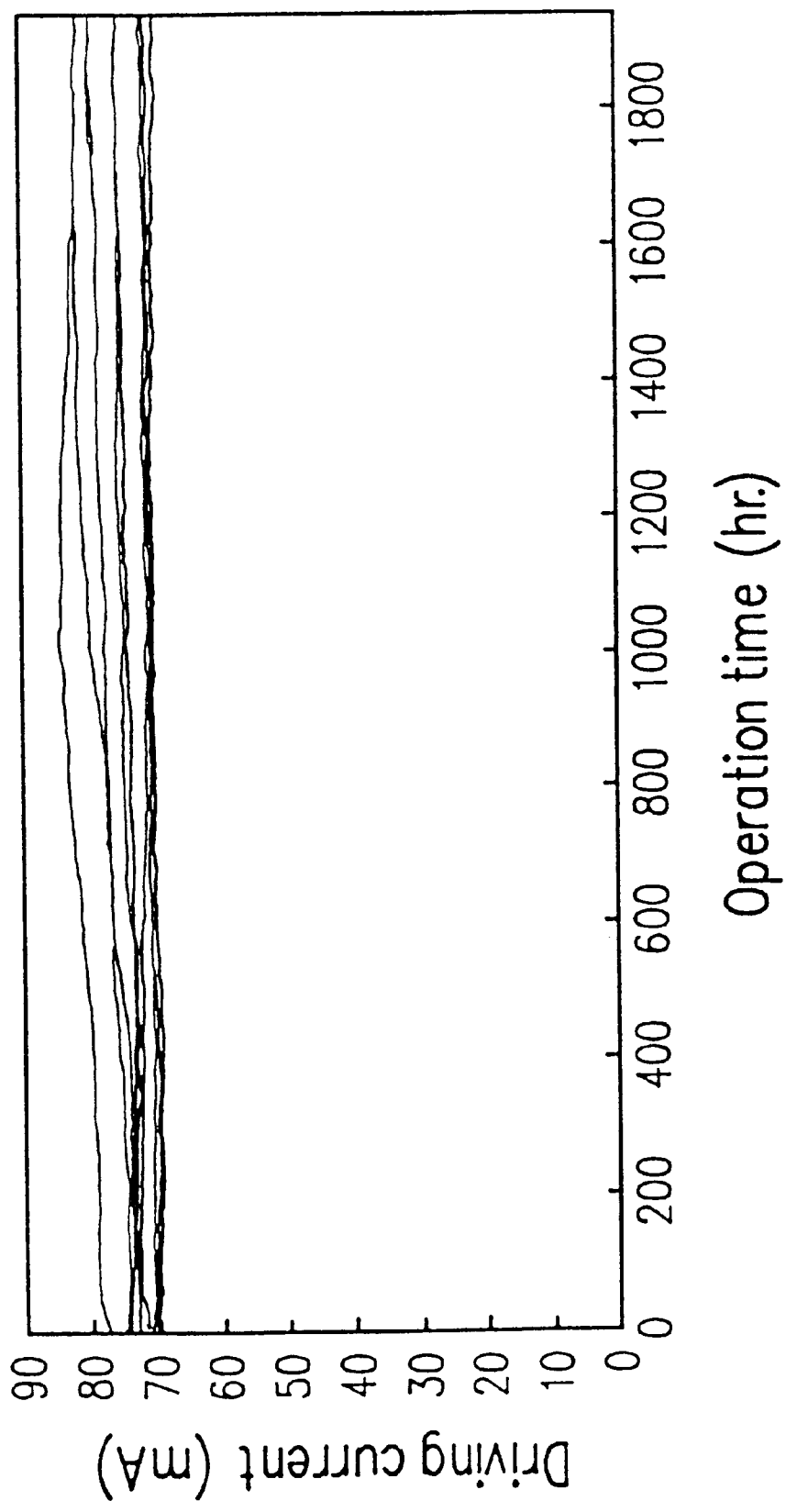
FIG. 52 is a graph showing the operation lifetime of a semiconductor laser according to the present invention.

FIG. 52 is a graph showing the operation lifetime of the semiconductor laser according to the present invention. Specifically, FIG. 52 shows change in the driving current (mW) required to obtain an optical output power of 3 mW in relation to the operation time, the sample semiconductor lasers being operated at a temperature of 50° C. As seen from FIG. 52, the semiconductor laser according to the present invention has a stable driving current during the entire period for which it is operated.

According to the above-described example, the side face of the ridge that spreads out less (corresponding to the left side slope in FIG. 45B; hereinafter referred to as the "steep-side face") than the other side face (hereinafter referred to as the "gentle-side face") may itself be etched excessively. Therefore, the effect of improvement of ridge symmetry, as provided by the incorporation of a misoriented substrate, has certain limitations. In view of this problem, the inventors developed still other methods for improving the symmetry of the ridge, as will be described below.

A first method for further improving the ridge symmetry is to use two masks to adjust the etched amount on both sides of the ridge. According to this method, the gentle-side face is previously etched so that the gentle-side face of the ridge is etched more than the steep-side face.

Figure 53A:
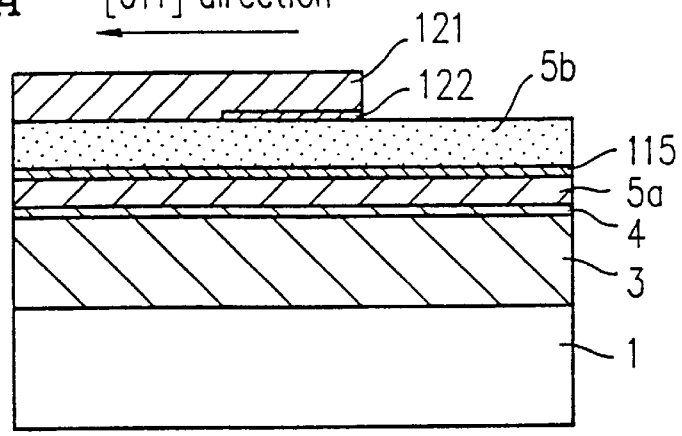
FIGS. 53A to 53D are cross-sectional views showing an AlGaInP type semiconductor laser according to the present invention during the fabrication thereof, in which two masks are used.
Figure 53B:
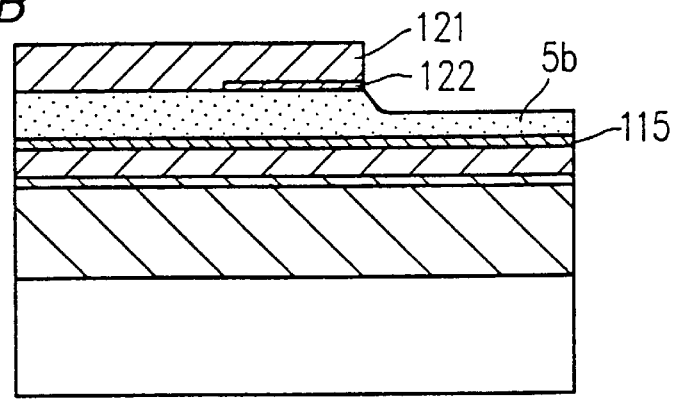
Figure 53C:
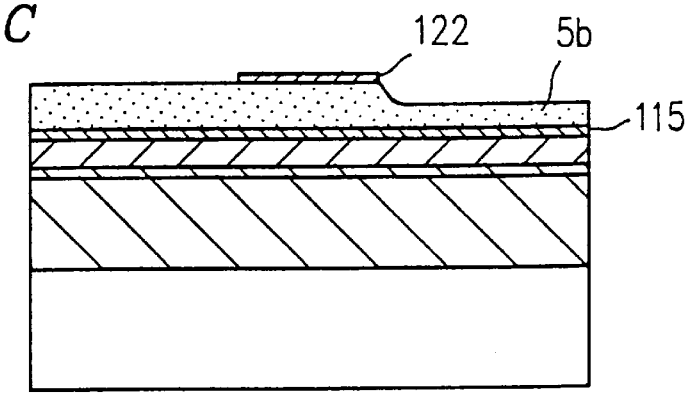
Figure 53D:
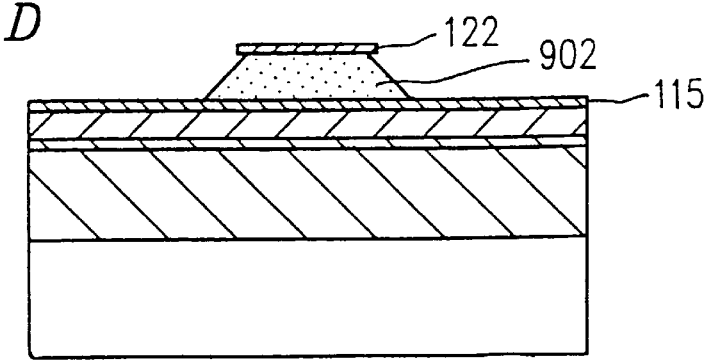

FIGS. 53A to 53D each show a cross section of a semiconductor laser according to the present example during the fabrication thereof. An n-cladding layer 3, an active layer 4, a first p-cladding layer 5a, an etching stopper layer 115, and a second p-cladding layer 5b are epitaxially grown on an n-GaAs semiconductor substrate in this order. A first mask 122 composed essentially of a stripe-shaped silicon oxide film is formed on the second p-cladding layer 5b so as to extend along the [0-11] direction. Thereafter, a second mask 121 composed essentially of a resist is formed so as to cover the side of the first mask 122 facing the [011] direction (i.e. the left side as observed in the figure) and extending along the [0-11] direction (FIG. 53A). Then, the above-mentioned first etching step is conducted, so as to exclusively etch the portion to become the side face of the ridge facing the [0-1-1] direction, i.e. the gentle-side face (FIG. 53B). Next, the second mask 121 is removed (FIG. 53C). Finally, the second etching step is conducted (FIG. 53D). Thus, the ridge 902, which inherently tends to become asymmetrical because of the misorientation of the substrate, can have an improved symmetry by previously and exclusively etching the gentle-side face thereof.

Figure 54A:
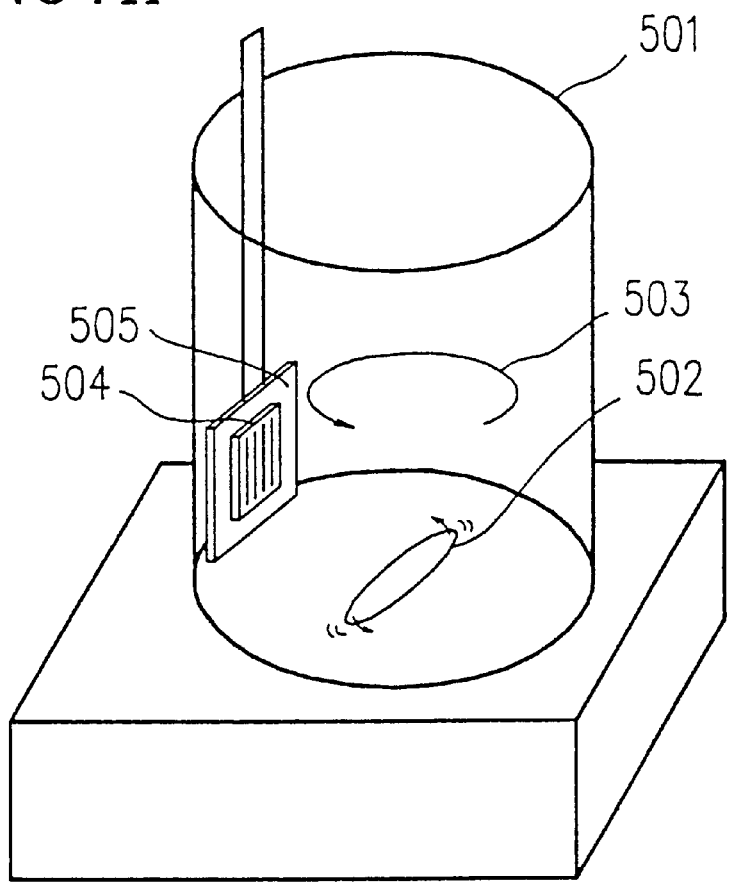
FIG. 54A is a schematic diagram showing an etching apparatus according to an example of the present invention, in which a flow of etching solution is created.
Figure 54B:
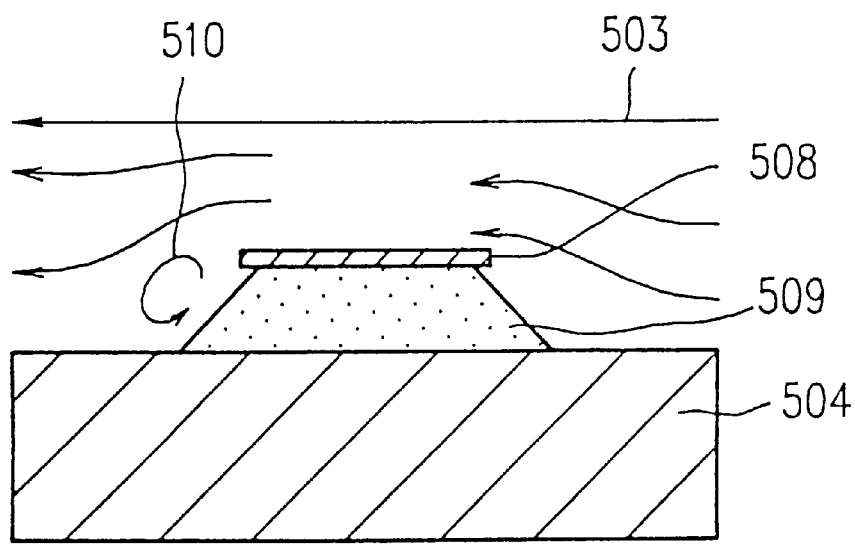
FIG. 54B is a diagram for describing an etching process for forming a ridge according to the present invention.

A second method for further improving the ridge symmetry is to utilize the flow of the etching solution. In the case of a diffusion-controlled type etching solution, the amount of unreacted etching solution supplied to the portion to be etched greatly affects the etching rate for that portion. Therefore, the symmetry of the ridge 902 can be improved by causing the etching solution to have a flow so that the etching rate for the steep-side slope is reduced. FIG. 54A is a schematic diagram showing how the method is conducted. FIG. 54B shows a cross section of the semiconductor laser during the etching process. In the method shown in FIGS. 54A and 54B, a flow of etching solution 503 is created along a direction parallel to the surface of the substrate so as to etch the ridge into a desired shape. A stirrer is placed in a beaker 501 filled with an etching solution so as to create the flow of etching solution 503 in the beaker 501. A substrate 504, on which a stripe-shaped mask is formed, is stabilized on a substrate supporting member 505, and is disposed along an inner side face of the beaker 501 in such a way that the stripe-shape of the mask extends perpendicularly to the flow of etching solution 503. The flow of etching solution 503 near the surface of the substrate 504 forms flow lines shown in FIG. 54B with respect to the mask 508 and a ridge 509 to be formed through the etching. As a result, a whirl 10 is created immediately behind the ridge 509 (in the direction of flow lines). In the vicinity of the whirl 10, the supply of new, unreacted etching solution decreases, thereby decreasing the etching rate. By utilizing this phenomenon in such a way that the whirl 510 is created in the vicinity of a portion to become the steep-side face of the ridge 509, the etching rate for that portion can by decreased, thereby improving the symmetry of the ridge 509.

Figure 55:
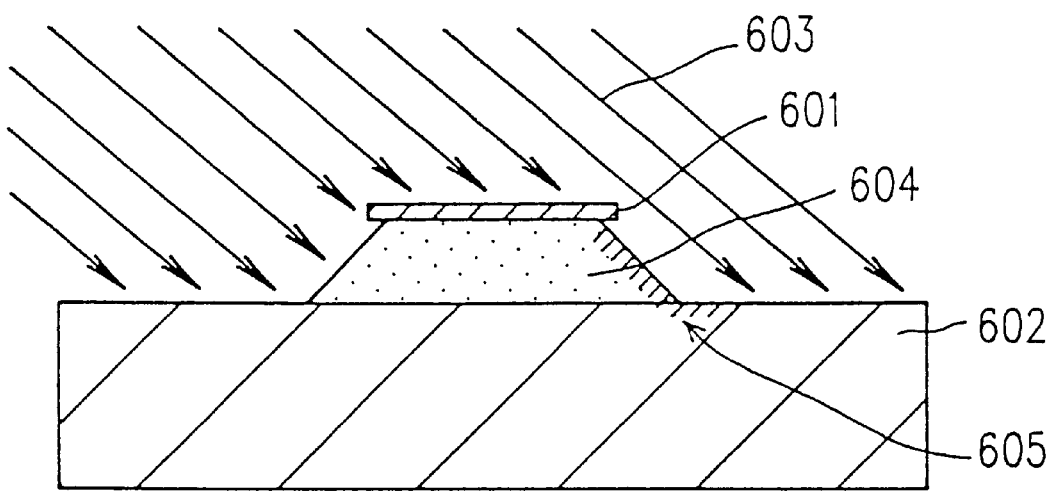
FIG. 55 is a cross-sectional view showing a semiconductor laser according to the present invention during the fabrication thereof, in which light is employed.

A third method for further improving the ridge symmetry is to locally reduce the etching rate by light irradiation. FIG. 55 is a cross-sectional view describing this method. We have confirmed that, in cases where AlGaInP crystal is etched by using sulfuric acid, radiation of light having a wavelength of about 600 nm on a portion of the AlGaInP crystal can reduce the etching rate for that portion to about a half of the etching rate for the other portions. By utilizing this phenomenon, it becomes possible to control the ridge shape during etching. As shown in FIG. 55, a stripe-shaped mask 601 is formed on a substrate 602, and the substrate 602 is immersed in an etching solution. Thereafter, light 603 is obliquely radiated on the substrate 602. Thus, a shaded portion 605 is formed in only one of the side faces of a ridge 604 during the etching. This shaded portion 605 has a larger etching rate than the other portions of the surface of the substrate 602. As a result, it becomes possible to control the shape of the ridge 604. Thus, in cases where a misoriented substrate is used, by disposing the substrate in such a manner that a portion to become the gentle-side face of the ridge is shaded, the etching rate for that portion can be increased relative to that for the other portions, whereby the symmetry of the resultant ridge is improved.

By using any of the three methods described above, the symmetry of a ridge formed on a misoriented substrate can be improved. However, in any of these three methods, the etching rate is varied on both sides of the ridge, so that it may take longer or shorter time for the etching process to reach the etching stopper layer on one side of the ridge than on the other. As a result, in cases where the etching stopping period provided by the etching stopper layer is short, the layers disposed below the etching stopper layer may also be etched. In order to solve this problem, the inventors propose incorporation of a multiple quantum well layer, as described below.

Figure 56A:
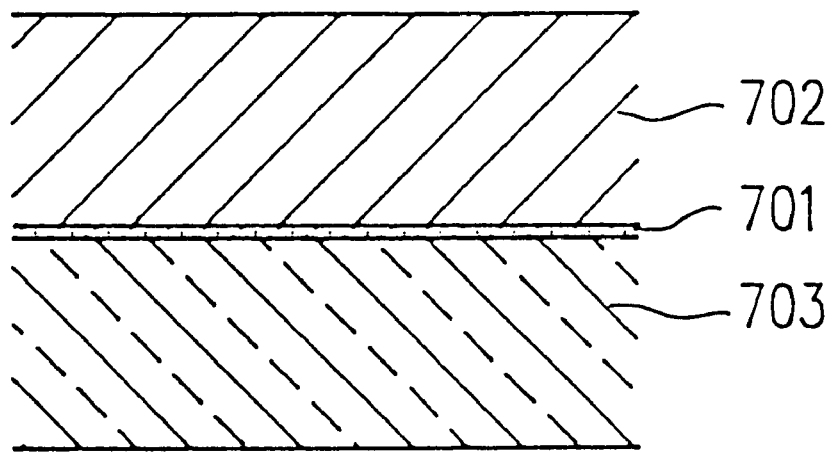
FIG. 56A is a view showing a configuration for a conventional etching stopper layer.

FIG. 56A shows a conventional etching stopper layer and layers interposing the etching stopper layer. Specifically, a GaInP single quantum well etching stopper layer 701 is interposed between AlGaInP cladding layers 702 and 703. Herein, GaInP is used for the etching stopper layer 701 so as to conduct selective etching by utilizing the difference in etching rate depending on the composition of the material. However, GaInP in a bulk state absorbs light emitted from an active layer, so that it is necessary to form the GaInP into a quantum well structure in order to increase the energy band gap thereof by a quantum effect and restrain absorption of the emitted light. This requires the GaInP etching stopper layer 701 to have a thickness not exceeding several dozen angstroms, so that only a short etching stopping period can be provided. Moreover, the interference color which appears on the surface of such a GaInP etching stopper layer 701 does not change drastically, so that it is difficult to determine when the etching has reached the GaInP etching stopper layer 701, i.e. when to terminate the etching.

Figure 56B:
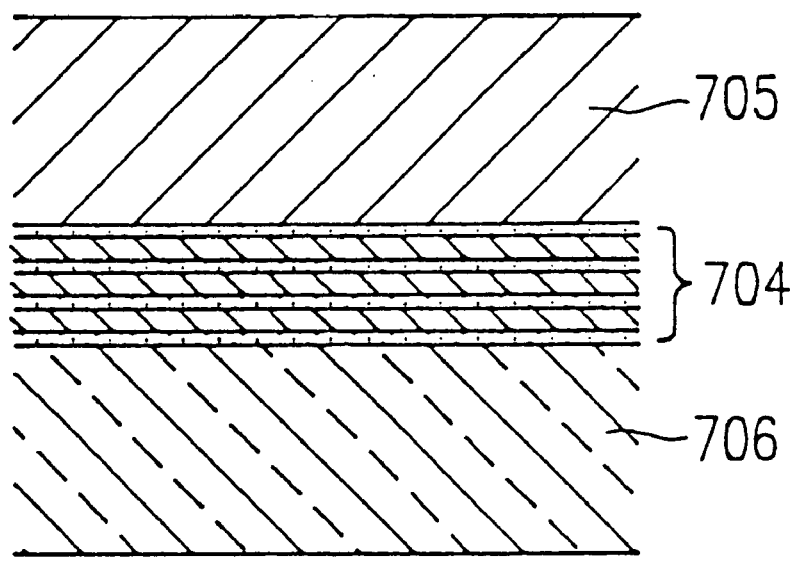
FIG. 56B is a view showing a configuration for an etching stopper layer according to the present invention.

According to the present example, as shown in FIG. 56B, a GaInP multiple quantum well layer 704 is used as an etching stopper layer. The GaInP multiple quantum well layer 704 includes four AlGaInP barrier layers (thickness: 40 Å) and five GaInP well layers (thickness: 60 Å). Thus, a long etching stopping period can be provided without allowing the light emitted from an active layer to be absorbed. This method is especially effective for the etching of a misoriented substrate, as described above. Moreover, the determination as to when to terminate the etching process is facilitated because, owing to the multiple quantum well layer structure, the interference color changes every time the etching process reaches a layer having a different refractive index than a previous one, so that a more drastic change in color can be observed than in the case where a single quantum well layer is used.

Thus, according to the present example, the ridge of the semiconductor laser can be prevented from spreading out at the bottom by performing a first etching step using a diffusion-controlled type etching solution of and a second etching step using an etching solution capable of selective etching. This method is particularly advantageous in cases where a misoriented semiconductor substrate is used, and realizes reduction in the threshold current and stabilization of the lateral mode.

According to the present example, a ridge having improved symmetry can be formed on a misoriented substrate by performing two etching steps with the use of two masks. Moreover, the ridge shape can be controlled by creating a flow of etching solution perpendicular to a direction in which stripe-shaped mask extends so as to generate a whirl in the downstream of the ridge. Moreover, the ridge shape can be controlled by obliquely radiating light on the substrate so as to control the etching rate. Moreover, by employing a multiple quantum well layer for an etching stopper layer, a relatively long etching stopping period can be provided, and drastic changes in the interference color can be obtained, which facilitates the determination as to when to terminate the etching process.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser comprising:

a semiconductor substrate;

a multilayer structure provided on the semiconductor substrate, the multilayer structure including an active layer, a pair of cladding layers interposing the active layer, a current confining layer for injecting a current into a stripe-shaped predetermined region of the active layer, and a contact layer disposed on top of the current confining layer, wherein one of the pair of cladding layers that is disposed above the active layer includes a stripe-shaped ridge extending along a cavity length direction of the semiconductor laser, the current confining layer being formed so as to overlap regions of the one cladding layer excluding the stripe-shaped ridge of the one cladding layer, and wherein a groove having a lowest portion thereof on a level higher than a level of an upper face of the active layer is formed in the current confining layer and in the contact layer on each of opposite sides of the stripe-shaped ridge.

2. A semiconductor laser according to claim 1, wherein the cladding layer that is disposed above the active layer includes:

a first cladding layer formed on the active layer;

a second cladding layer formed above the first cladding layer; and an etching stopper layer interposed between the first cladding layer and the second cladding layer.

3. A semiconductor laser according to claim 1, wherein the contact layer is provided above the multilayer structure.

4. A semiconductor laser according to claim 1 further comprising an insulating film having a stripe-shaped ridge opening located above the stripe-shaped ridge.

5. A semiconductor laser according to claim 1, wherein a distance between the grooves is in the range of 30 $\mu$m to 200 $\mu$m.

6. A semiconductor laser according to claim 1, wherein the lowest portion of each groove reaches an upper face of a portion of the cladding layer, on the side of the stripe-shaped ridge thereof, that is disposed above the active layer.

7. A semiconductor laser according to claim 2, wherein the lowest portion of each groove reaches an upper face of the etching stopper layer.

* * * * *